United States Patent [19]

Bryan et al.

[11] Patent Number: 4,713,815
[45] Date of Patent: Dec. 15, 1987

[54] AUTOMATIC FAULT LOCATION SYSTEM FOR ELECTRONIC DEVICES

[75] Inventors: Dennis P. Bryan, Dunwoody; John B. Rowe, Marietta, both of Ga.

[73] Assignee: International Business Machines Corp., Armonk, N.Y.

[21] Appl. No.: 839,020

[22] Filed: Mar. 12, 1986

[51] Int. Cl.[4] .......................................... G01R 31/28
[52] U.S. Cl. ............................. 371/29; 324/73 AT; 371/20
[58] Field of Search .......................... 371/20, 29, 15; 324/73 R, 73 AT; 364/200, 900

[56] References Cited

U.S. PATENT DOCUMENTS

| | | | |
|---|---|---|---|
| 3,575,589 | 4/1971 | Neema et al. | 371/29 X |
| 3,939,453 | 2/1976 | Schroeder | 371/29 X |
| 4,012,625 | 3/1977 | Bowen et al. | 371/20 |
| 4,135,662 | 1/1979 | Dlugos | 371/29 |
| 4,348,760 | 9/1982 | Rice et al. | 371/20 |
| 4,354,268 | 10/1982 | Michel et al. | 371/20 |
| 4,424,576 | 1/1984 | Lange et al. | 371/29 X |
| 4,434,489 | 2/1984 | Blyth | 371/29 |
| 4,499,581 | 2/1985 | Miazga et al. | 371/20 |

OTHER PUBLICATIONS

Ahonen, Microprocessor-Controlled Cable Tester, IBM Technical Disclosure Bulletin, vol. 23, No. 3, Aug. 1980, pp. 972–975.

*Primary Examiner*—Charles E. Atkinson
*Attorney, Agent, or Firm*—C. Lamont Whitham

[57] ABSTRACT

An electronic board testing system includes a card testing device which is designed for use with a personal computer (PC) and arranged for connection to a unit under test. Through the utilization of a test-authoring program, a test-implementing program may be created by a test designer by inputting appropriate testing process flow information in response to inquiries displayed on the PC screens. The test implementing program thereby created is effective to subsequently present on the PC display, testing procedures and probe placements to an operator to enable the collection and comparison of test data in a step-by-step and point-by-point process and to display the test results associated therewith on the PC screen.

25 Claims, 84 Drawing Figures

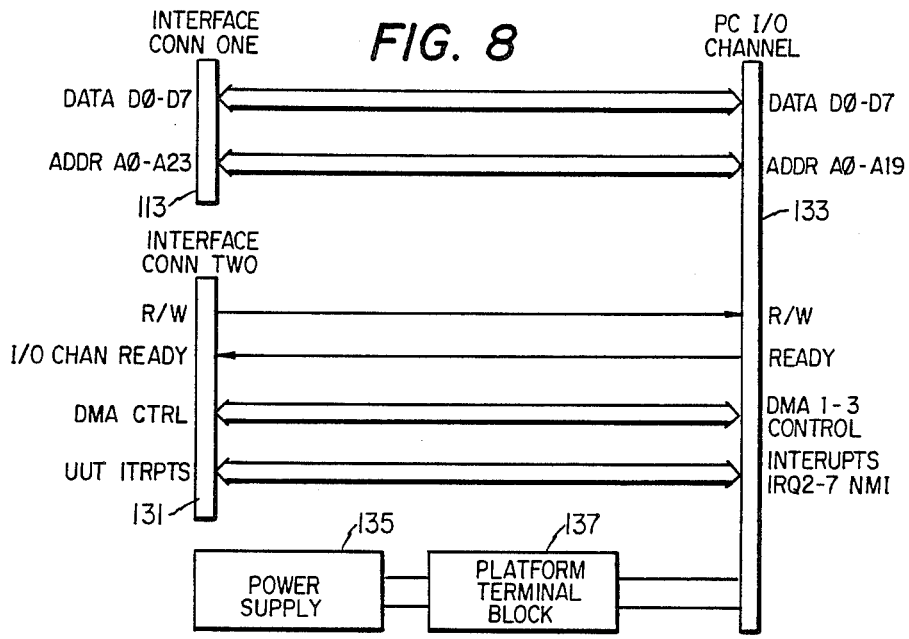
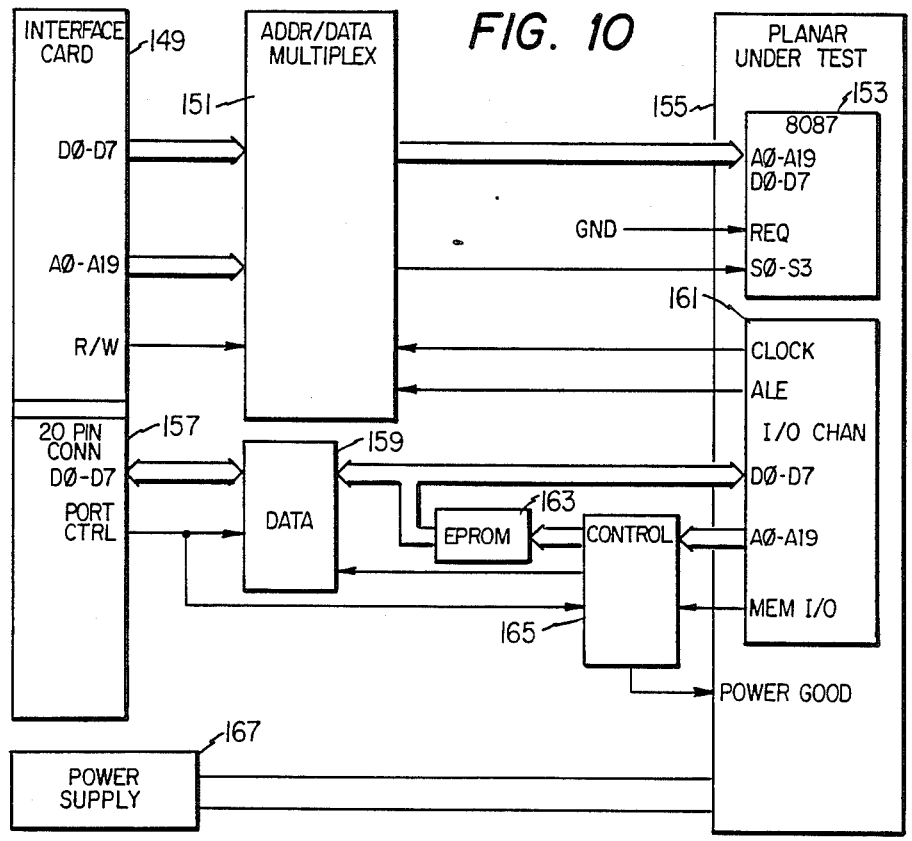

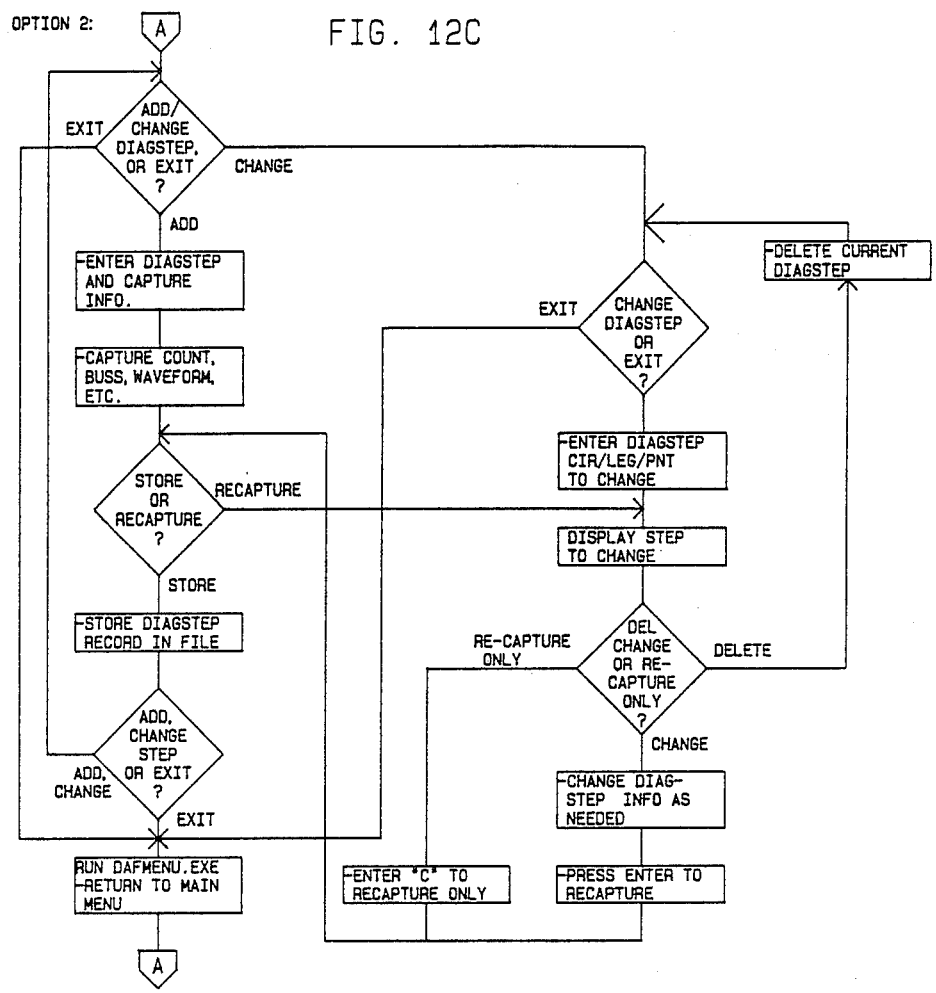

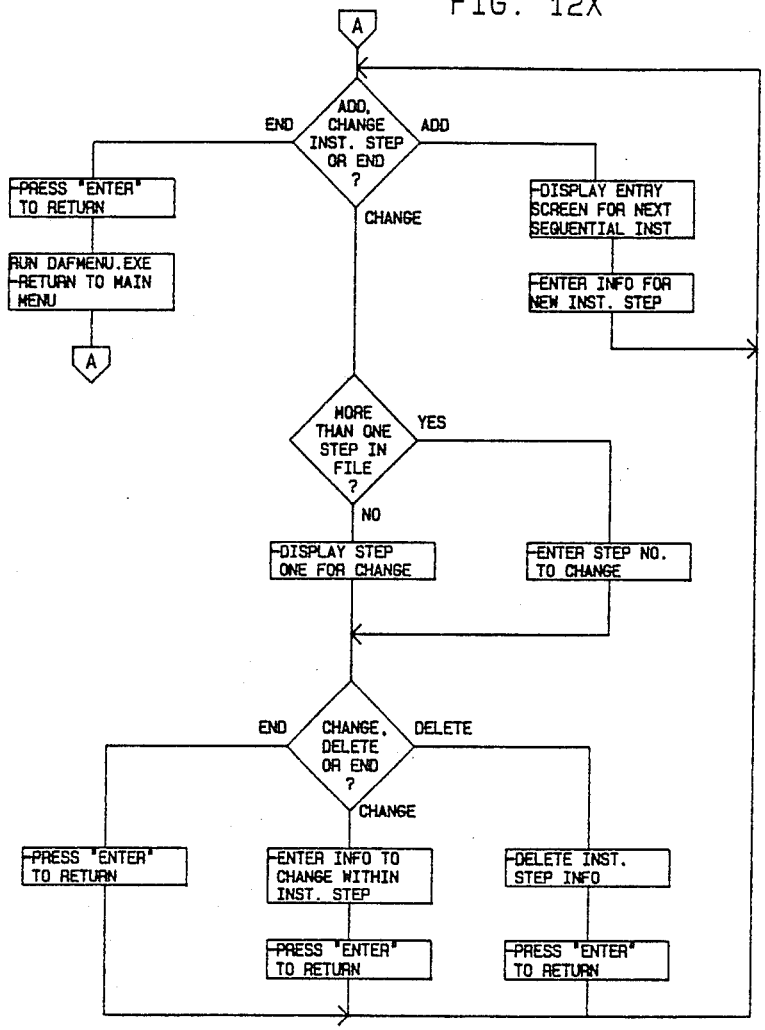

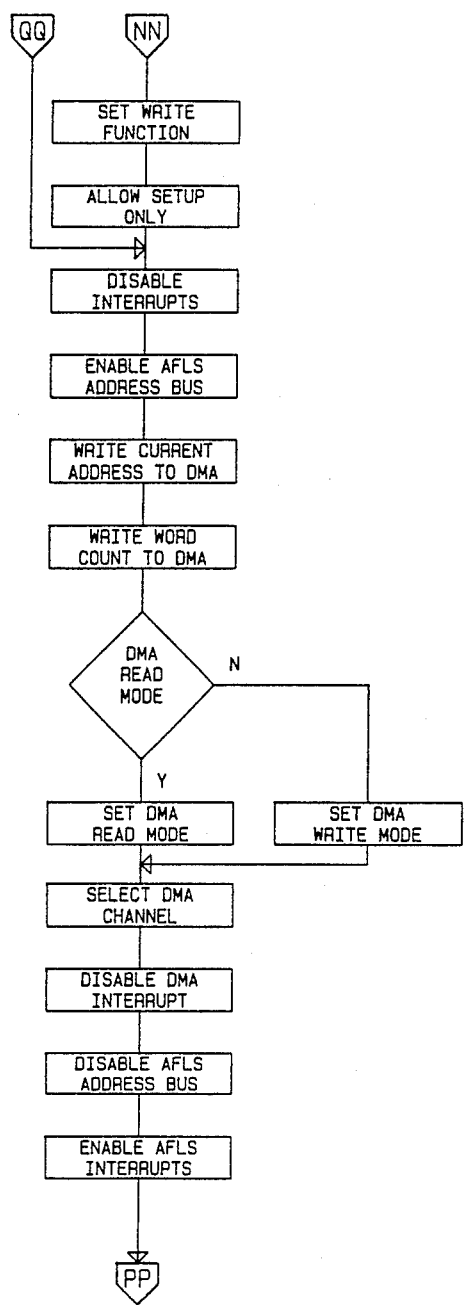
FIG. 1300

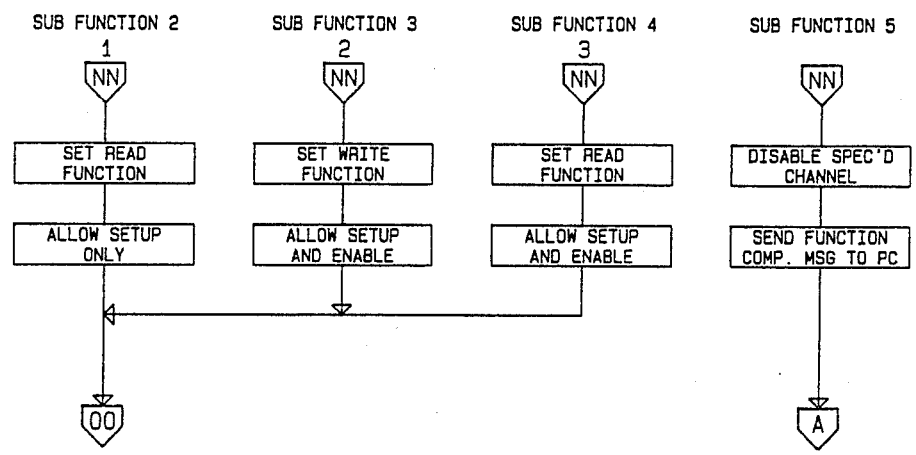

AUTOMATIC FAULT LOCATION SYSTEM FOR ELECTRONIC DEVICES

DESCRIPTION

1. Technical Field

This invention relates generally to the automatic detection and isolation of a failing component within an electronic card or board and, more particularly, to a system utilizing a personal computer to perform diagnosis of a field replaceable unit (FRU) to the failing component level utilizing a unique testing system which allows wave form analysis to be accomplished by a personal computer.

2. Background

The art of diagnostic testing has expanded significantly over the last few years from conventional diagnosis (free-lance probing with a scope) to basic structured diagnosis (diagnostic procedures directed by a microcomputer and a maintenance analysis procedure (MAP) plus some free-lance scope probing). While great strides forward have been made in electronics, and advances have been made in its "intelligence", very little has been done to improve the accuracy and speed by which they are used for diagnostic purposes.

For economic reasons, the current trend in electronic design/manufacturing is toward denser packaging such that the electronics of an entry-level computer can be assembled on a single card. A powerful PC having dual diskette drives, color graphics display, monochrome display, two parallel ports, a single serial port, time of day/date clock and 512 KB of memory would have only four cards in a planar board or mother board. From a repair standpoint, labor is reduced because a failing card/planar board can be quickly identified and replaced. However, the labor savings is offset by the high cost of the part that was replaced. In most cases the defective part is routed back to the parts channel to be repaired either by the original equipment manufacturer or a vendor/supplier. However, this process is still relatively expensive because of shipping costs, asset control requirements, specialized-to-the-part test equipment, and supplier mark-ups.

Standard fault locating techniques using diagnostic exercisers, logic diagrams, and an oscilliscope, as well as customized fault locating systems, are generally lacking in providing a total solution to the problem. Such systems are either designed for an engineering environment or are general "go/no go" test instruments and typically require a skilled technician to operate.

Accordingly, the present invention was designed to provide a diagnostic control apparatus that minimizes the amount of human judgment required in determining "go/no go" signals, and also eliminates the need for extensive additional test equipment in the diagnostic process. The automatic fault locator system (AFLS) disclosed herein was designed to be highly structured in the sense that the operator in the repair center is guided step-by-step in the process of locating the failing component on a card/board. Moreover, the system does not require additional test equipment such as a meter or an oscilliscope. The system also includes a profileable interface to the card or unit under test (UUT) such that it may be used across various product lines and be driven by current and future low end processing systems. Additionally, the fault locating system includes a diagnostic operating system that is transparent to the host driving system software as well as a diagnostic authoring system that is user friendly, easily updatable and may be revised by loading updated diskettes on the system PC.

DISCLOSURE OF THE INVENTION

The Automatic Fault Locater System (AFLS) according to the invention operates on the principal of comparing data from a defective part with specific data that was previously recorded from a known good part. The data that is compared consists of wave forms, signature counts (also known as event counts) and bus status captured.

Basic operation consists of initializing the unit under test (UUT) with specific data and then checking its output for desired responses (typically without operator intervention at this point). Once a defective output is found, the operator is directed to connect probes to specific components on the UUT by instructions displayed on a CRT screen. When the defect is found, the operator is directed to replace a component and rerun the test to verify the fix. The Automatic Fault Locater System is comprised of a host system which in the present example is a PC, a logic analyzer board (LAB) or Test Unit that connects to the host system via a bidirectional parallel port into the UUT via a profileable interface. The software that resides in the host system is hereinafter referred to as the Diagnostic Authoring Facility which is used to develop diagnostic programs and to communicate with both the operator and the logic analyzer board. As hereinafter explained in detail, the Diagnostic Authoring Facility is a program which allows an operator to custom design a trouble shooting process to match a particular electronic device, it being understood that the fault locator system will allow the repetitive analysis and testing of a series of defective devices or UUTs. The Diagnostic Authoring Facility runs on top of the AFLS operating system which is hereinafter disclosed in detail.

BRIEF DESCRIPTION OF THE DRAWINGS

A better understanding of the present invention may be had with reference to the accompanying drawings in which:

FIG. 8 illustrates the interface connector card of FIG. 2;

FIG. 10 is a block diagram of the planar driver interface hardware;

FIGS. 14A and 14B are illustrations of the monitor screen appearing during capture of the waveform.

DETAILED DESCRIPTION OF THE DRAWINGS

Figure 1:
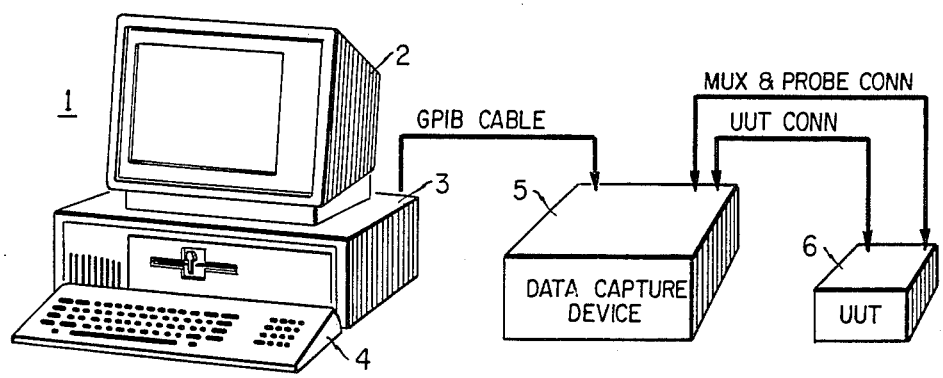
FIG. 1 is a block diagram of the automatic fault location system of the present invention.

In FIG. 1 there is shown a PC system 1 which includes a display unit 2, a disk drive and control unit 3 and a keyboard 4. The PC is connected to a test or data capture device 5 which in turn is interfaced to a unit under test (UUT) 6.

The UUT 6 may be any electronic device which is to be tested to determine and identify a defective component therein. The fault locator system is designed and programmed to run automatically such that the operator or testing technician is led through the trouble shooting process by menus and instructions appearing on the display unit 2 while moving a probe to different points within the UUT 6.

Figure 2:
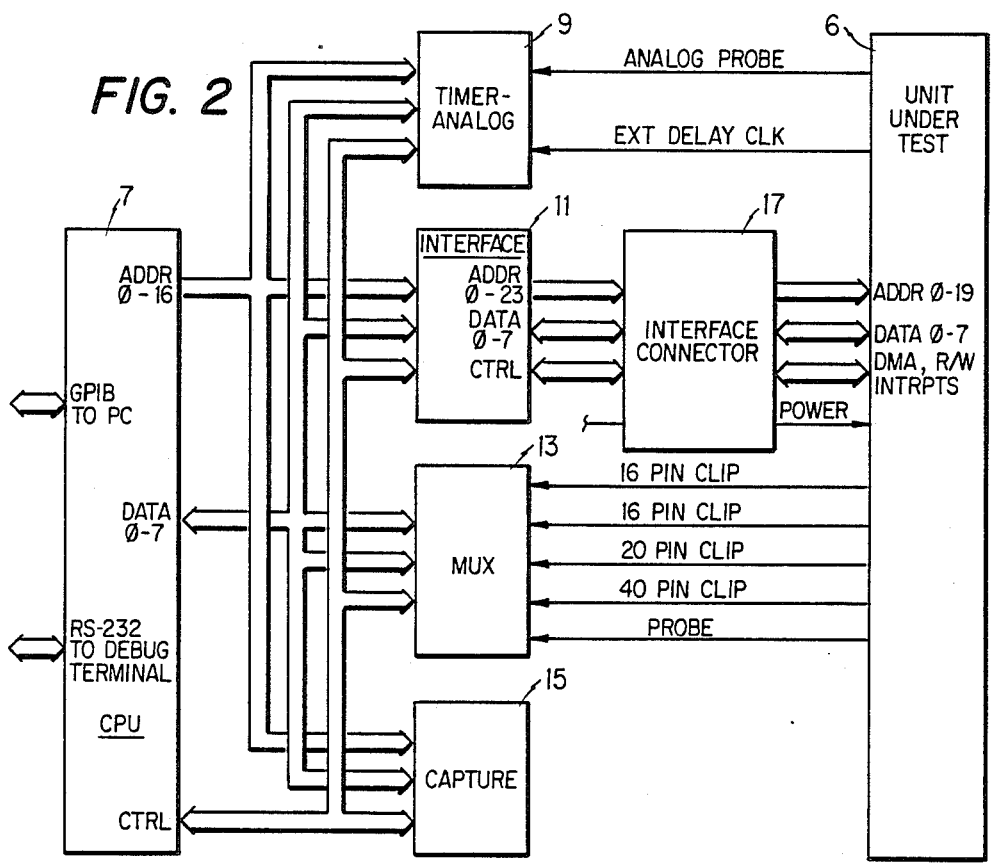
FIG. 2 is a block diagram of the data capture device shown in FIG. 1.

FIG. 2 shows the circuit board arrangement within the data capture device 5 shown in FIG. 1. The data capture device 5 includes a CPU card 7 which provides an Address Output to a timer analog circuit 9, an interface circuit 11, a multiplexer 13 and a capture circuit 15. The CPU card 7 also provides data signals to a data bus signal and control bus, which are in turn applied to the timer-analog circuit 9, the interface circuit 11, the multiplexer circuit 13 and the capture circuit 15. The timer analog circuit 9 receives analog probe input from the unit under test 6 together with an external delay clock signal. The interface circuit 11 provides address signals to an interface connector circuit 17 as well as receiving and transmitting data and control signals thereto. The interface connector card 17 provides address signals 0-19 to the unit under test 6 as well as receiving and transmitting data signals and control signals thereto. Power supply is applied to the interface connector board 17 and also therethrough to the unit under test 6. The multiplexer circuit board 13 is also arranged to receive two 16-pin clips, a 20-pin clip and a 40-pin clip as well as a probe input from the UUT 6.

Figure 3:
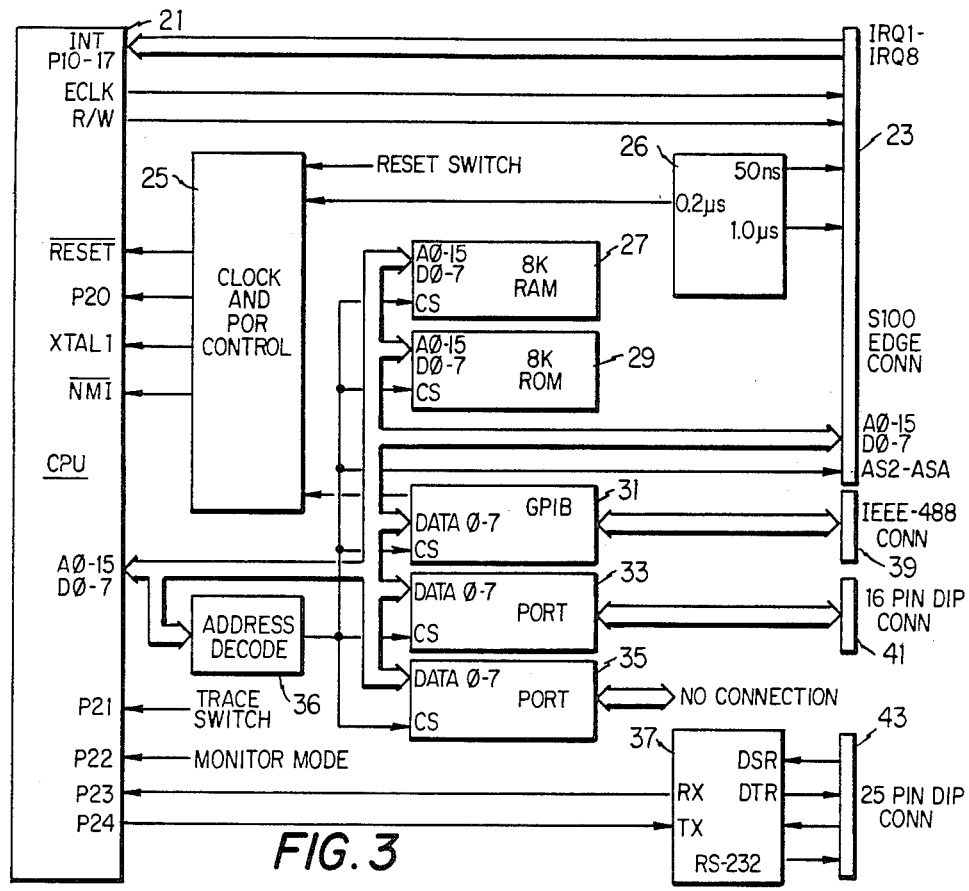
FIG. 3 is a block diagram of the CPU card shown in FIG. 2.

In FIG. 3, the CPU card 7 includes a CPU connector 21 which is connected directly to IRQI-IRQ8 terminals on an S100 edge connector 23. The CPU connector 21 also applies clock and read/write control signals to the edge connector 23. A clock and Power On Reset (POR) control circuit 25 receives inputs from a reset switch and a clock circuit 26. The address signals A0-15 and data signals D0-7 are available at the CPU connector 21 and applied to an 8K RAM 27 and 8K ROM 29 a GPIB circuit 31, a port circuit 33 and another port circuit 35. The address and data signals are also applied to an address decode circuit 36 which provides a CS signal to the two port circuits 33 and 35 as well as the GPIB circuit 31, the 8K ROM 29, the 8K RAM 27, and the edge connector 23. The GPIB circuit 31 is connected to an IEEE-488 connector 39 and the port circuit 33 is connected to a 16-pin dip (dual inline pin) connector 41. The CPU terminal 21 also has available a trace switch signal at terminal P21 and a monitor mode signal at terminal P22. The connector 21 also receives an RX signal and applies a TX signal to an RS 232 circuit 37 which in turn receives input and provides outputs to a 25 pin dip connector 43.

The micro-processor runs at 1.25 MHZ and includes 8 KB of EPROM containing the Diagnostic Operating System, 8 KB of static RAM used for message and data storage, a parallel port for communication with the host system, a serial port for program debug and address decoding for memory and the other I/O ports.

The CPU is a 68A03 card and has 8 KB of ROM, 8 KB of RAM and the GPIB interface. The data capture functions that are implemented in ROM and RAM are hereinafter described in connection with the software functions. The GPIB is the interface to the PC which in the present example, is an IBM PC/XT. The fault locating system defaults to the GPIB address 0. Interface and test code is loaded in the data capture device 5 by this path. Approximately 4,000 bytes are transferred in 15 seconds. Later, during the fault location phase, this path is used to send messages back and forth as the diagnose process proceeds.

Figure 4:
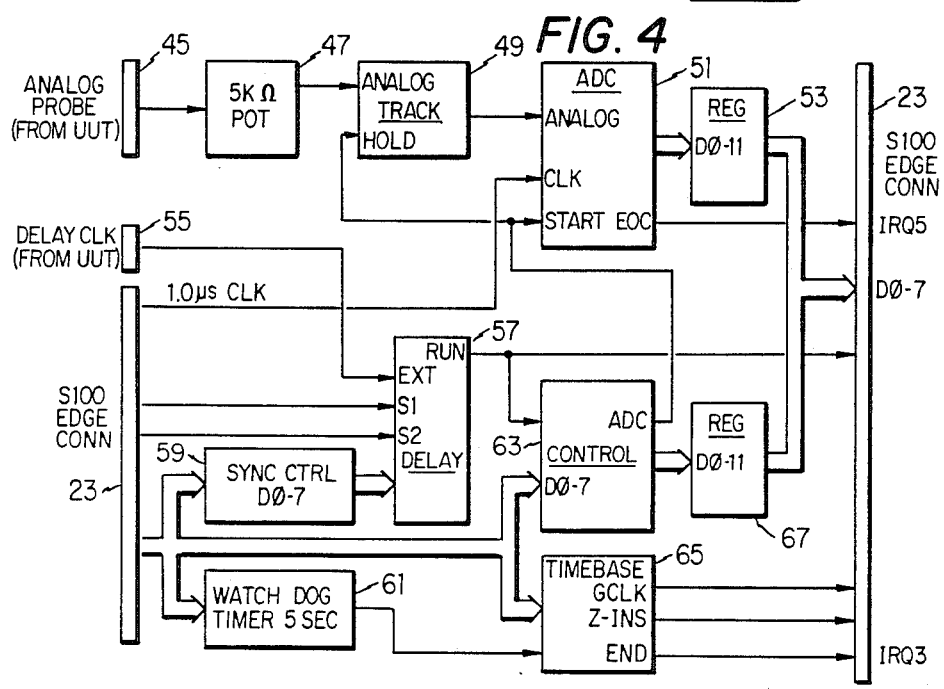
FIG. 4 is a block diagram of the timer-analog card shown in FIG. 2.

FIG. 4 shows the circuits within the timer-analog card 9 shown in FIG. 2. The timer-analog card 9 receives an input from an analog probe 45 from the UUT 6 which is connected to a 5K ohm pot 47. The output of the pot 47 is connected to the analog input of a track-/hold circuit 49 which provides an analog output signal to an ADC circuit 51. The analog-to-digital converter (ADC) circuit 51 provides an output to an REG circuit 53 which in turn applies data signals D0-7 to the S100 edge connector 23. The timer-analog circuit 9 also receives a delay clock signal at terminal 55 from the UUT 6 which is applied to a delay circuit 57. The delay circuit 57 provides an output to the S100 edge connector 23. S1 and S2 signals from the S100 edge connector 23 are also applied to the delay circuit 57 as well as data signals D0-7 from a sync control circuit 59. The sync control circuit 59 receives data signals D0-7 from the S100 edge connector 23. Those signals are also applied to a watchdog timer 61, a control circuit 63 and a time base circuit 65. The time base circuit 65 provides outputs to the S100 edge connector 23. The timer-analog card 9 provides time base, analog to digital conversion, and data counter functions. This card has the function of an oscilliscope with a horizontal sample of 200 points at 12-bit resolution. The manual analog probe is attached as shown. The fastest clock is 5 nS. That clock rate gives 50 nS per division with 10 divisions shown on the PC color display. The slowest rate is 0.5 seconds per division. The timing section consists of three parts:

a. a base crystal oscillator running at 50 MHZ,
b. a divide by 10 circuit to provide the 200 nS 68A03 clock, and
c. a divide by 5 circuit to provide the 1.0 S clock for the 8253 Programmable Timer for sweep speeds greater than 0.5 mS/Div., the Watchdog Timer 61 which will interrupt the LAB in the event of a hang-up and the Delay Timer. The Delay Timer may also be connected, under program control to an external clock source.

The Synchronization Section has provision for starting a waveform capture, bus capture or event counting cycle on a. the occurrence of the first sync pulse (SYNC1),
b. the occurrence of the second sync pulse (SYNC2) following a SYNC 1 pulse,
c. the occurrence of SYNC2 following a programmed delay time out after the occurrence of SYNC1, or d. the programmed delay time out after the occurrence of SYNC1.

Figure 5:
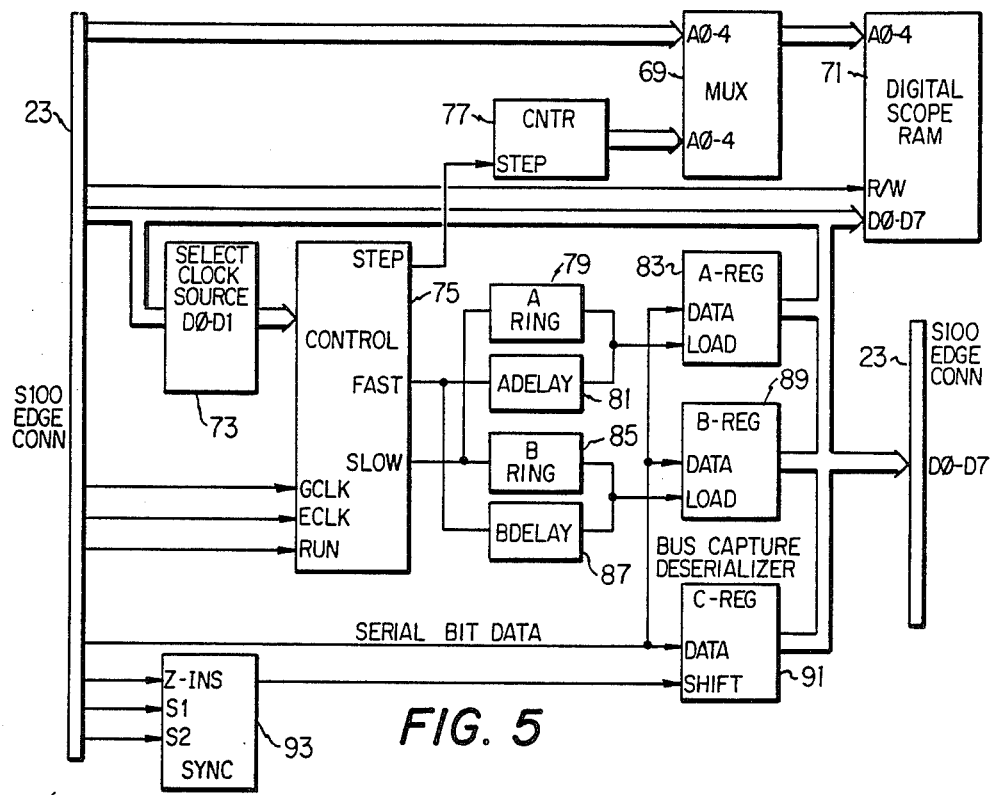
FIG. 5 is a block diagram of the capture card as shown in FIG. 2.

The capture card 15 is shown in detail in FIG. 5. The S100 edge connector 23 provides A0-4 signals to a multiplexer circuit 69 which in turn applies address signals A0-4 to a digital scope RAM 71. A clock source circuit 73 receives data signals D0-D1 from a data bus connected to the edge connector 23 and provides an output to a control circuit 75. The control circuit 75 provides a step output to a counter 77 and also provides control signals to an A ring circuit 79, an A delay circuit 8, a B ring circuit 85 and a B delay circuit 87. The counter circuit 77 provides output signals A0-4 to the multiplexer circuit 69. A common output from the A ring circuit 79 and the A delay circuit 81 is applied to an A register circuit 83 and a similar connection from the B ring circuit 85 and the B delay circuit 87 is applied to a B register 89. Outputs from the A register 83 and the B register 89 are applied to a data bus which applies data signals D0-7 to the digital scope RAM 71 and also the S100 edge connector 23. Serial bit data is also applied from the edge connector 23 through a C register circuit 91. The C register 91 also receives an input from a sync circuit 93 which in turn receives inputs from the edge connector 23.

The capture card 15 has sync conditioning and digital data bus capture functions. This card builds up a data byte from the probe selected on the multiplex card 13. The desired data (typically a waveform) is clocked, alternately into dual 8-bit TTL shift registers. After every eighth clock pulse, one set of shift registers is clocked into high speed TTL memory that has a capacity of 256 bits. The fastest clocking speed is 5 nS. The 256 bit memory capacity is compatible with an IBM PC Color Graphics card operating in medium resolution where 200 bits of waveform data are displayed in color.

The high speed TTL memory is dual ported. While in the waveform capture process, the address bus is connected to binary counters that are synchronized to the shift register clock. Likewise, in this mode, the memory data bus is connected to the shift register output.

After waveform capture the TTL memory's address and data buses are controlled by the 68A03 Microprocessor.

The counter section consists of a 12 bit binary counter that has a dual function. In the waveform capture mode the counter provides the addressing for the TTL memory. In count mode the data input is routed to the counter instead of the dual shift registers. If the shifts of the incoming data exceed the capacity of the 12 bit counter, a carry is added to a software counter. The 12 bit capacity of the counter allows sufficient time for this software carry update.

In the Data Delay Section, waveforms actual versus expected, when in the diagnose mode, are allowed to vary only by one bit. A two bit variance is considered a no compare classified as a defect. The purpose of this section, therefore, is to minimize any variation of waveform capture readings that may be caused by intrinsic delays in the LAB circuits themselves and to assure waveform consistency from one LAB to another.

Therefore, upon initialization of the LAB, the 68A03 Micro-processor's Enable pulse, which is tied back to the base LAB clock, is processed through the data path and a waveform capture cycle. If the leading edge of the E pulse is not captured, 5 nS of delay is added to the data path. This process continues until the leading edge of the E pulse is captured. From that point on all data is processed with the same amount of delay.

The Bus Capture section allows the capturing of the status of up to eight lines at any specific instant. It is required any time it is necessary to determine the status of lines that have several sources, such as address and data buses.

The status of the selected lines are clocked, on successive capture cycles, into a shift register. At the completion of the last capture cycle, the shift register is read into the Waveform Capture Section on a normal capture cycle. The captured bus data is then displayed as a series of eight binary 0's and 1's with bit 7 at the beginning of the display on the host system.

Figure 6:
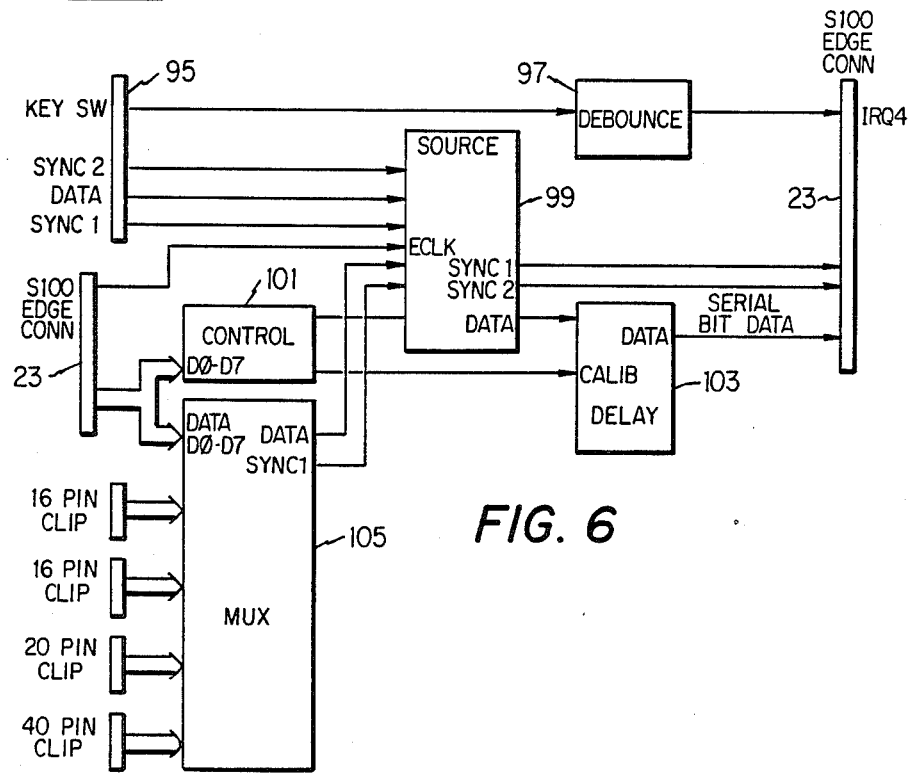
FIG. 6 is a block diagram of the multiplex card shown in FIG. 2.

FIG. 6 shows the contents of the multiplexer card 13 of FIG. 2. An input terminal 95 applies a key SW signal to a debounce circuit 97 which in turn provides an output to the S100 edge connector 23 of the data capture device 5. A source circuit 99 receives sync 2, data, and sync 1 signals from the input terminal 95 as well as an eclk signal from the edge connector 23 and data and sync 1 signals from a multiplexer circuit 105 and applies sync 1 and sync 2 output signals to the edge connector 23 as well as a data output to a delay circuit 103. The delay circuit 103 provides serial bit data output to the edge connector 23. A control circuit 101 receives data signals D0-07 from the edge connector 23 and applies them to the source circuit 99 and the delay circuit 103. The data signals D0-07 are also applied to the multiplexer circuit 105 in addition to inputs from two 16-pin clip connectors, a 20-pin clip connector, and a 40-pin clip connector as shown.

The multiplex card has data in sync signal selection. There are four DIP clip connectors of 16, 16, 20 and 40 lines, totalling 92 lines. Multiplexing occurs to select one of the lines for data input and one of the lines for sync input. These four DIP connectors may attach to smaller ICs, assuming there is enough space available at one end. For example, a 16-pin clip may attach to a 14-pin module, and the diagnose program will ignore pins 8 and 9, mapping 16 to 14, etc. The 92 lines are actively terminated to provide noise immunity. There is a manual probe which contains one data input, two sync inputs, and a push button to provide an operator generated signal. The multiplexer section terminates in a series of sockets to which cables are connected to the UUT. The base LAB has four sockets having 16, 16, 20 and 40 pins. Any one of 92 lines from the sockets may be routed, under program control, to the DATA and SYNC1 inputs of the Synchronization and Waveform Capture Sections. This feature allows the measurement of multiple inputs with minimum operator intervention. For instance, all six outputs of the nine pin "d" shell connector on the IBM Color Graphics card can be measured by attaching only one cable.

Figure 7:
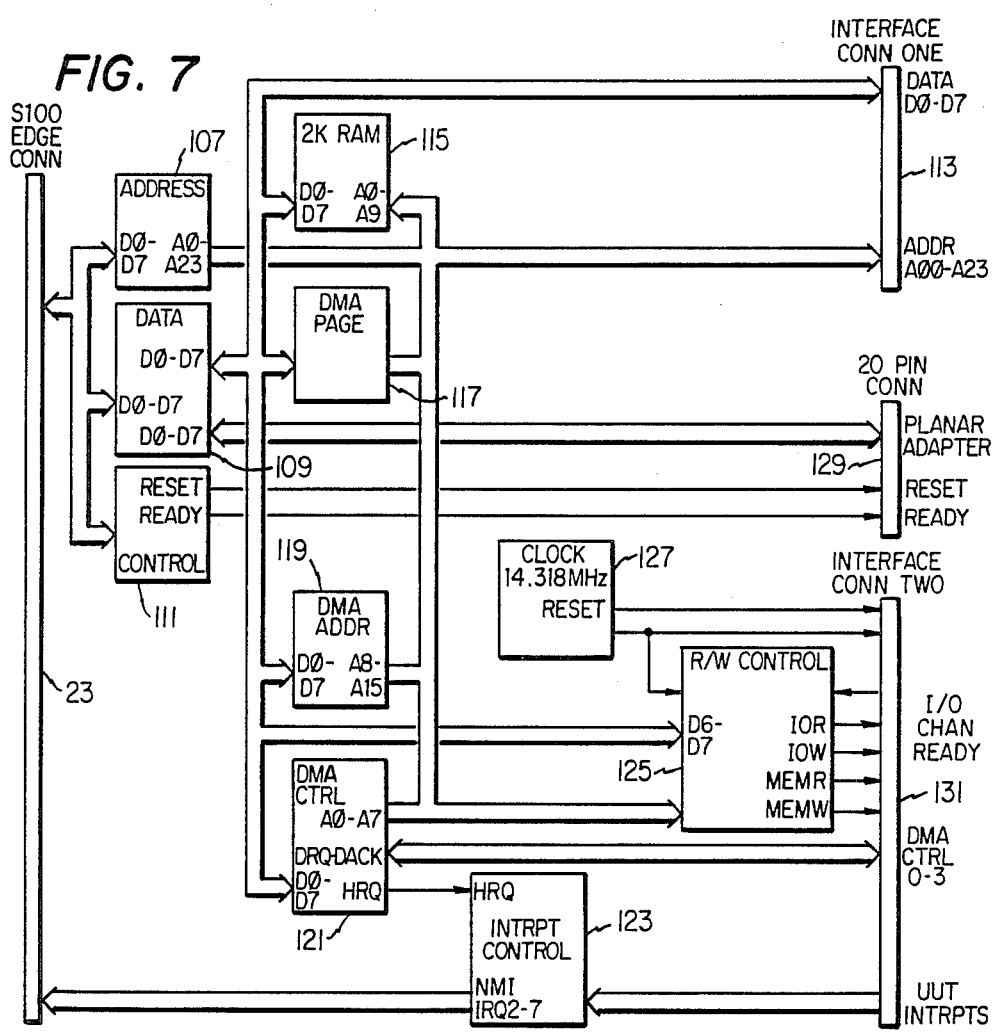
FIG. 7 is a block diagram of the UUT interface card shown in FIG. 2.

In FIG. 7, the details of the interface connector card 17 are disclosed. The UUT interface is designed to completely isolate the UUT from the Test Unit 5 and to allow 1 MB of UUT memory and I/O addressing in 64 KB blocks. The UUT interface can also be profiled such that different product types may be connected and tested. The D0-D7 data terminals and A0-A23 address terminals on the S100 edge connector 23 are applied to corresponding terminals of an address circuit 107, a data circuit 109, and a control circuit 11. The address circuit 107 provides address signals A00-A23 to the interface connector 1 terminal 113. The data signals D0-07 are also applied to a 2K RAM circuit 115, a DMA page circuit 117, a DMA address circuit 119, and a DMA control circuit 121. In addition to data output terminals of the interface connector one terminal 113, address signals A0-A7 are applied via an address bus to the 2K RAM 115, the DMA page circuit 117, the DMA address circuit 119, and the DMA control circuit 121 as well as to a read/write control circuit 125. The DMA control circuit 121 provides an output signal to an interrupt control circuit 123 which receives the UUT interrupt signals from the interface connector two 131 and applies output signals to the S100 edge connector 23. A clock circuit 127 provides a reset signal to the interface connector two terminal 131 and also to the R/W control circuit 125. DMA signals are also connected from the DMA control circuit 121 to the interface connector two terminal 131. The control circuit 111 applies reset and ready signals at the 20-pin connector 129 as well as data signals D0-D7 at the planar adapter terminals of the 20-pin connector 129.

The interface card 11 provides DMA and memory refresh to the UUT 6. These functions are specialized to emulate the IBM PC I/O channel bus functions. There are 24 address lines, 8 data lines and 23 control lines. These lines are available at two 40-pin top card edge connectors.

FIG. 8 shows the interface connector 17 of FIG. 2. Interface connector one 113 is connected to the PC I/O channel 133 to provide data signals D0-07 and address signals A0-A19. The interface connector two 131 provides connections to the PC I/O channel connector 133 to apply a read/write signal thereto and receive a ready signal therefrom. Also, DMA control signals and UUT interrupt signals are applied to a common interconnecting bus. A power supply circuit 135 is connected to the PC I/O channel terminal 133 through a platform terminal block 137.

There is a detachable PC I/O interface connector/mounting platform for the unit under test 6. The PC adapter connector is of zero insertion force designed to minimize wear. The platform can be replaced if the UUT 6 has a physical interface that does not match the original connector. Power must be turned off each time a UUT is connected or disconnected to the UUT interface. Therefore, the interface and test software must be reloaded each time the UUT is exchanged. The user can modify the UUT interface, so that UUT power can be switched off without powering off the hardware. The software is designed so that it can be restarted. This means the UUT can be exchanged and the testing device can be restarted without delay.

Figure 9:
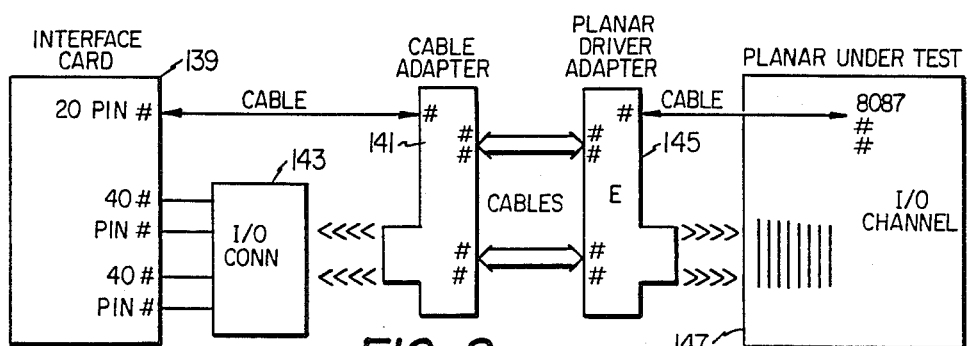
FIG. 9 illustrates the planar board interface hardware.

FIG. 9 discloses an arrangement by which a planar or mother board in the PC may also be tested using the fault locating system herein disclosed. An interface card 139 is connected by a cable to a cable adapter 141. Various pin connectors are also connected to an I/O connector 143. The cable adapter 141 connects with a planar driven adapter 145 which includes a diagnostic EPROM as designated by "E". The planar under test 147 is connected to the planar driven adapter 145 by means of a cable. The cable adapter plugs into the data capture device 5 and the planar driver adapter plugs into the planar under test 147.

FIG. 10 shows a planar driver interface hardware in the system shown in FIG. 9. An interface card 149 applies data signals D0-07 to an address/data multiplexer circuit 151 which in turn applies address signals A0-A19 and data signals D0-D7 to a socket 153 provided on the planar board for an 8087 math co-processor IC. The 8087 circuit also receives S0-S3 signals from the multiplex circuit 151. When the "REQ" line of the 8087 sachet 153 is tied to ground (GND), the planar driver 6 has control of the UUT planar 155. A 20-pin connector 157 provides data signals to a data circuit 159 which in turn applies data signals to an I/O CHAN circuit 161 on the planar board under test 155. The data circuit 159 also receives port control signals from the 20-pin connector 157 to allow the transfer of data between the planar board 155 and the fault locating system. The control circuit 165 forces the planar board 155 to execute a test program that resides in EPROM 163 when the "power good" input on the planar board under test 155 is toggled. Voltage is applied to the planar board under test 155 from the power supply 167.

The planar board test hardware includes a 20-pin connector on the interface card 149. This is in addition to the current two 40-pin connectors. This connector supplies five control lines and an 8-line data bus. The hardware also includes a cable adapter card which plugs into the UUT connector. A short cable runs from the 20-pin connector on the interface card to a connector on the planar test card. Its function is to merge the UUT connector signals with the signals on the 20-pin connector. Two 40-line cables run from connectors on this card to connectors on the planar driver adapter card which in turn plugs into a planar I/O channel connector. A planar driver adapter card contains a diagnostic EPROM. It also has logic for address and data multiplexing required by the 8088 microprocessor architecture. One 40-line cable runs from this card to the 8087 socket 153 on the planar board.

The above-described figures discloses the hardware included in the data capture device 5 shown in the automatic fault locating system of FIG. 1. As hereinbefore noted, this system is employed to identify defective components on a board within an electronic device comprising a plurality of cards. It is presumed that a complete schematic diagram of the unit under test is available and in order to identify each point along the many circuits contained therein, it is necessary to define a convention by which each such point has a unique point number. That convention is illustrated in FIG. 11.

Figure 11:
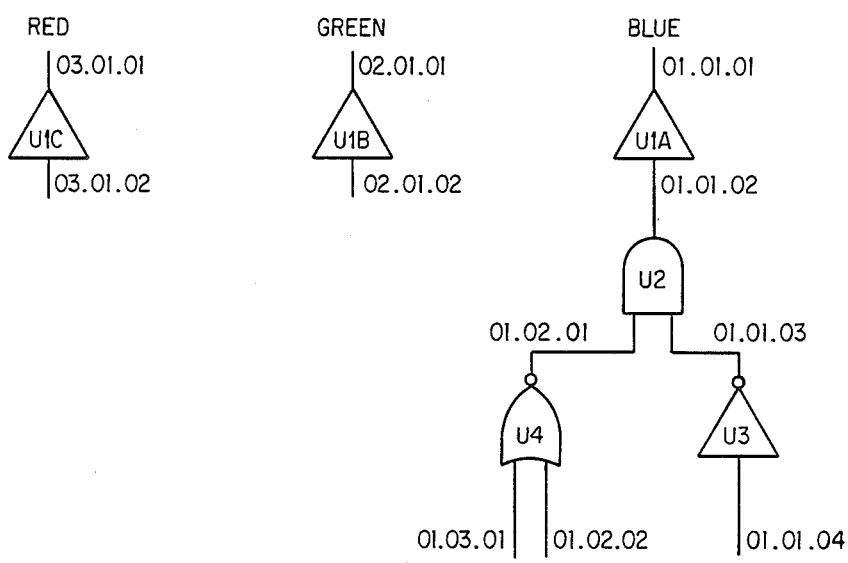
FIG. 11 is an illustration showing the circuit identification convention adopted for usage in connection with the present invention.

FIG. 11 shows an exemplary portion of a schematic diagram for a unit under test. In the figure, the outputs are designated as shown either "RED", "GREEN" or "BLUE". Each of those outputs is identified by a unique point number. For example, RED is designated by "03.01.01", GREEN is designated by "02.01.01" and BLUE is designated "01.01.01". The first two digits in the identification number are used to designate the particular circuit within the schematic. The second two digits are used to designate the leg within the circuit and the final two digits in the identification number are used to indicate the particular point in that leg. For example, in the "BLUE" circuit shown in FIG. 11, the output identifies point 01 within leg 01 of circuit 01 of the schematic. That point is an output of a circuit U1A which has only one input designated "01.01.02". The input is so designated since it is merely another point along the same leg of a single circuit. Accordingly, where there are no additional inputs to provide an output with respect to a particular component in a schematic diagram, only the point designation or final two digits in the identification number need to be changed as shown in the RED and GREEN circuits.

However, with respect to the U2 gate shown in the BLUE or 01 circuit, it is noted that there are two different inputs. Using the adopted convention, one of those inputs will be taken as a continuation of the same "leg" of the schematic and hence the circuit and leg portions of the identification number will remain the same and only the point numbers will change to indicate the presence of another component between points. This can be seen with reference to the inverter U3 which has an output designated "01.01.03" and an input designated "01.01.04". However, the other input to the gate U2 is considered to begin another leg in the same circuit and accordingly the second two digits must be changed to so indicate. Therefore, the left hand input to the gate U2 is designated "01.02.01" meaning the first point of the second leg of the first circuit. Similarly, the right hand input to the gate U4 is considered another point in that circuit and is designated "01.02.02" or the second point of the second leg of the first circuit while the left input to the gate U4 is considered as a new leg in the circuit and is therefore designated "01.03.01". These designations define the convention used in the disclosed embodiment of the present invention and are utilized in the programming and operation of the automatic fault locating system shown in FIG. 1.

Figure 12A:
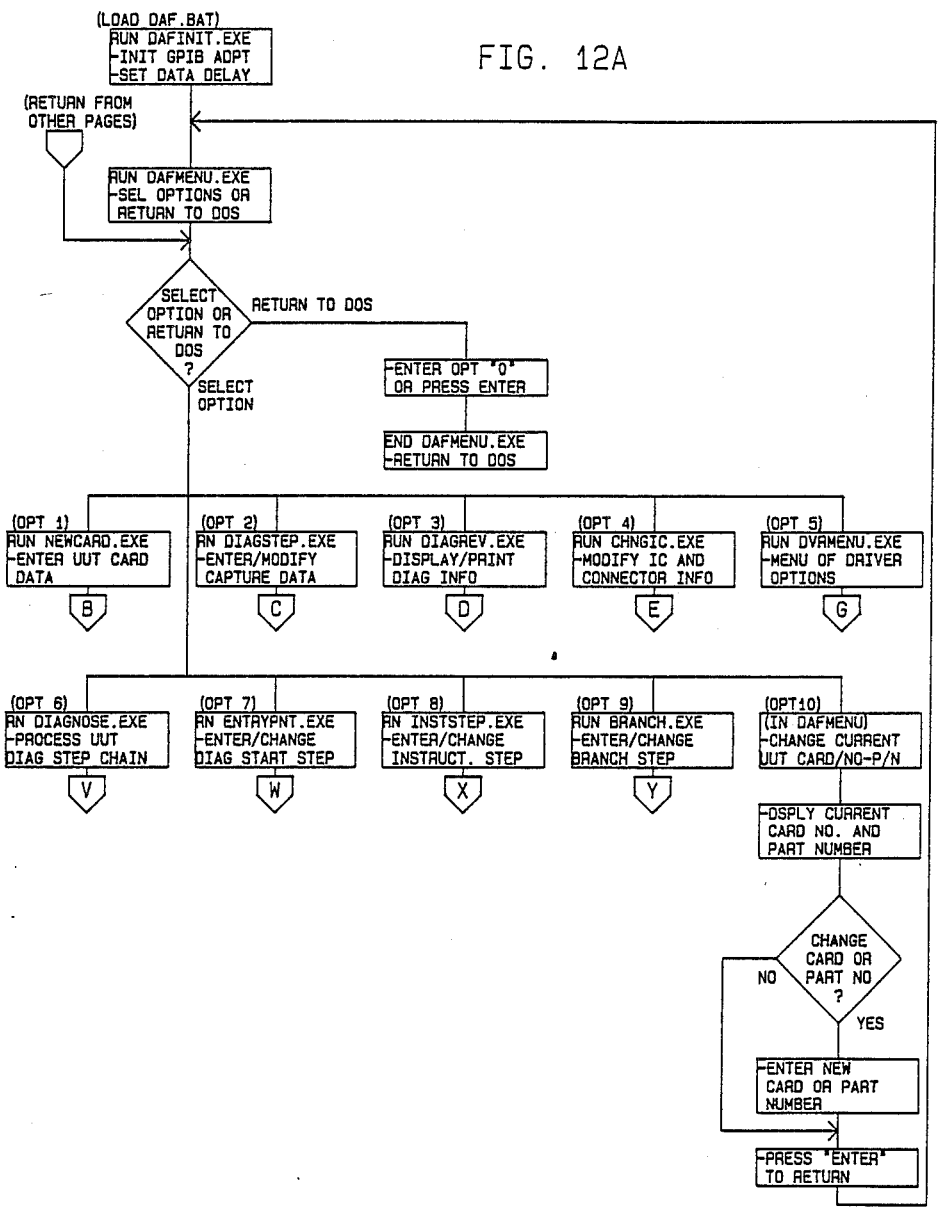
FIGS. 12A-Z are flow charts illustrating the operation of the Diagnostic Authoring Facility implemented in the present invention.
Figure 12B:
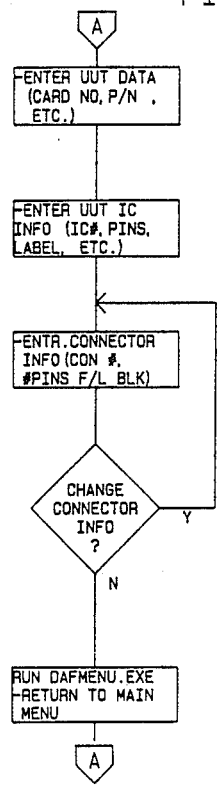
Figure 12D:
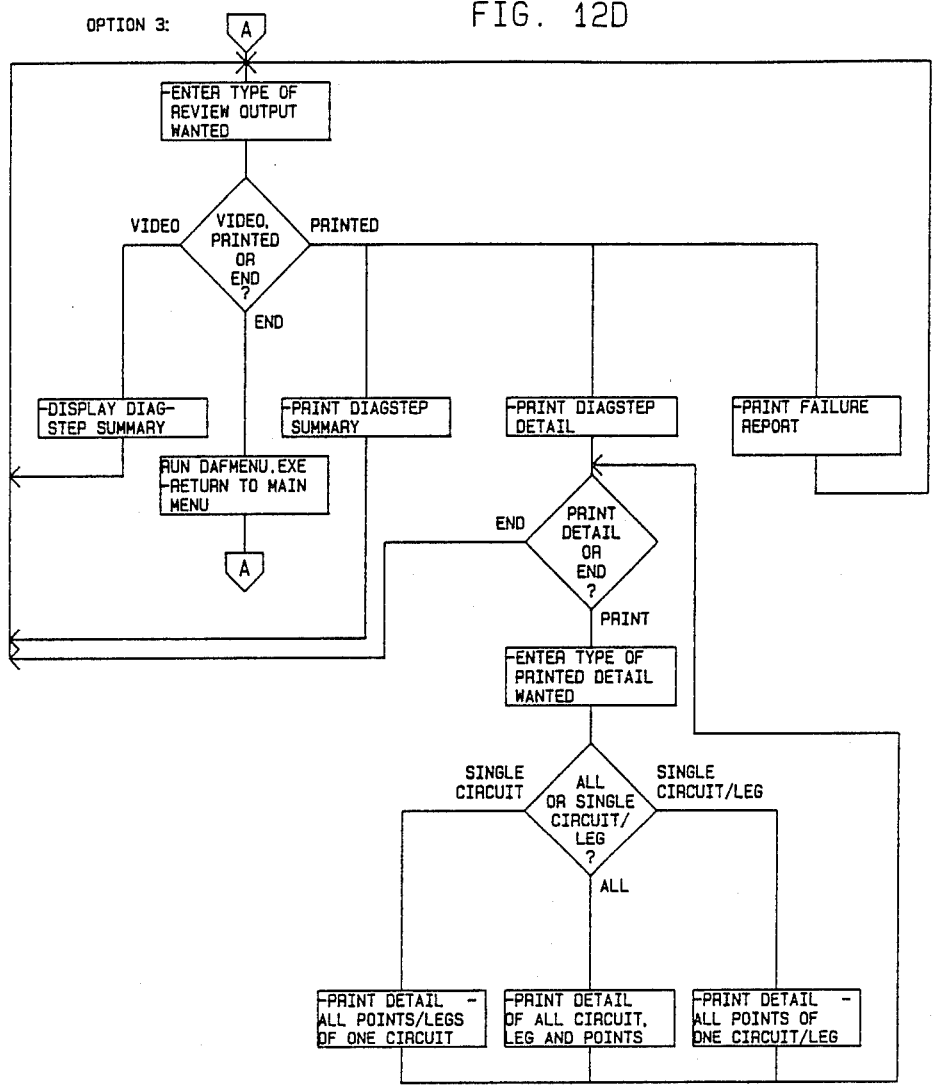
Figure 12E:
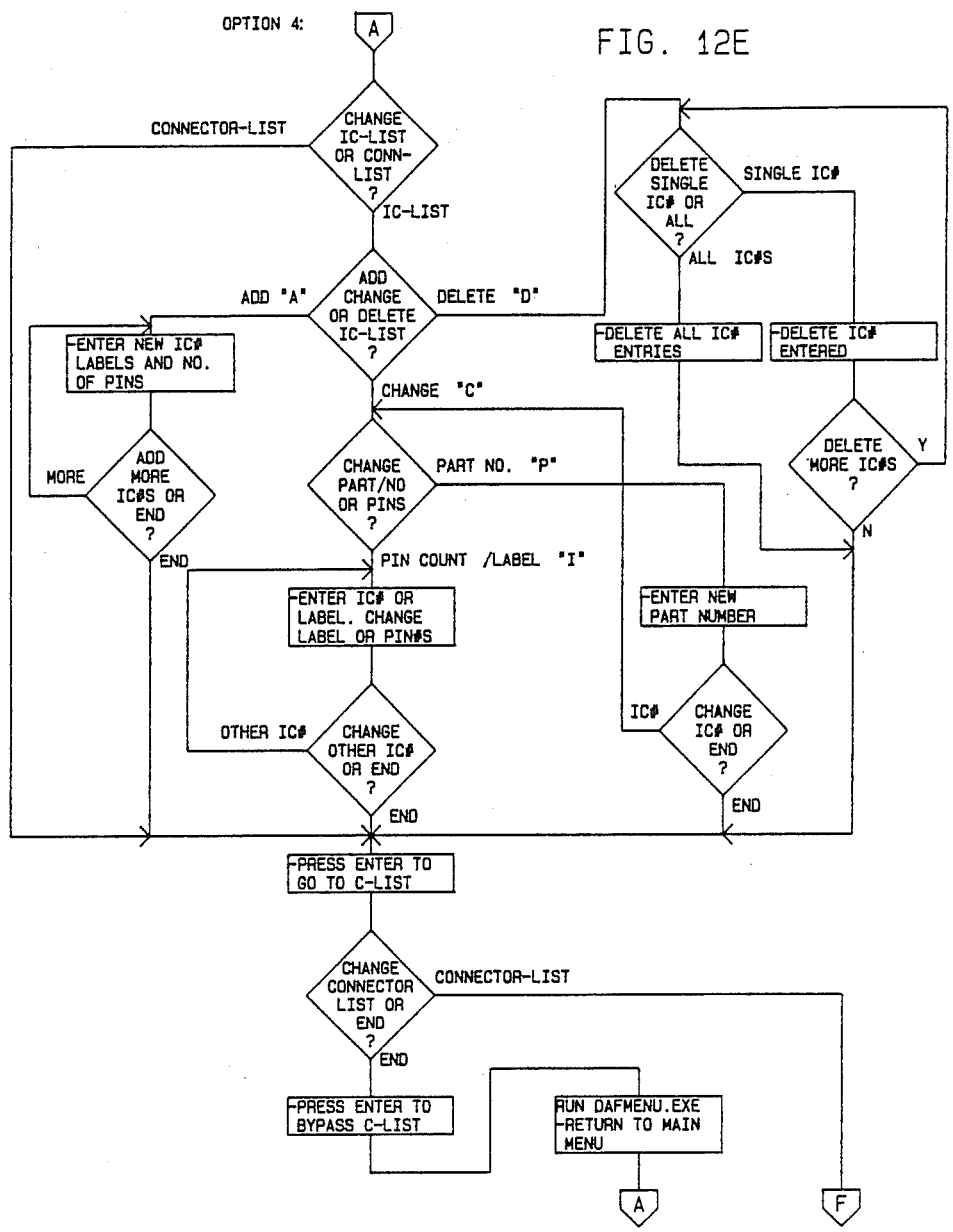
Figure 12F:
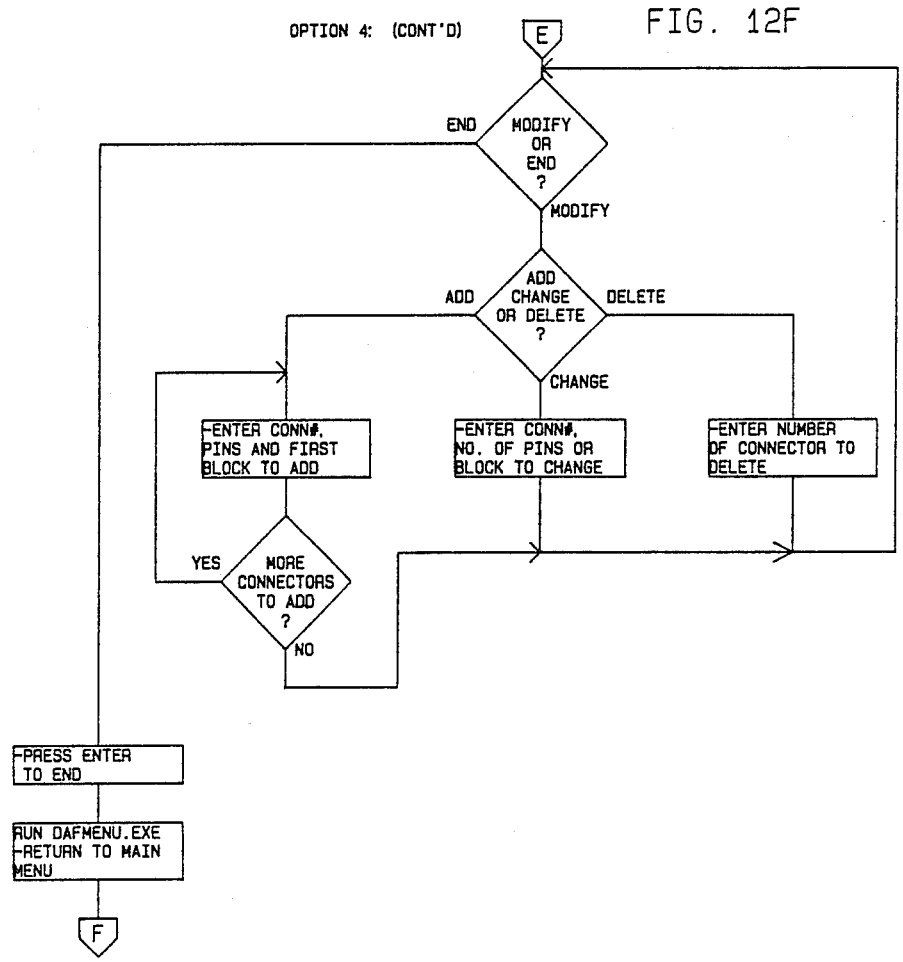
Figure 12G:
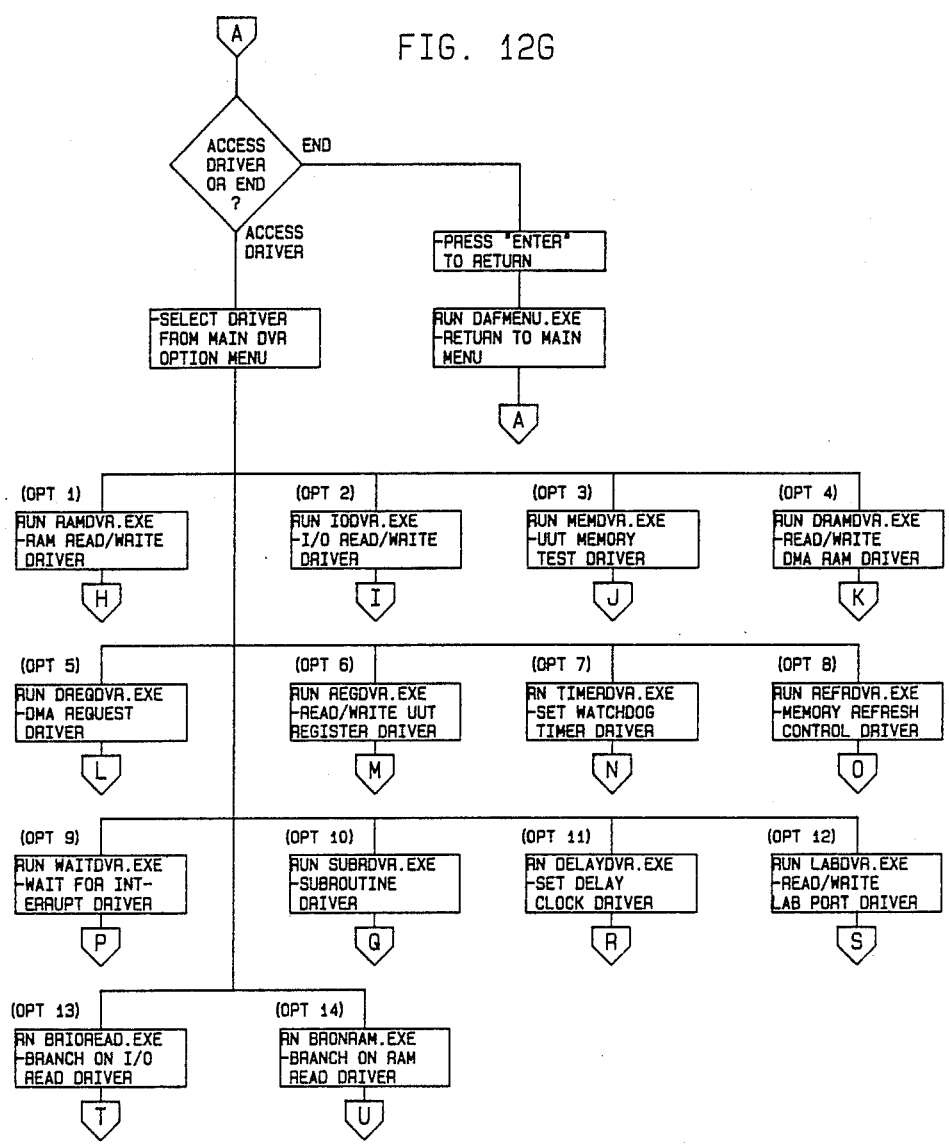
Figure 12H:
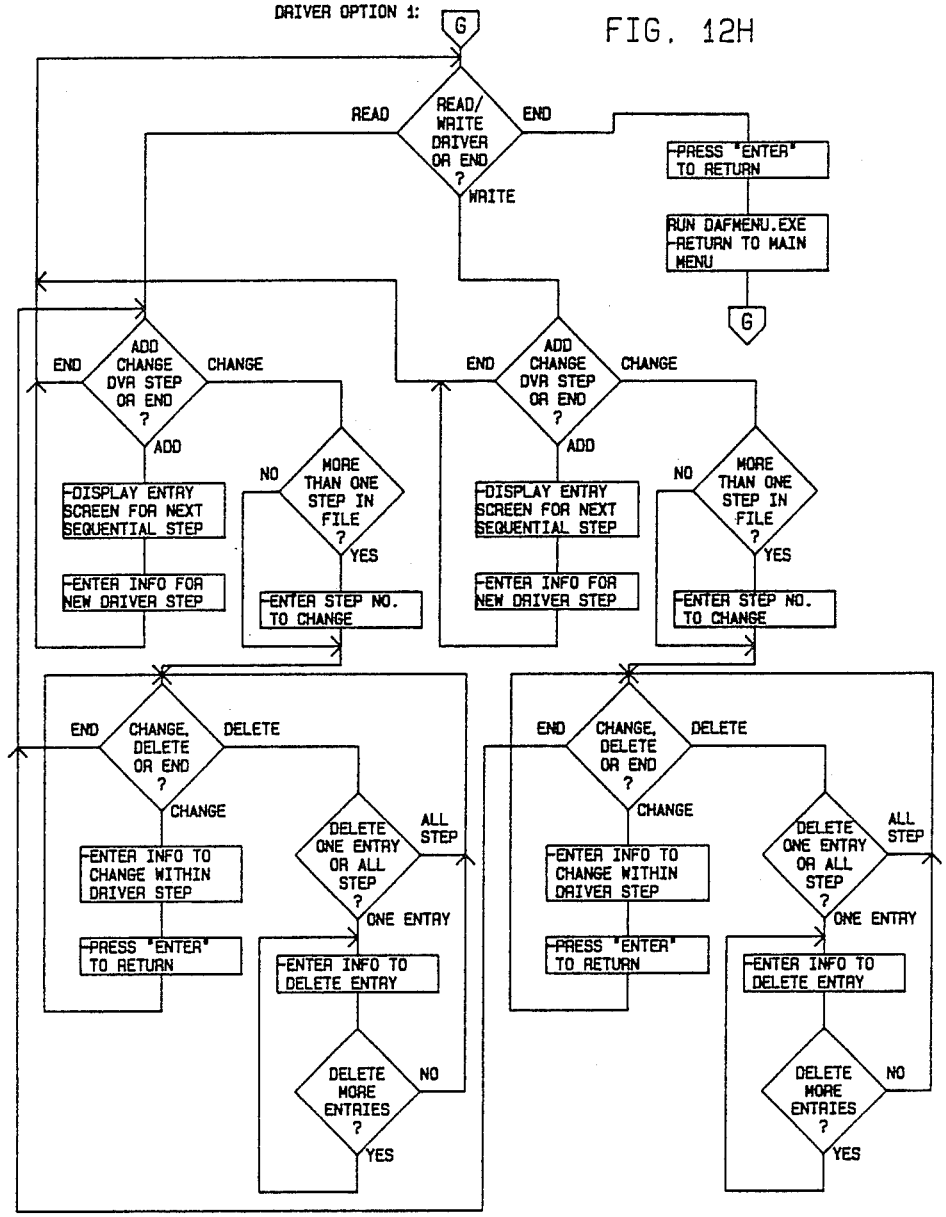
Figure 12I:
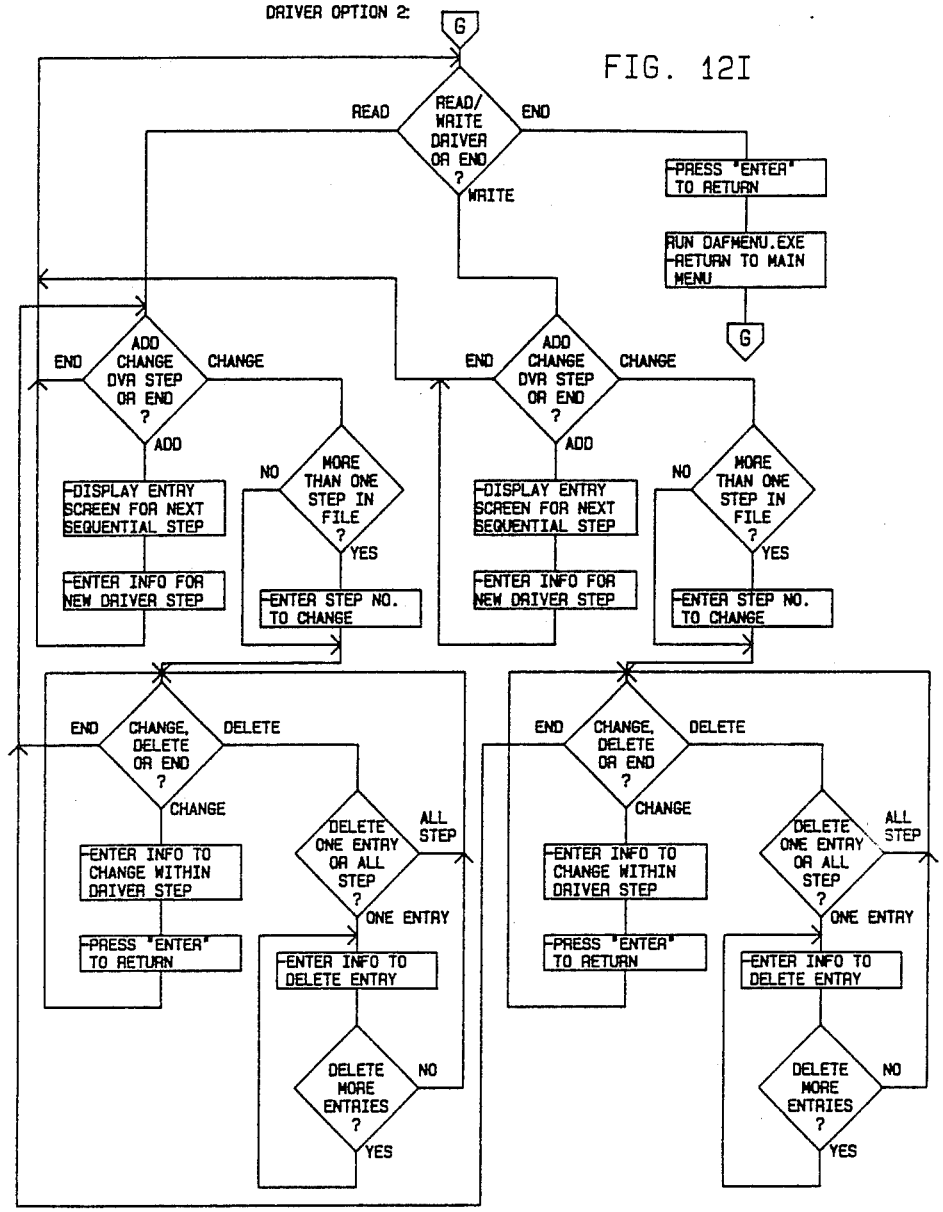
Figure 12J:
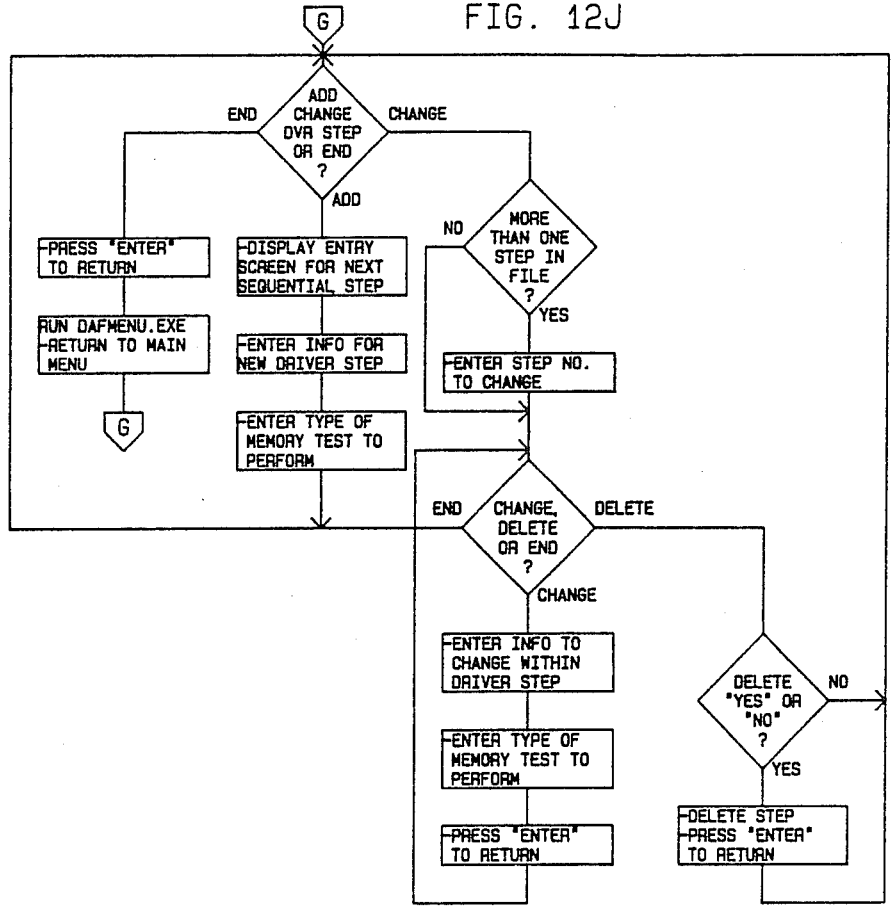
Figure 12K:
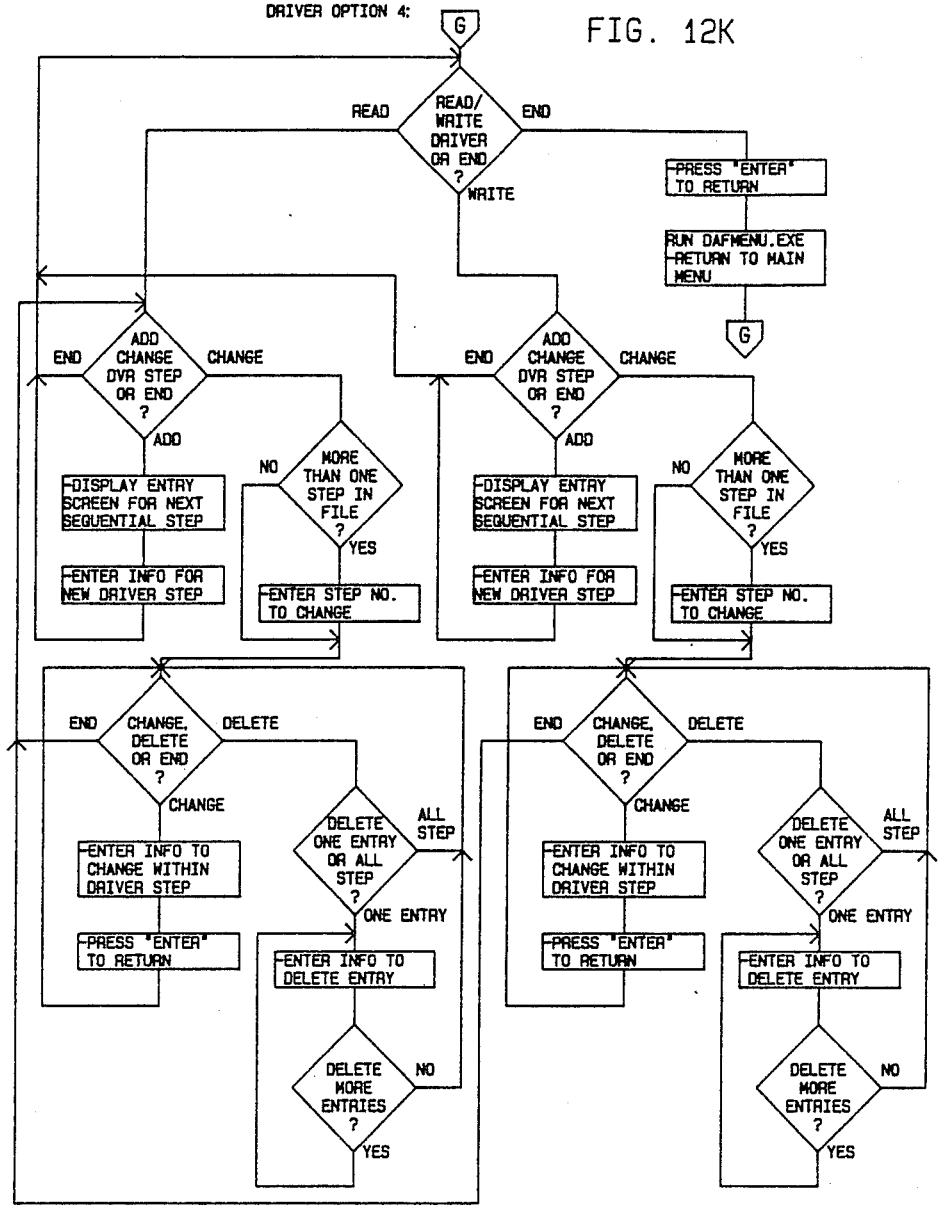
Figure 12L:
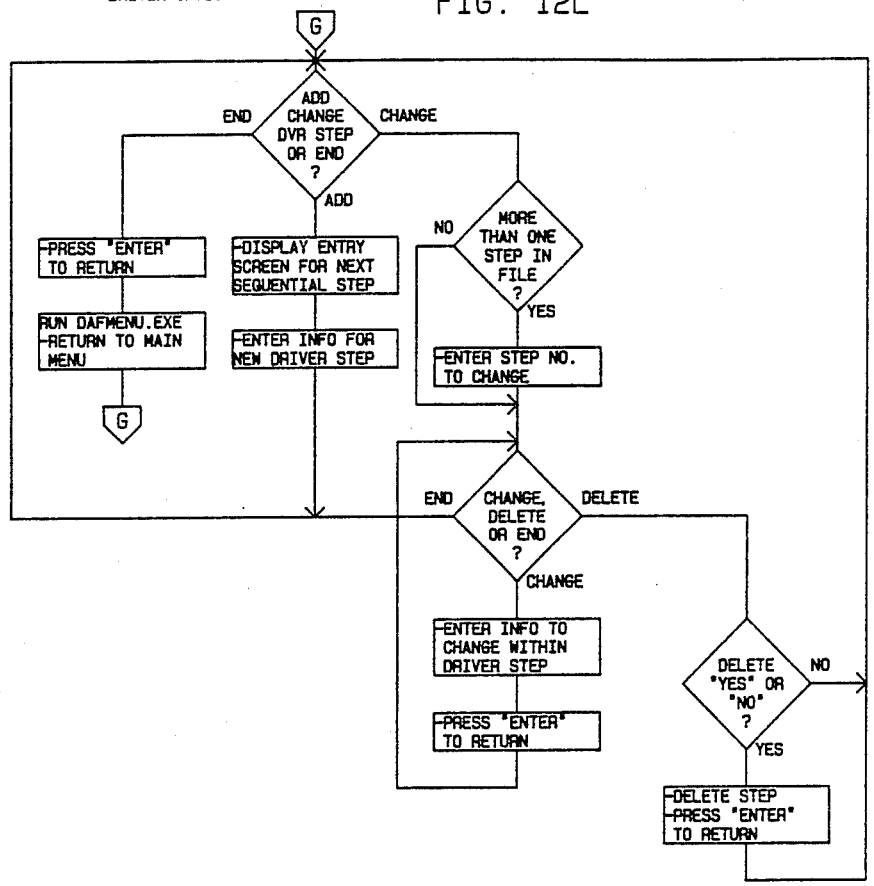
Figure 12M:
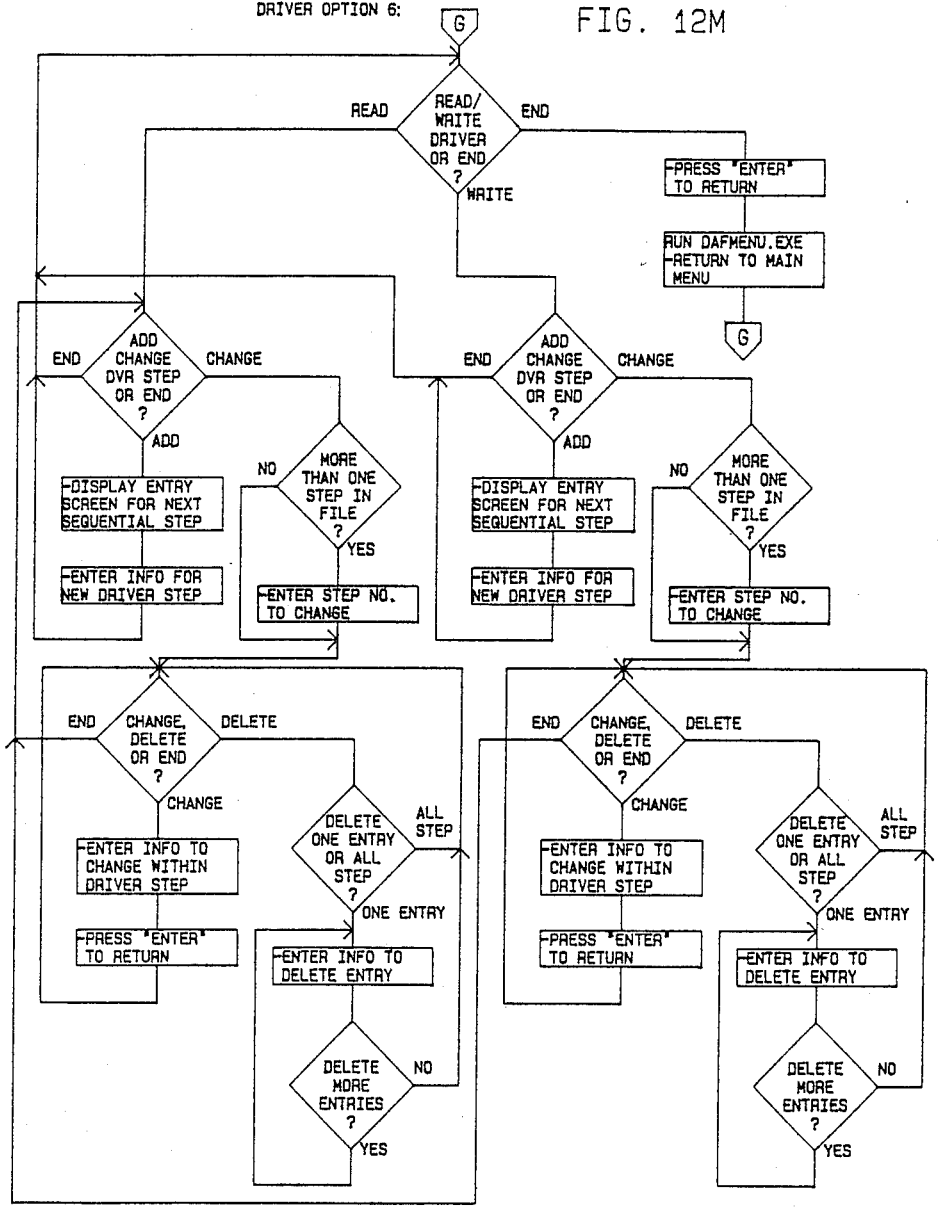
Figure 12N:
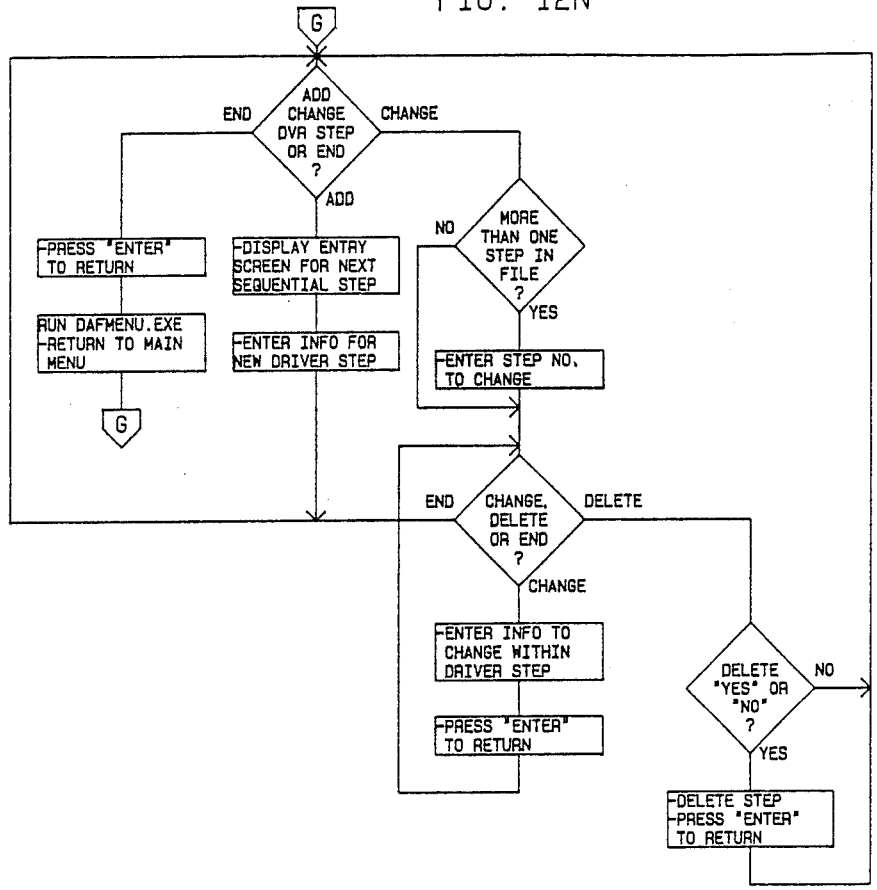
Figure 120:
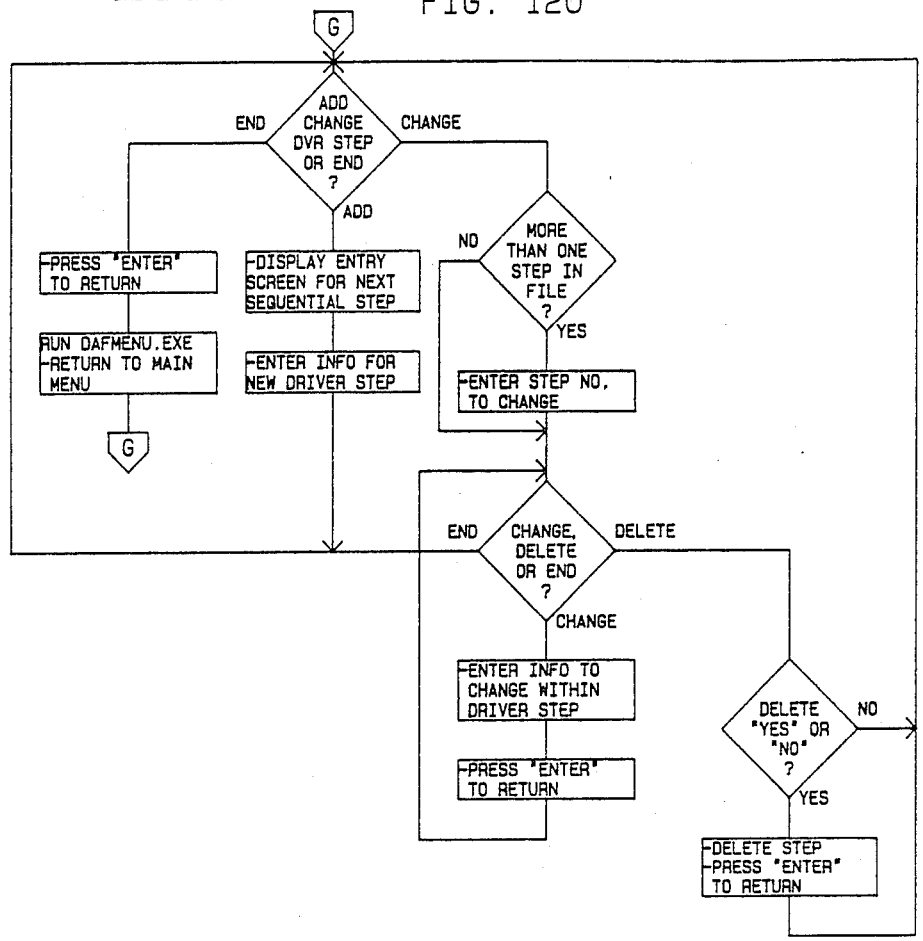
Figure 12P:
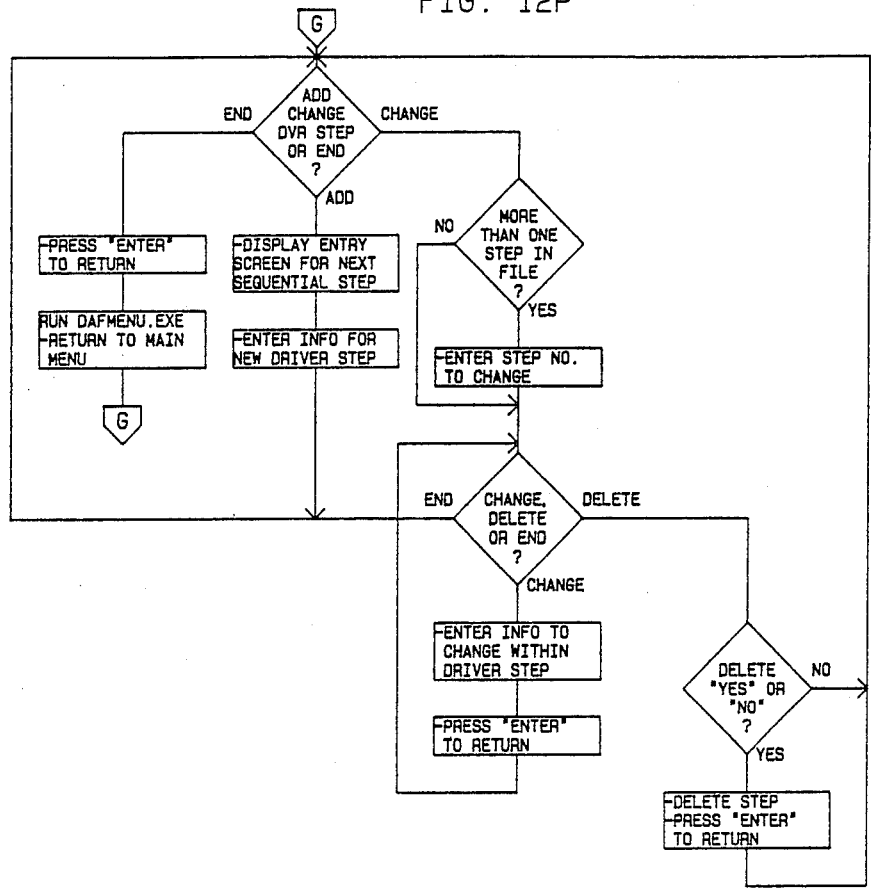
Figure 12Q:
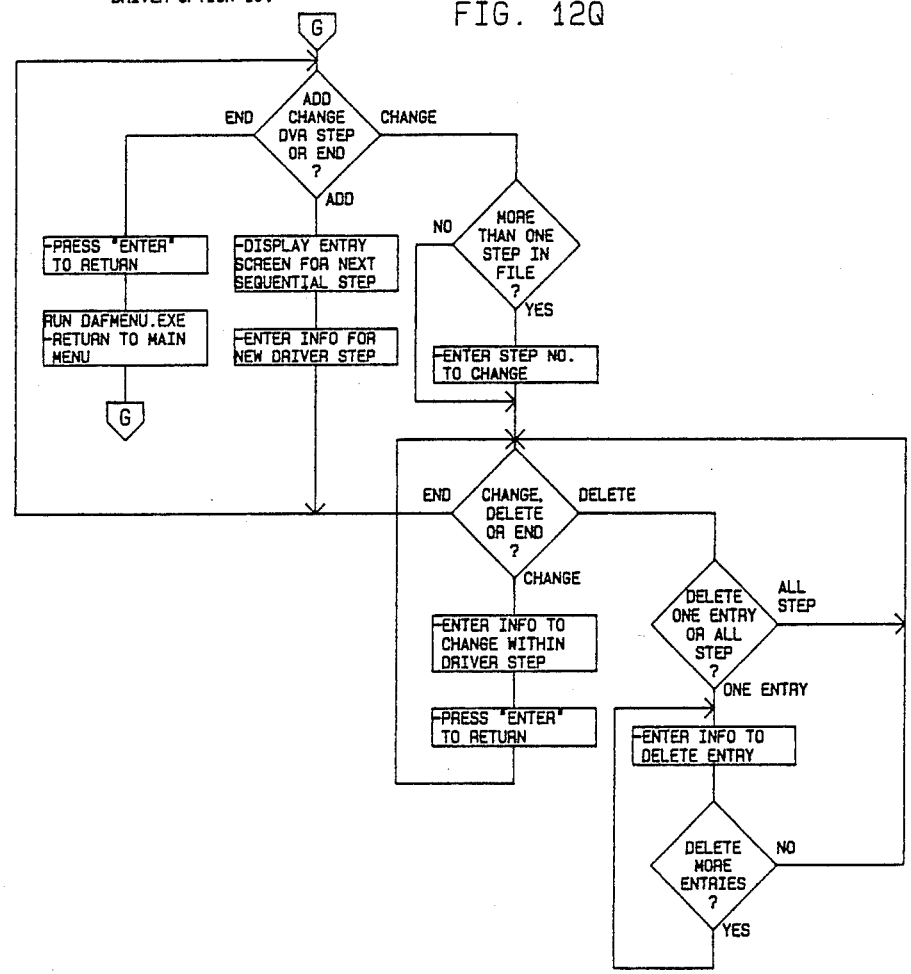
Figure 12R:
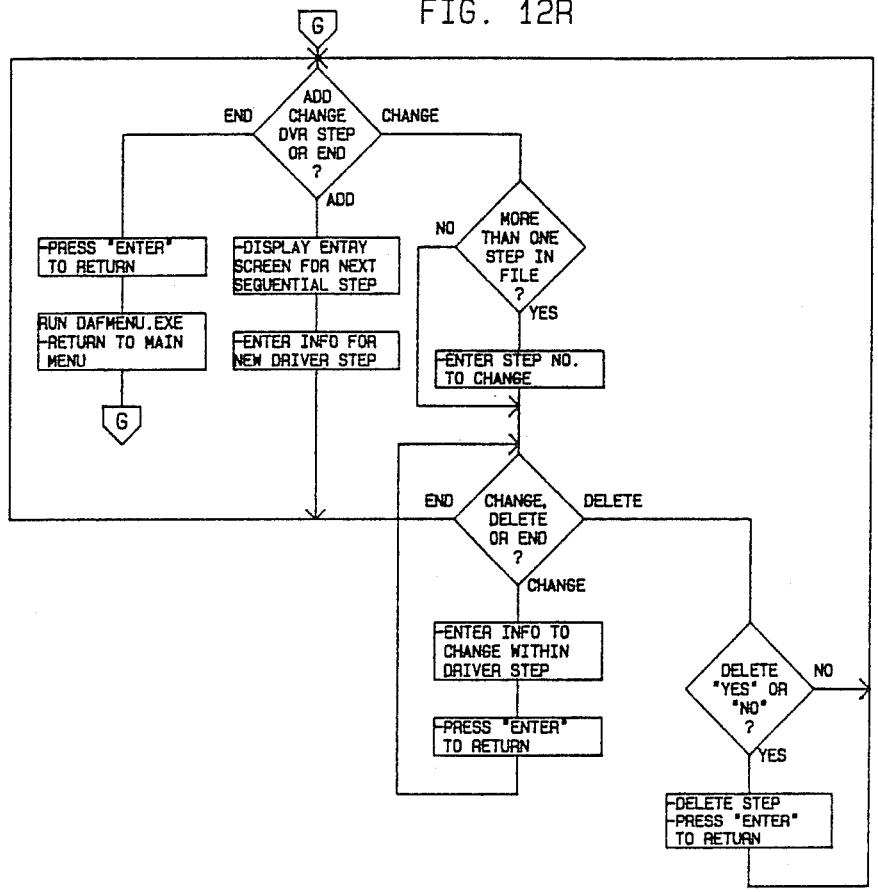
Figure 12S:
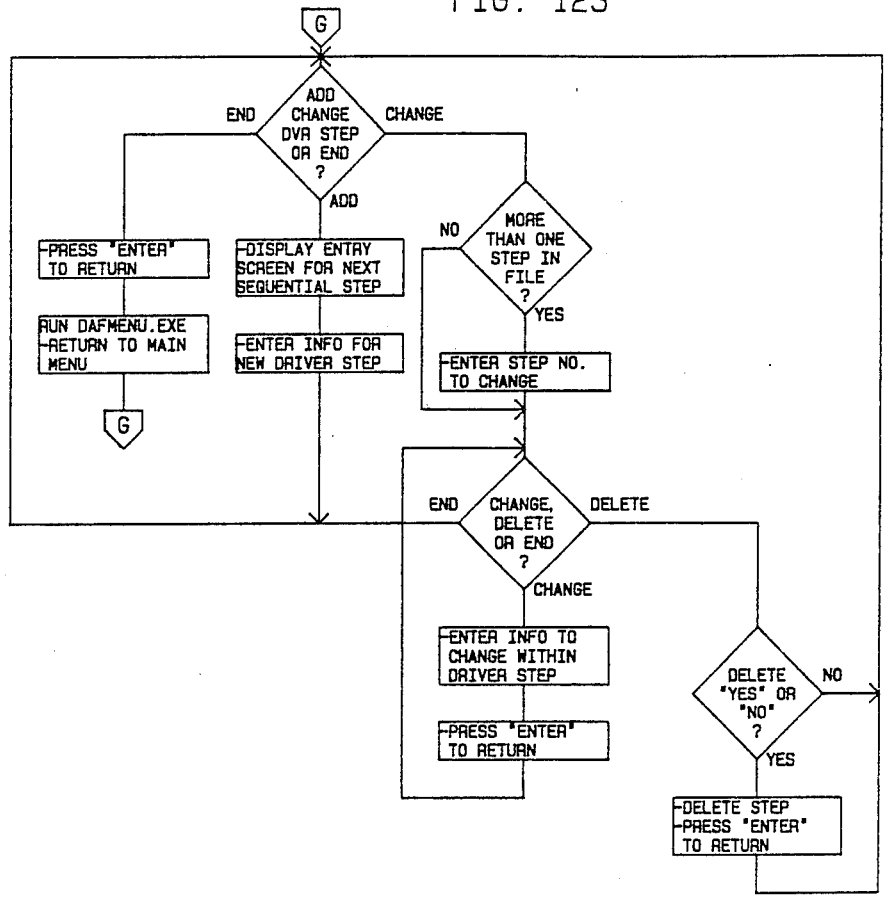
Figure 12T:
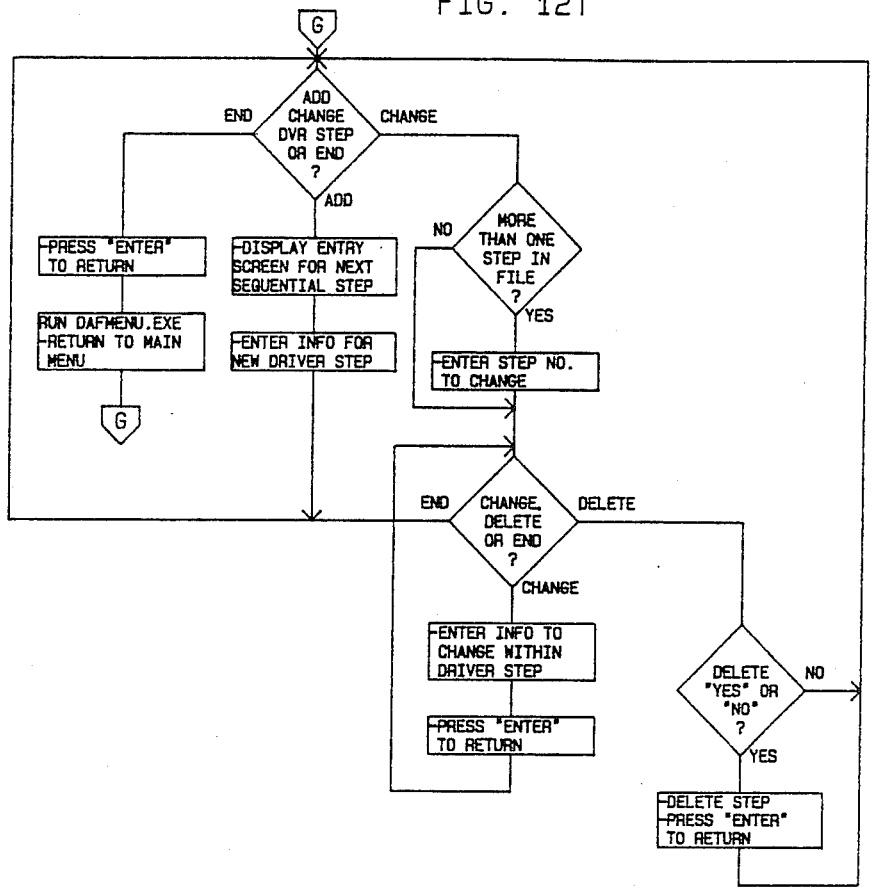
Figure 12U:
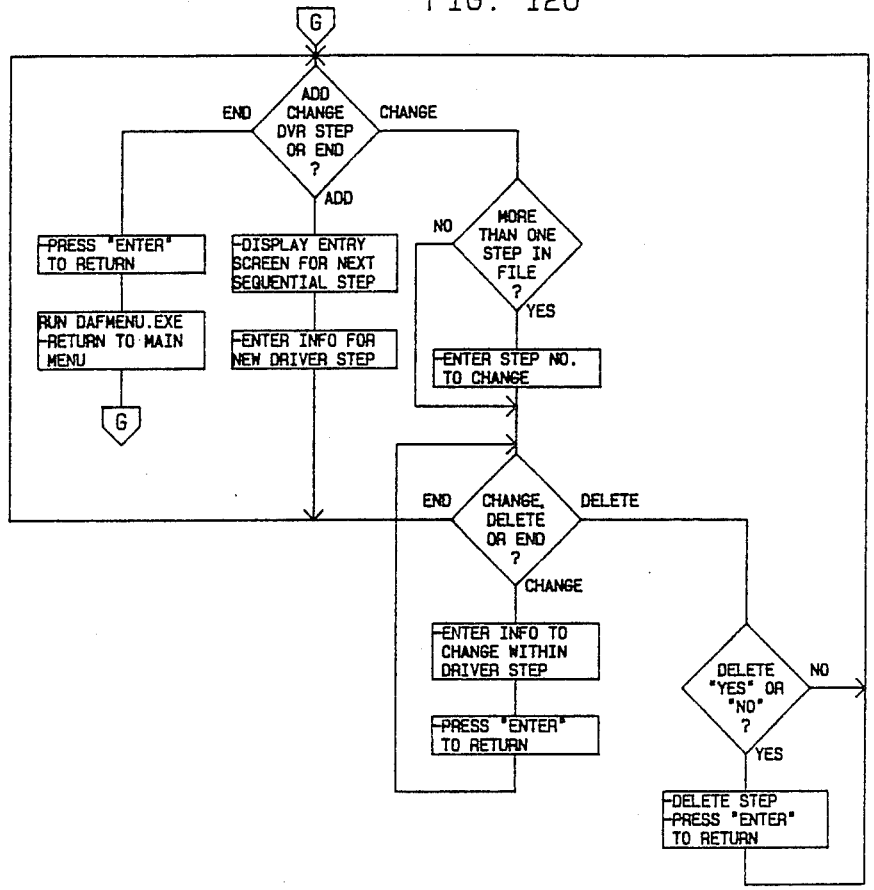
Figure 12V:
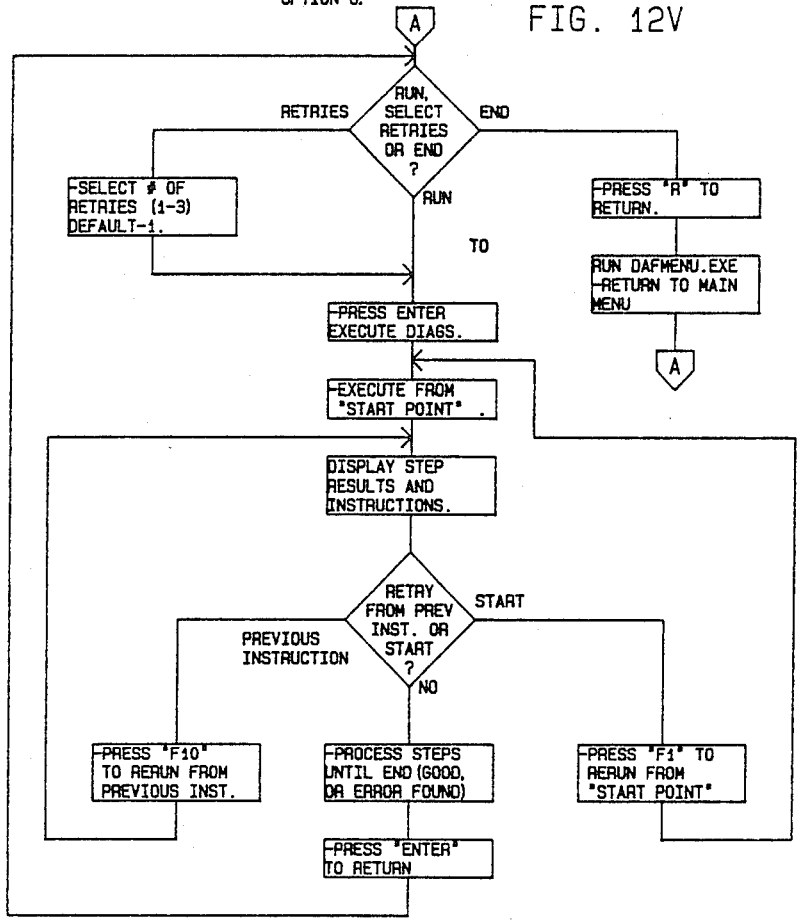
Figure 12W:
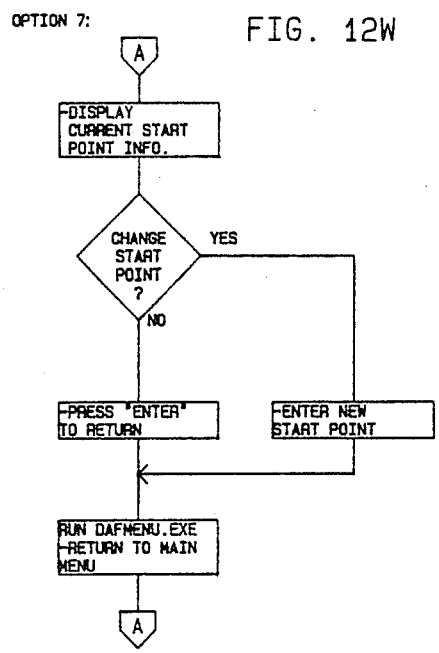
Figure 12Y:
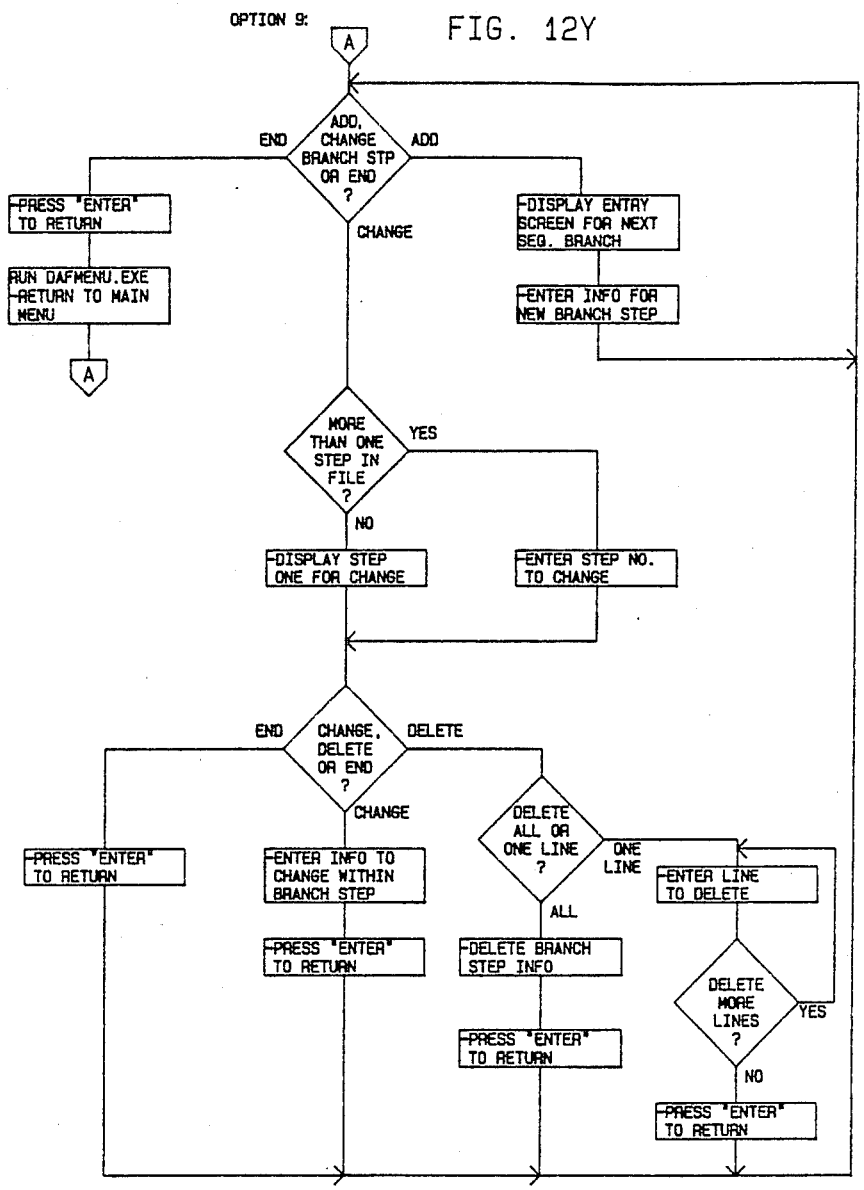
Figure 12Z:
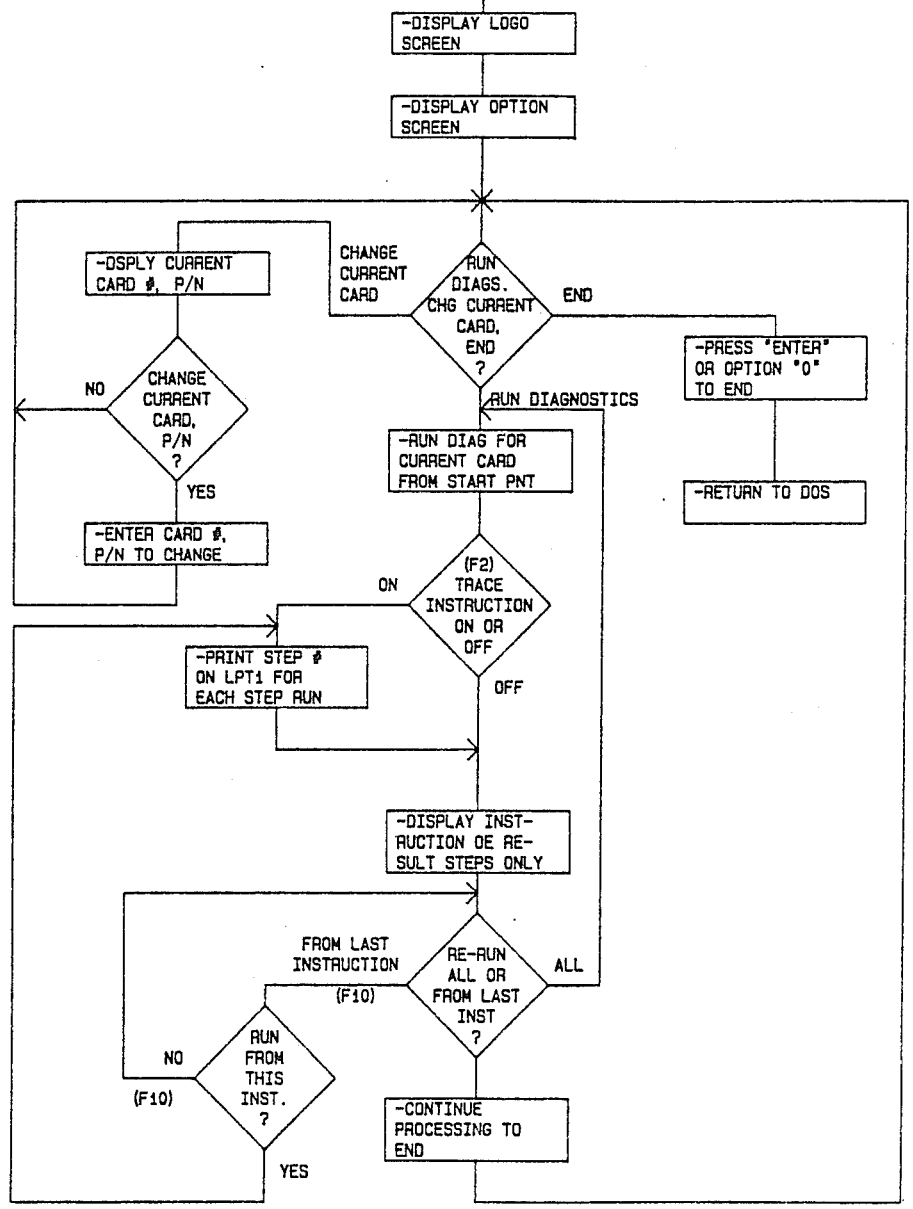

FIGS. 12A–12Z illustrate a logical flow for the Diagnostic Authoring Facility which is a program used by an operator to create various files which are referenced by the fault locating system in the testing of various boards and cards. In order to operate the Diagnostic Authoring Facility, the user must have a general description of the function of the board or card to be tested, and he must be aware of how the unit under test works to determine what type of signals should be received from each individual circuit of that unit. Also required is a logic diagram of every circuit on a board or card to serve as a guide for tracing data signals through the unit under test. The Diagnostic Authoring Facility or program shown in FIGS. 12A–12Z allows an operator to write diagnostic steps for various types of electronic cards. The program is menu driven and easily implemented to allow specialist personnel to write the diagnostic process for a particular card. However, once the diagnostic process has been written, a non-technical person can use it to easily find defective components on circuit cards and boards.

DIAGNOSTIC AUTHORING FACILITY (DAF)

This section describes the use of the Diagnostics Authoring Facility (DAF) shown in FIGS. 12A–Z of the drawings. The DAF is used in the writing process to create various files contained in the program used by the Testing Device 5, to test boards and cards.

A dual trace scope is helpful to verify waveforms. The writer should be aware of the type of data signal being dealt with, in order to program the analyzer unit.

Below is an illustration of the main menu display of the Diagnostic Authoring Facility shown in FIG. 12A.

| ISG DIAGNOSTICS AUTHORING FACILITY Current card - N P/N - N |
|---|
| [0] End session |
| [1] Create IC and connector list |
| [2] Add change diagnostic steps |
| [3] Review diagnostic steps |
| [4] Change IC or connector list |
| [5] Create/change a driver |
| [6] Run diagnostics |
| [7] Create/change start point |

| -continued ISG DIAGNOSTICS AUTHORING FACILITY Current card - N P/N - N |
|---|
| [8] Create/change instruction step |
| [9] Create/change branching instruction |
| [10] Change current card |
| Selection: N |

CURRENT CARD, refers to the number assigned to the Unit Under Test (UUT) 6. To create diagnostics the board or card must first have an assigned number. This number is for identification purposes and future reference.

P/N, stands for the number found on the UUT board or card or in the parts catalog.

SELECTION, is the menu item to be accessed. A number from 1–10 from the menu may be keyed in by the operator.

When a category is selected and entered, a monitor screen will appear with a fill-in-the-blank type format. This format enables the diagnostic writer to insert the required information, without having programming knowledge.

The first step in writing diagnostics is to create an IC and connector list by inserting the number 1 (OPT 1, FIG. 12A) in the space provided, then pressing ENTER on the keyboard 4.

The next monitor screen will appear with the following:

| NEW CARD INTEGRATED CIRCUIT LIST |
|---|
| Card Number: N |

The operator then locates the designated card number on the printed circuit sheet that accompanies the unit to be tested, or has been otherwise assigned, and inserts that number in the space provided, and presses ENTER.

Additional prompts will then appear on the monitor screen (FIG. 12B) one after the other, each time the requested information is keyed and ENTERED. Pressing ENTER again will write the data into the system. The monitor screen will appear as follows:

| NEW CARD INTEGRATED CIRCUIT LIST | | |
|---|---|---|
| Card Number: N | | |
| Card Name: N | | |
| EC level: N | | |
| Part number: N | | |
| INTEGRATED CIRCUIT PIN LIST | | |
| IC # | Label | # Pins |
| N | N | N |

The CARD NAME EC level and Part number can be found on the UUT printed circuit sheet.

The IC NUMBER, refers to the sequential number assigned to IC, beginning with one.

LABEL, refers to the alpha-numeric value stamped on the UUT, next to the IC. Label is all that is needed to identify an IC.

The NUMBER OF PINS, can be taken from the printed circuit or the Unit Under Test.

When the labels and pin lists have been entered, pressing ENTER, TWICE, will instruct the system that the IC and connector lists have been completed.

The next step in the Create IC and connector list process, is Connector Configuration. The following screen will appear after pressing ENTER twice, as stated in the previous step:

| CONNECTOR CONFIGURATION | | | |
|---|---|---|---|
| Con # | # Pins | First Block | Last Block |
| 1 | 16 | 0 | 1 |
| 2 | 20 | 2 | 4 |
| 3 | 20 | 5 | 7 |
| 4 | 40 | 8 | 12 |
| [A]dd, [C]hange, [D]elete, or press [Enter] | | | |

Con #, refers to the connectors on the Multiplex Card 13.

Pins, refers to the number of pins on the connector. (Visible on the multiplex card).

First Block, refers to the first set of eight pins (one byte), on the connector. The first block must begin with zero.

Last Block, is the last set of eight pins on the connector. If a connector has 16 pins, then the first block will be zero, while the last block will be listed as one. If a connector has 24 pins, the first block will be zero, the last block will be two, etc.

The connector configuration list automatically steps the values of the blocks, up one or more units, depending on the number of pins on a given connector. The author enters only the "first block" information and the system enters the "last block". The above monitor screen shows the stepping up process of connector configurations.

When connector configurations are completed, ENTER may be pressed twice to return to the main menu (FIG. 12A).

When writing diagnostics, the author may need to change the IC or connector lists.

To change an IC or connector list, ensure the current card number listed above the main menu matches the card number on which diagnostics are being written and enter "4" in the space next to "Selection" on the main menu and press ENTER.

The following monitor screen (see FIG. 12E) will now appear:

| CHANGE AN INTEGRATED CIRCUIT LIST | | | | | | | | | | |
|---|---|---|---|---|---|---|---|---|---|---|
| Card number N P/N N | | | | | | | | | | |
| IC | PINS | IC | PINS | IC | PINS | IC | PINS | IC | PINS | IC | PINS |
| N | N | N | N | N | N | N | N | N | N | N | N |
| [A]dd, [C]hange, [D]elete, or press [Enter] | | | | | | | | | | |

To change the IC pin counts, press (C), then ENTER. The following screen will appear:

| CHANGE AN INTEGRATED CIRCUIT LIST | | | | | | | | | | |
|---|---|---|---|---|---|---|---|---|---|---|
| Card number N P/N N | | | | | | | | | | |
| IC | PINS | IC | PINS | IC | PINS | IC | PINS | IC | PINS | IC | PINS |
| N | N | N | N | N | N | N | N | N | N | N | N |
| Change [P]art number or [I]C pin count ? _ | | | | | | | | | | |

Enter I, then press ENTER, to advance to the next monitor screen to make the changes.

| CHANGE AN INTEGRATED CIRCUIT LIST | | | | | | | | | | |
|---|---|---|---|---|---|---|---|---|---|---|
| Card number N P/N N | | | | | | | | | | |
| IC | PINS | IC | PINS | IC | PINS | IC | PINS | IC | PINS | IC | PINS |
| N | N | N | N | N | N | N | N | N | N | N | N |
| Change IC # N New label: N # Pins: N | | | | | | | | | | |

IC numbers automatically step to the next higher value. If the IC number in column one is 1, the next IC number will be two.

The diagnostic writer cannot change the actual IC number. This prompt is there to designate which pin information is to be changed, not the IC number itself. The IC number may be inserted and ENTERED.

Next, the label number may be keyed in the space provided and ENTERED.

The number of pins present on the IC which are to be changed may then be keyed and ENTERED.

The information is now inserted in the integrated circuit list. Ths connector configuration monitor screen will appear at this time. Should it be necessary to change any of this information, the prompts on the screen will specify the procedure.

The IC or connector lists can be accessed at any time by first, returning to the main menu, then selecting 4 and pressing ENTER.

To verify the output of a component on the Unit Under Test (UUT), the diagnotic writer will be required to set up a specific electronic condition on that unit. DRIVERS are used to set up the conditions on the UUT that allow a writer to capture a waveform, test some function, etc., to compare with the output signals of the components on the UUT.

To begin creating or changing a driver,

| ISG DIAGNOSTICS AUTHORING FACILITY |
|---|
| Current card - N P/N - N |
| [0] End session |
| [1] Create IC and connector list |
| [2] Add/change diagnostic steps |
| [3] Review diagnostic steps |
| [4] Change IC or connector list |
| ************************************ |
| [5] Create/change a driver |
| ************************************ |
| [6] Run diagnostics |
| [7] Create/change start point |
| [8] Create/change instruction step |
| [9] Create/change branching instruction |

-continued

| ISG DIAGNOSTICS AUTHORING FACILITY |
| --- |
| Current card - N P/N - N |
| [10] Change current card |
| Selection: 5 | enter "5" in the space provided next to the Selection prompt on the Main Menu (FIG. 12A) then press ENTER. The next monitor screen to appear will be the Create/change driver data file menu (see FIG. 12G).

| CREATE/CHANGE DRIVER DATA FILE |
| --- |
| [0] Return to main menu |
| [1] Write/read UUT RAM |
| [2] Write/read UUT I/O |
| [3] UUT Memory test |
| [4] Write/read DMA RAM |
| [5] DMA Request |
| [6] Write/read UUT registers |
| [7] Set watchdog timer |
| [8] Memory refresh control |
| [9] Wait for interrupt |
| [10] Subroutine |
| [11] Set delay clock |
| [12] Write/read LAB port |
| [13] Branch on I/O read |
| [14] Branch on RAM read |
| Selection: |

[0] Return to main menu.

[1] Write/read UUT RAM. Use this driver to write to any RAM or read from any ROM, that is accessible from the PC interface (FIG. 12H).

[2] Write/read UUT I/O, is a general write/read driver to the UUT itself. Use this function to write commands to the UUT and read the responses. This function is also used for reading and writing data into the UUT (FIG. 12I).

[3] UUT Memory test, has built in memory test patterns, used for the memory on UUT cards (FIG. 12J).

[4] Write/read DMA RAM, is used to initialize the DMA controller (FIG. 12K).

[5] DMA (dynamic memory access) Request, allows the writer to request a service for a particular memory address or DMA setup (FIG. 12L).

[6] Write/read UUT registers, is used to write registers for configuring the UUT and reading them back for checking purposes (FIG. 12M).

[7] Set watchdog timer, keeps the author from getting stuck in a particular routine. If certain events have not taken place within a specified time frame, time-out occurs. The watchdog timer has a minimum and maximum value of 1–120 and a default value equal to the last entered watchdog timer value (FIG. 12N).

[8] Memory refresh control, turns on DMA refresh to prevent a dynamic RAM from memory deterioration (FIG. 12O).

[9] Wait for interrupt, allows the diagnostic writer to set up an interrupt mask to permit the UUT to interrupt the Tester. This is the standard method of communication between the UUT and the Test Unit, and the PC and the Test Unit (FIG. 12P).

[10] Subroutine, is set up as a repetitive routine to keep from having to repeat the same test procedure, while writing diagnostics (FIG. 12Q).

[11] Set delay clock, establishes a delay between initial sync and the start point of the measurement. The set delay clock does not function on count and bus captures (FIG. 12R).

[12] Write/read LAB port, is used only for "mother boards". The LAB port communicates with the "grabber" card when the 8088 controlling IC is eliminated, to take control of the mother board (FIG. 12S).

[13] Branch on I/O read, is a 40 way branch based on an I/O read. There are 40 hex values and 40 possible steps (FIG. 12T).

[14] Branch on RAM read, is a 40 way branch based on a single RAM port address that needs to be read (FIG. 12U).

The following is a list of the drivers with their corresponding circuit, leg, and point values.

| DRIVER NAME | WRITE Cir/Leg/Pt | READ Cir/Leg/Pt |
| --- | --- | --- |
| Write/read UUT RAM | 00 10 xx | 00 11 xx |
| Write/read UUT I/O | 00 12 xx | 00 13 xx |
| UUT Memory test | | 00 14 xx |
| Write/read DMA RAM | 00 16 xx | 00 15 xx |
| Watchdog timer | | 00 17 xx |
| DMA request | | 00 18 xx |
| Memory refresh control | | 00 19 xx |
| Wait for UUT interrupt | | 00 20 xx |
| Write/read lab port | 00 22 xx | 00 21 xx |
| Write/read UUT registers | 00 23 xx | 00 24 xx |
| Delay clock | | 00 25 xx |
| Branch on I/O read | | 00 26 xx |
| Branch on RAM read | | 00 27 xx |
| Subroutine | | 00 40 xx |

(1) The circuit numbers will always be 00 for drivers.

(2) The leg numbers are assigned by the system, in sequential order depending on what has been previously established.

(3) The xx, refers to the point numbers. There can be up to 999, different points on a particular driver (00 25 001, 00 25 002, etc.). The diagnostic writer assigns these point numbers as needed.

(4) Note that some drivers have write and read categories, while others have only one. The drivers with only one category are not designated write or read, but labeled as drivers only.

The Set Delay Clock program operates the same for all UUTs. From the main menu (FIG. 12A) the Driver Data File is entered to display the following menu (FIG. 12G):

| CREATE/CHANGE DRIVER DATA FILE |
| --- |
| [0] Return to main menu |
| [1] Write/read UUT RAM |
| [2] Write/read UUT I/O |
| [3] UUT Memory test |
| [4] Write/read DMA RAM |
| [5] DMA Request |
| [6] Write/read UUT registers |
| [7] Set watchdog timer |
| [8] Memory refresh control |
| [9] Wait for interrupt |
| [10] Subroutine |
| [11] Set delay clock |
| [12] Write/read LAB port |
| [13] Branch on I/O read |
| [14] Branch on RAM read |
| Selection: 11 |

If "11" is entered in the space provided, the monitor screen will then advance to the subsection shown below (See FIG. 12R):

| DELAY CLOCK |
| --- |
| [0] Return to driver menu |
| [1] Create new driver |
| [2] Change existing driver |
| Selection: 1 |

To create a new delay clock driver insert 1, as shown above, then press ENTER.

The following monitor screen is divided into two sections. The bottom half of the screen, will appear only when the data selected is inserted in the appropriate spaces on the top half and ENTER is pressed. The screen will appear as follows:

| DELAY CLOCK NEW DRIVER | | | |
| --- | --- | --- | --- |
| Card number: N | Cir # | Leg # | Point # |
| This step: | 00 | 25 | N |
| Next step: | N | N | N |
| Source (I = Internal, E = External): | | | N |
| Multiplier (1 or 2): | | | N |

(1) The circuit number is assigned by the system software.
(2) The leg number is assigned by the system software.
(3) The point number is assigned by the system software.
(4) The diagnostic writer enters the "next step" information, depending on which direction he/she wishes to lead the diagnostic writing process.
(5) Source is the location of the delay clock timer, either the timer in the UUT (external), or the timer in the Testing Device (internal).
(6) Multiplier, refers to the length of time of the clock delay. (Either times one or times two).
   NOTE: Each pulse of the delay clock equates to one delay count. The internal delay count is equal to 1 microsecond times the delay count. The external delay count equates to: a number ($>0.25$ us $\times$ clock $\times$ divider). The external delay clock depends on the particular clock values of the UUT.
(7) When all information has been inserted, an ENTER will return the display to the data file menu.

To change a delay clock driver, enter the driver data file menu (FIG. 12G) and enter 11 next to the selection prompt, then press ENTER. The delay clock sub-menu (FIG. 12R) will appear. Enter a 2, then press ENTER. The following monitor screen will appear:

| DELAY CLOCK CHANGE DRIVER |
| --- |
| Card number: N |
| N DELAY CLOCK DRIVERS ON FILE |
| ENTER NUMBER OF DRIVER YOU WISH TO CHANGE: |

If the writer wishes to change an existing driver configuration, insert the selection number and press ENTER. The monitor screen will appear as follows:

| DELAY CLOCK CARD NUMBER N | | | |
| --- | --- | --- | --- |
| | Cir # | Leg # | Point # |
| This step: | 00 | 25 | N |
| [A] Next step: | N | N | N |
| [B] Source: | N | | |
| [C] Multiplier: | N | | |
| Enter [C]hange, [D]elete or press [Enter] | | | |

To change any data, enter [C], then press ENTER. The screen will appear requesting that the operator insert whichever letter (A, B, or C), that needs to be accessed and changed. When all changes have been made, press ENTER again, to return to the Driver Data File menu.

To delete any of the data written on the set delay clock driver, a [D] may be inserted and ENTERED next to the flashing prompt visible on the monitor screen shown above. One prompt will appear asking if the operator or author wishes to delete this step, (Y/N)?. If the step is to be deleted "Y" is pressed, the message DELETED will appear after a short interval, then the screen will return to the create/change delay clock driver monitor screen.

The WRITE/READ UUT RAM function of the Driver Data File is used only if the UUT has memory capabilities.

Access the Driver Data File menu (FIG. 12G), select 1, then press ENTER. The following monitor screen will appear (FIG. 12H):

| CREATE/CHANGE DRIVER DATA FILE |
| --- |
| [0] Return to driver menu |
| [1] Write to UUT RAM |
| [2] Read from UUT RAM |
| Selection: N |

To write to the UUT RAM insert 1 in the space provided, then press ENTER.

The next monitor screen to appear will be separated into three parts. The data desired to be written to the UUT RAM may be keyed in and ENTERED, after inserting the pertinent information to advance to the next portion of the screen. When the data has been entered, the monitor screen will appear as follows:

| WRITE TO UUT RAM NEW DRIVER | | | |
| --- | --- | --- | --- |
| Card number: N | Cir # | Leg # | Point # |
| This step: | 00 | 10 | NNN |
| Next step: | NN | NN | NNN |
| Starting address (hex): N | | | |
| Byte # | | Hex data | |
| N | | NN | |

(1) After choosing the point to start writing to the UUT RAM, the leg and point numbers may be inserted in the appropriate spaces under Next Step, and ENTERED.
(2) The starting address can be found in the Technical Reference Manual for the PC. The address may be inserted and ENTERED.
(3) The byte numbers start with one and increase sequentially up to 208. As many bytes within these parameters as is necessary may be entered to test the circuit.

(4) With the byte number showing, the Hex data selection space will be flashing and the appropriate data should be keyed and ENTERED.

(5) The Hex data entries may be entered as each byte advances automatically, until the information is complete. Then with the Hex data request for information space blank, press ENTER again, to complete the write to RAM driver data.

To READ the data written on the driver, return to the driver data file menu (FIG. 12G), then select 1, and press ENTER. The following monitor screen will appear (FIG. 12H):

| CREATE/CHANGE A DRIVER DATA FILE |
| --- |
| [0] Return to driver menu |
| [1] Write to UUT RAM |
| [2] Read from UUT RAM |
| Selection: N |

To read from the UUT RAM, insert 2, in the space provided, then press ENTER. The next monitor screen will appear as follows:

| READ FROM UUT RAM |
| --- |
| [0] Create new driver |
| [1] Change existing driver |
| [2] Return to driver menu |
| Selection: N |

To read the driver that has been written, select 2, then press ENTER.

If there is only one driver written, the following monitor screen will appear:

| READ FROM UUT RAM NEW DRIVER | | | |
| --- | --- | --- | --- |
| Card number: N | Cir # | Leg # | Point # |
| This step: | 00 | 11 | NNN |
| Next step if ok: | NN | NN | NNN |
| Next step if bad: | NN | NN | NNN |
| Starting address (hex): N | | | |
| Byte # | | Hex data | |
| N | | NN | |

Press ENTER, to advance to the next screen.

If no changes are to be made to the previous screen, an ENTER key will produce the following screen.

| READ FROM UUT RAM - CARDNUMBER N | | | |
| --- | --- | --- | --- |
| | Cir # | Leg # | Point # |
| This step: | 00 | 11 | N |
| [A] Next step if ok: | NN | N | N |
| [B] Next step if bad: | NN | N | N |
| [C] Start address: | N | | |
| 1 2 3 4 5 6 7 8 9 10 11 12 13 14 15 16 17 18 | | | |
| [D] NN | | | |
| Type [A]dd, [C]hange, [D]elete or press [Enter] | | | |

This screen shows a listing of all data written for this driver. From this screen more data can be added without returning to the monitor screen.

To ADD changes to this driver insert an "A" next to the flashing prompt, then press ENTER. The byte # and hex data prompts will appear at the bottom of the screen. As more hex data is entered, the byte number will increase automatically. Press ENTER after each data insertion until all additional information has been logged.

To CHANGE existing data in this driver insert a "C" next to the flashing prompt, then press ENTER. The screen will then appear with prompt "ENTER ROW AND COLUMN TO CHANGE". The row refers to A, B, or C. The column refers to the hex data numbers 1 through 18, shown at the bottom of the above screen. When the row and column numbers have been entered press ENTER. The next prompt will appear with the prompt "CHANGE NN TO NN:". Enter the appropriate data under these prompts pressing ENTER after each insertion, until all data has been entered.

To DELETE a data entry insert a "D" next to the flashing prompt, then press ENTER. The message "ENTER[ALL] OR LINE +COLUMN OF BYTE TO DELETE:" will appear. Enter the data to be deleted.

If there was more than one driver written, before reaching the READ FROM UUT RAM monitor screen, the following screen would have appeared first:

| READ FROM UUT RAM CHANGE DRIVER |
| --- |
| Card number: N |
| N READ FROM UUT RAM DRIVERS ON FILE |
| ENTER NUMBER OF DRIVER |
| YOU WISH TO CHANGE: N |

Here the card number for which diagnostics are being written and the number of existing drivers will be displayed. Insert the number of the driver to be read, then press ENTER. The screen preceding the above screen will then be redisplayed.

The WRITE/read UUT I/O driver is used to batch load data and to initialize the UUT.

Since I/O write/read is addressed the same way as memory, the way to distinguish between memory and I/O is with the drive command that is given. First, access the Driver Data File (FIG. 12G) and select item 2 and press ENTER. The monitor screen will appear as follows (FIG. 12I):

| CREATE/CHANGE DRIVER DATA FILE |
| --- |
| [0] Return to driver menu |
| [1] Write to UUT I/O |
| [2] Read from UUT I/O |
| Selection: N |

To enter the write screens, insert a 1 in the space provided and press ENTER. The following monitor screen will appear:

| WRITE TO UUT I/O |
| --- |
| [0] Return to driver menu |
| [1] Create new driver |
| [2] Change existing driver |
| Selection: N |

To create or add a new Write to UUT I/O driver insert a 1 in the space provided and press ENTER.

If there is already at least one Write to UUT I/O driver written, the following screen will appear:

| WRITE TO UUT I/O |
| --- |
| CHANGE DRIVER |
| Card number: N |
| N WRITE TO UUT I/O DRIVERS ON FILE |
| ENTER NUMBER OF DRIVER YOU WISH TO |
| CHANGE: N |

Fill in the appropriate information in the spaces provided and press ENTER. The next screen to appear will be divided into 4 sections. Fill in the information pressing ENTER, as needed.

| WRITE TO UUT I/O NEW DRIVER | | | |
| --- | --- | --- | --- |
| Card Number: N | Cir # | Leg # | Point # |
| This step: | 00 | 12 | NNN |
| Next step if ok: | NN | NN | NNN |
| Next step if bad: | NN | NN | NNN |
| Next if bad status: | NN | NN | NNN |
| Initial status data (hex): NN  Secondary status data(hex): NN | | | |
| Maximum status count: NN | | | |
| Starting address(hex): NN  Read status address (hex): NN | | | |
| INTERUPTS (1=ON/0—OFF): NMI  2  3  4  5  6  7 | | | |
| PRE I/O                    N  N  N  N  N  N | | | |
| POST I/O                   N  N  N  N  N  N | | | |
| Byte #                    Hex data | | | |
| N                         NN | | | |

(1) INITIAL STATUS DATA is used here because some I/O devices respond with status, when a command is given.
(2) SECONDARY STATUS DATA refers to the status presented at the end of the command.
(3) MAXIMUM STATUS COUNT tells the system how many times to read the status. If the status does not match within these parameters, the count is exceeded.
(4) INTERRUPTS are the standard interrupts the PC transmits. The NMI, non-masking interrupt, is the parity checker. The other interrupts are either on or off.
(5) PRE I/O represents the interrupts occurring before the write to UUT I/O process.
(6) POST I/O are the interrupts occurring after the process, when data is going out from the PC to the Testing Device, then to the I/O.
(7) BYTE # starts with one and the system numbers them sequentially, until all hex data for this driver have been entered.
(8) HEX DATA is data to write to the address selected under the starting address.

The final monitor screen to be used during the write to UUT I/O process, will contain all the information shown above plus a listing of all the bytes of data previously entered. This will give the writer an overall view of the write to UUT I/O data and any additions, changes, or deletions can be made from this single monitor screen. To access this screen, return to the write to UUT I/O menu screen and select a 2, then press ENTER.

When all data the writer wishes to include has been inserted on this screen press ENTER, twice, to return to the create/change driver data file screen.

| CREATE/CHANGE DRIVER DATA FILE |
| --- |
| [0] Return to driver menu |
| [1] Write to UUT I/O |
| [2] Read from UUT I/O |
| Selection: N |

To read from the UUT I/O, insert a 2 in the space provided and press ENTER.

To read from the UUT I/O registers insert the desired selection as shown on the following screen:

| READ FROM UUT I/O |
| --- |
| [1] Create new driver |
| [2] Change existing driver |
| [3] Return to driver menu |
| Selection: N |

To create a read from UUT I/O driver insert a 1 in the space provided and press ENTER.

| READ FROM UUT I/O NEW DRIVER | | | |
| --- | --- | --- | --- |
| Card number: N | Cir # | Leg # | Point # |
| This step: | 00 | 13 | NNN |
| Next step if ok: | NN | NN | NNN |
| Next step if bad: | NN | NN | NNN |
| Initial status data (hex): N  Secondary status data(hex): NN | | | |
| Maximum status count: N | | | |
| Starting address (hex): N  Read status address (hex): NN | | | |
| INTERRUPTS       NMI  2  3  4  5  6  7 | | | |
| (1=ON/0=OFF): | | | |
| PRE I/O           0   N  N  N  N  N  N | | | |
| POST I/O          0   N  N  N  N  N  N | | | |
| Byte #           Hex data | | | |
|                     NN | | | |

The predetermined data may be read from the UUT I/O and compared it to the hex data expected. If the data does not compare, advance to the next "if bad" step.

Press ENTER when the data list is complete to return to the read from UUT I/O screen. Select a 2, to have the information displayed in a different form on the next monitor screen. From that screen the writer can add, change or delete the desired data.

The Memory Test Function applies to any card with memory cpabilities. Enter the Main Menu (FIG. 12A), select 5, and press ENTER. When the Driver Data File appears (FIG. 12G), select 3, then press ENTER. The following monitor screen will appear (FIG. 12J):

| MEMORY TEST FUNCTION |
| --- |
| [1] Create new driver |
| [2] Change existing driver |
| [3] Return to driver menu |
| Selection: N |

To create a new UUT Memory Test driver, insert a 1 in the space provided and press ENTER. The following monitor screen will appear:

| UUT MEMORY TEST NEW DRIVER | | | |
|---|---|---|---|
| Card number: N | Cir # | Leg # | Point # |
| This step: | 00 | 14 | NNN |
| Next step if ok: | NN | NN | NNN |
| Next step if bad: | NN | NN | NNN |
| Starting addr (hex): NN | Number of bytes(1 Meg max): NN | | |

The Leg number will always be "14" for this card. Insert the start address and the number of bytes to be tested and press ENTER, then continue with the next monitor screen.

| TYPE OF MEMORY TEST |
|---|
| 1  Write and compare 55 low to high, then write and compare AA low to high, then write and compare 54, low to high to reverse parity. |
| 2  Write and compare 55AA low to high, then write and compare AA55 low to high, then write and compare 54AB low to high. |
| 3  Same as type 1 above, except author specifies the two test bytes to use in place of 55 and AA. Parity reversed on last pass. |
| 4  Same as type 2 above, except author specifies the two test bytes to use in place of 55AA. Both bytes are flipped on the last pass. |
| 5  Writes 55 to all positions, low to high, then from low to high compares for 55 and if correct writes AA to each position. Then from high to low, compares for AA and writes 57 if correct. |
| 6  Normally used to clear screen. Writes two author chosen bytes to adjacent positions throughout specified memory and exits. |
| Selection: N    First byte(hex): NN    Second byte(hex): NN |

The above monitor screen shows the pre-written test used in writing diagnostics for the UUT Memory Test.

As an example, in selection 1 above, the 55 represents 4 bits, as does AA. These are used to write then read the bits specified. (4 bits on, 4, bits off). The 54 represents the parity bit and is used to test the parity bit.

In selection 3, the 55 and AA, are used as a default.

Select the first and second bytes to be tested then press ENTER.

The monitor screen will appear as above with the addition of the bit number below the first byte selection (assigned by the system), and the IC number prompt beside the bit number. Enter the proper IC number in the space that is associated with a failure of the indicated bit, then press ENTER.

If the author needs to change or delete any data on the UUT Memory Test function, the Memory Test function screen (FIG. 12J) may be recalled, selected item 2, and press ENTER. The following screen will appear:

| MEMORY TEST - CARDNUMBER N | | | |
|---|---|---|---|
|  | Cir # | Leg # | Point # |
| This step: | 00 | 14 | NNN |
| [A] Next step if ok: | 00 | NN | NNN |
| [B] Next step if bad: | 00 | NN | NNN |
| [C] Starting addr: N | Number bytes: NNN | | |
| [D] Type test: N | | | |
| [E] First byte: NN | Second byte: NN | | |
| Bit #   0   1   2   3   4   5   6   7 | | | |
| [F] I/C #   N   N   N   N   N   N   N   N | | | |

-continued

| MEMORY TEST - CARDNUMBER N |
|---|
| Enter [C]hange, [D]elete, or press [Enter] |

If any of the information on the above screen needs to be changed, the prompt ENTER LINE TO CHANGE OR PRESS ENTER, will appear. Enter the appropriate letter (A–F), then press ENTER. The screen will then prompt with, as an example, NEXT CIR:, NEXT LEG:, NEXT POINT:. Insert the information to be changed, and press ENTER after each change.

If it is desired to DELETE any of the information, enter [D] in the space provided, then press ENTER. The next prompt to appear will ask DELETE THIS STEP (Y/N)?. Insert the necessary answer and press ENTER.

DMA (direct memory access) is used for transferring blocks of data from one place in memory to another or between an I/O device and memory. RAM (random access memory) is programmable, volatile memory, that can be written to or read from.

The WRITE/READ DMA RAM driver is used for the block transfer of data on the interface card of the Data Capture Device 5.

To create a write/read driver, access the driver data file (FIG. 12G) and insert a "4" in the space provided, then press ENTER. The following monitor screen will appear (FIG. 12K):

| CREATE/CHANGE DRIVER DATA FILE |
|---|
| [0] Return to driver menu |
| [1] Write to DMA RAM |
| [2] Read from DMA RAM |
| Selection: N |

To create a new write to DMA RAM driver insert a "1" in the space provided, then press ENTER. The following monitor screen will appear:

| WRITE TO DMA RAM |
|---|
| [0] Return to DMA RAM menu |
| [1] Create new driver |
| [2] Change existing driver |
| Selection: N |

To create a new write to DMA RAM driver insert a "1" in the space provided, then press ENTER.

The next screen to appear will be divided into 3 sections as follows:

| WRITE TO DMA RAM NEW DRIVER | | | |
|---|---|---|---|
| Card number: N | Cir # | Leg # | Point # |
| This step: | 00 | 16 | NNN |
| Next step: | NN | NN | NNN |
| DMA RAM address (0–7FF): N | | | |
| Byte # | Hex data | | |
| 1 | NN | | |

(1) "This step": The writer cannot control. The system controls.

(A) The circuit number will always be 00 for a driver.

(B) The leg number will always be 16 for the driver.
(C) The point number will start with one and the system will increment up from there.
(2) "Next step": Can be assigned entirely by the writer.
(A) The circuit can be any other step.
(B) Assign the leg number depending on where the diagnostics is to advance.
(C) Assign the point number in accordance with the leg number.
(3) "DMA RAM address (0–7FF)":
(A) 0–7FF, represents the low and high limits of the possible addresses the writer can assign.
(4) "Byte #":
(A) The byte number will always begin with 1. As date is entered, the byte will advance to 2, etc., until all data is entered.
(B) Select the appropriate hex data, pressing ENTER after each entry.

After all the hex data has been entered, press ENTER once more to return to the write to DMA RAM screen (FIG. 12K). From this monitor screen the writer can make changes to the write to DMA RAM data. To review the data all at once, or to make changes, select a 2, then press ENTER. The following monitor screen will appear:

| WRITE TO DMA RAM - CARDNUMBER N | | | |
|---|---|---|---|
| | Cir # | Leg # | Point # |
| [A] This step: | 00 | 16 | NNN |
| Next step: | NN | NN | NNN |
| [B] DMA RAM address: N | | | |
| 1 2 3 4 5 6 7 8 9 10 11 12 13 14 15 16 17 18 | | | |
| [C] N | | | |
| Type [A]dd, [C]hange, [D]elete or press [Enter] | | | |

(1) Additions: The prompt BYTE # HEX DATA, will appear at the bottom of the screen. Add any needed data next to the hex data flashing prompt, pressing ENTER after each insertion.
(2) Changes: The prompt ENTER ROW AND COLUMN TO CHANGE, will appear at the bottom of the screen. Enter the row (A,B, or C), along with the column number (1–18), to make the changes. The system will then ask for NEXT:CIR, LEG AND POINT NUMBERS, if [A] is selected, for instance. Insert the appropriate data pressing ENTER after each entry.
(3) Deletions: Type in a "D" next to the flashing prompt. The prompt ENTER [ALL] OR LINE AND COLUMN OF BYTE TO DELETE, will appear. Insert the data to be deleted, then press ENTER.

Pressing ENTER, TWICE, here will return the display to the create/change DMA RAM driver data file (FIG. 12K).

| READ FROM DMA RAM |
|---|
| [0] Return to DMA RAM menu |
| [1] Create new driver |
| [2] Change existing driver |
| Selection: N |

To create a new read drive insert a 1 in the space provided, then press ENTER.

The next screen to appear will be divided into three sections. Fill in the appropriate date pressing ENTER after each entry, to advance to next screen segment.

| READ FROM DMA RAM NEW DRIVER | | | |
|---|---|---|---|
| Card number: N | Cir # | Leg # | Point # |
| This step: | 00 | 15 | NNN |
| Next step if ok: | NN | NN | NNN |
| Next step if bad: | NN | NN | NNN |
| DMA RAM address (0–7FF): | NNN | | |
| Byte # | | Hex data | |
| 1 | | NN | |

(1) "This step":
(A) The circuit number will always be 00 for a driver.
(B) The leg number will always be 15 for a read from DMA RAM driver.
(C) The point number will start with 1 and increment up from there.
(2) "Next step is ok": The writer assigns all circuit, legs, and points. This is the next logical step in diagnostics if the read compares successfully.
(3) "Next step if bad": This is the next logical step in diagnostics if the read does not compare successfully.
(4) "Hex data": The data used to compare wih the read data.
NOTE: The writer should either refer to notes taken when the data was written, or exit this screen and return to the write DMA RAM driver screen, to recall what the expected hex data should be.

After all the hex data has been entered press ENTER once more, to return to the read from DMA RAM screen. From this screen make changes to read from DMA RAM data. To review the data all at once, or to make changes, deletions, or additions, select a 2 and press ENTER. The following screen will appear:

| READ FROM DMA RAM CARDNUMBER - N | | | |
|---|---|---|---|
| | Cir # | Leg # | Point # |
| This step: | 00 | 15 | 001 |
| [A] Next step if ok: | NN | NN | NNN |
| [B] Next step if bad: | NN | NN | NNN |
| [C] DMA RAM address: N | | | |
| 1 2 3 4 5 6 7 8 9 10 11 12 13 14 15 16 17 18 | | | |
| [D] N | | | |
| Type [A]dd, [C]hange, [D]elete or press [Enter] | | | |

Make any changes, additions, or deletions by choosing one of the prompts shown at the bottom of the above screen. When the changes have been entered, press ENTER again, to exit the read DMA RAM driver file.

The DMA Request performs the PC host function that initializes a channel in the DMA controller. The DMA controller can be "set up only", or the system can suspend until the DMA Request completes.

To access the DMA Request enter the driver data file (FIG. 12G), then select a 5 and press ENTER. The following monitor screen will appear (FIG. 12L):

| DMA REQUEST FUNCTION |
| --- |
| [0] Return to driver menu |
| [1] Create new driver |
| [2] Change existing driver |
| Selection: N |

To create a new DMA Request driver insert a 1 in the space provided and press ENTER. The next monitor screen will appear as follows:

| DMA REQUEST NEW DRIVER | | | | |
| --- | --- | --- | --- | --- |
| Card number: | N | Cir # | Leg # | Point # |
| This step: | | 00 | 18 | NNN |
| Next step if ok | | NN | NN | NNN |
| Next step if bad | | NN | NN | NNN |
| DMA Channel number: | N | Number of bytes (1-1247): | | N |
| DMA RAM address (hex): | N | | | |

Under "This step" the circuit number will always be 00 for this driver. The "Leg number" will always be 18 for DMA Request.

The writer assigns all other data under the "if ok" and "if bad" steps.

As this information is entered, press ENTER, after each entry, to advance to the bottom half of the screen.

The DMA Channel number will be either 1, 2, or 3.

Enter the DMA RAM address and the number of bytes and press ENTER, to advance to the next screen.

| TYPE OF DMA REQUEST | |
| --- | --- |
| 0 Read DMA registers | |
| 1 DMA write (device to memory), set up only. Used for data capture | |
| 2 DMA read (memory to device), set up only. Used for data capture | |
| 3 DMA write, set up and enable. (device to memory) | |
| 4 DMA read, set up and enable. (memory to device) | |
| 5 Disable pending DMA. | |
| Selection: N | DMA Channel Number: N |
| DMA RAM address (HEX): NN | Number of bytes (1-2030): NNNN |

The above screen shows the DMA request sub-function codes. Select the appropriate function, then press ENTER.

(A) "Set up only is used when a data capture sequence is required and the DMA activity is a stimulus to the data capture. In this mode, the DMA controller is initialized with the control data (address, byte counts, etc.), but the channel interrupts are not enabled. Enabling of the channel interrupts is left up to the capture routines.

(B) The "enable" mode sets up the controller with all the required information, but also enables the DMA, so the operation can take place.

(C) The enable mode utilizes the watchdog timer on the interface card as a safeguard. The length of time for the watchdog timer can be manipulated with the watchdog timer set function.

(D) The memory used in all DMA operations is located on the interface card. The I/O device used in all DMA operations is the current UUT device.

If the writer needs to change or delete any of the DMA request driver data, return to the screen shown on the previous page, select a 2, and press ENTER. The following monitor screen will appear:

| DMA REQUEST - CARDNUMBER N | | | |
| --- | --- | --- | --- |
| | Cir # | Leg # | Point # |
| This step: | NN | 18 | 001 |
| [A] Next step if ok: | NN | NN | NNN |
| [A] Next step if bad: | NN | NN | NNN |
| [C] DMA Channel Number: | N | Command Mask: | N |
| [D] DMA Address: | NN | | |
| [E] Type Request: | N | | |
| Enter [C]hange, [D]elete or press [Enter] | | | |

The type of DMA request screen will appear after data has been entered on the above screen, with an additional prompt on the bottom of the screen, requesting which change or deletion to make.

TO MAKE CHANGES:
(1) Enter a "C" on the above screen and press ENTER.
  (A) Next to the "Enter line to change or press Enter" prompt, insert a character (A-E), depending on which line to be changed, then press ENTER.
  (B) If an "A" or "B" is entered, insert the correct data next to the Cir, Leg, and Point prompts, at the bottom of the screen.
  (C) If a "C" is selected, the prompt "Change DMA Channel number to" will appear. Insert the proper channel number and press ENTER.
  (D) If a "D" is selected, two prompts will appear one after the other. The two prompts are "Change DMA RAM address to" and "Change Command Mask to". Press ENTER after each insertion of the appropriate data.
  (E) Entering an "E" under the change prompt will return the display to the TYPE OF DMA REQUEST screen. If changes are necessary select the proper mode and press ENTER.

TO MAKE DELETIONS:
(1) Enter a "D" on the above screen and press ENTER.
  (A) The prompt "Delete This Step Y/N?" will appear. Type in a Y or an N, then press ENTER.

The write/read UUT registers driver is a specialized write/read I/O, that enables the author to write and read to eighteen different registers of the UUT.

To begin, access the driver data file (FIG. 12G), select a 6, then press ENTER. The following monitor screen will appear (FIG. 12M):

| CREATE/CHANGE DRIVER DATA FILE |
| --- |
| [0] Return to driver menu |
| [1] Write to UUT registers |
| [2] Read UUT registers |
| Selection: N |

To create a new write to UUT register, insert a 1 in the space provided, then press ENTER. The following screen will appear:

| INITIALIZE REGISTERS |
| --- |
| [0] Return to register driver menu |
| [1] Create new driver |
| [2] Change existing driver |

INITIALIZE REGISTERS

Selection: N

To initialize and create a new write to UUT register driver, insert a 1 in the space provided and press ENTER. The following monitor screen will appear:

INITIALIZE REGISTERS
NEW DRIVER

| Card number: N | Cir # | Leg # | Point # |
| --- | --- | --- | --- |
| This step: | 00 | 23 | 001 |
| Next step: | NN | NN | NNN |

| Addr-Reg address (hex): N | Data-Reg address (hex): N |
| --- | --- |
| Reg # | Hex data |
| N | NN |

The above screen is divided into three sections. Each section can be accessed by inserting the data needed, then pressing ENTER, to advance the screen.
(1) The circuit number will be 00 for all drivers.
(2) The leg number will be 24 for all write to UUT register drivers.
(3) The point number is assigned by the system.
(4) All next step data is assigned by the author.
(5) The Addr-Reg address is obtained from the general description that comes with the UUT. This register address represents where the author input register number is located.
(6) Data-Reg address is obtained from the general description that comes with the UUT. This address represents where data is going to be located for a given register.
(7) The register number is also obtained from the accompanying paperwork of the UUT.
(8) The hex data is assigned by the author for the specific UUT being used.

Insert all appropriate data, pressing ENTER after each entry, until all data has been logged.

To change an existing driver return to the Initialize Registers screen, insert a 2 in the space provided, then press ENTER. The following monitor screen will appear:

INITIALIZE REGISTERS - CARDNUMBER N

|  | Cir # | Leg # | Point # |
| --- | --- | --- | --- |
| [A] This step: | 00 | 23 | NNN |
| Next step: | NN | NN | NNN |
| [B] Addr-Reg address: NN | Data-Reg address: NN | | |
| 0 1 2 3 4 5 6 7 8 9 A B C D E F 10 11 | | | |
| [C] N | | | |
| Type [A]dd, [C]hange, [D]elete or press [Enter] | | | |

The above screen shows all the write to UUT register data entered by the author on one screen. This gives the writer an overview of the data entered, which makes changes easier.

TO MAKE ADDITIONS:
(1) Insert an "A" next to the prompt and press ENTER.
  (A) The Register number will appear along with a hex data prompt. Insert any necessary hex data pressing ENTER after each insertion, until all missing hex data has been added.

TO MAKE CHANGES:
(1) Insert a "C" next to the prompt and press ENTER.
  (A) The prompt "Enter row and column to change:" will appear. Enter "A", to change the next step data. Enter "B", to change the Address-Register address and/or Data-Register address. Enter "C", to change the hex data.

TO DELETE:
(1) Insert a "D" next to the prompt and press ENTER.
  (A) The prompt "Enter [All] or line and column of byte to delete:" will appear. From this prompt all unwanted data can be deleted.

To read the UUT registers return to the create/change driver data file menu (FIG. 12G) and select from the following:

CREATE/CHANGE DRIVER DATA FILE

[0] Return to driver menu
[1] Write to UUT registers
[2] Read UUT registers
Selection: N To create a new read UUT register, insert a 2 in the space provided and press ENTER. The following monitor screen will appear:

READ UUT REGISTERS

[0] Return to register driver menu
[1] Create new driver
[2] Change existing driver
Selection: N To create a new read UUT driver insert a 1 in the space provided and press ENTER. The following monitor screen will appear:

READ UUT REGISTERS
NEW DRIVER

| Card number: N | Cir # | Leg # | Point # |
| --- | --- | --- | --- |
| This step: | 00 | 24 | NNN |
| Next step if ok: | NN | NN | NNN |
| Next step if bad: | NN | NN | NNN |

| Addr-Reg address (hex):N | Data-Reg address (hex): N |
| --- | --- |
| Reg # | Hex data |
| N | NN |

Insert the appropriate data until all data has been logged, then press ENTER to continue.

Enter all data for this read driver in the same manner as described in the write to UUT registers portion of this section.

To change an existing read driver return to the Read UUT Registers menu, insert a 2 in the space provided, then press ENTER. The following monitor screen will appear:

READ UUT REGISTERS - CARDNUMBER N

|  | Cir # | Leg # | Point # |
| --- | --- | --- | --- |
| This step: | 00 | 24 | NNN |
| [A] Next step if ok: | NN | NN | NNN |
| [B] Next step if bad: | NN | NN | NNN |
| [C] Addr-Reg address: NN | Data-Reg address: NN | | |

| READ UUT REGISTERS - CARDNUMBER N | | | | | | | | | |
|---|---|---|---|---|---|---|---|---|---|
| | | | Cir # | | Leg # | | Point # | | |
| 1 | | 2 | | 3 | | 4 | | 5 | |
| Reg# | Data | Reg# | Data | Reg# | Data | Reg# | Data | Reg# | Data |
| [D] | N | | | | | | | | |
| Type [A]dd, [C]hange, [D]elete or press [Enter] | | | | | | | | | |

Insert all the necessary data changes on the above monitor screen, pressing ENTER after change, addition, or deletion, until all data is correct. Then press ENTER, twice, to return to the driver data file.

The function of the Set Watchdog Timer driver, is to keep the author from getting stuck in a particular routine. If certain events have not taken place within a specified time frame, timeout occurs. When a watchdog timer is created, the length of time the device will wait before a timeout occurs is specified (FIG. 12N).

| SET WATCHDOG TIMER |
|---|
| [0] Return to driver menu |
| [1] Create new driver |
| [2] Change existing driver |
| Selection: N |

To create a new set watchdog timer driver, insert a 1 in the space provided, then press ENTER.

The next monitor screen will appear as follows:

| SET WATCHDOG TIMER NEW DRIVER | | | |
|---|---|---|---|
| Card number: N | Cir # | Leg # | Point # |
| This step: | | | |
| Next step if ok: | | | |
| Next step if bad: | | | |
| Seconds: N | | | |

Fill in the data necessary to create a new driver. The parameters for the above steps are the same as other drivers.
  (1) "THIS STEP" data will be 00, 17 and 001 through 999. It is assigned by the system.
  (2) "NEXT STEP" data is assigned by the writer.
  (3) The "SECONDS" prompt, refers to the length of time the writer wishes to assign to the watchdog timer. A typical use for the watchdog timer function, would be running a memory test. If a memory test takes an extended amount of time, the system will timeout. The watchdog timer function allows one to extend that timeout period to allow a run of the memory test without timeout occurring.

Once the watchdog timer is set, it stays at that value until it is reset.

The parameters of the watchdog timer values are 0-120.

The watchdog timer also sets the system (GPIB) timeout.

When all the above data has been logged press ENTER to continue.

To change an existing driver return to the set watchdog timer file, insert a 2, then press ENTER.

| SET WATCHDOG TIMER CHANGE DRIVER |
|---|
| Card number: N |

| SET WATCHDOG TIMER CHANGE DRIVER |
|---|
| N WATCHDOG TIMER DRIVERS ON FILE |
| ENTER NUMBER OF DRIVER YOU WISH TO CHANGE: N |

The above screen will appear only if there is more than one driver previously created, otherwise the change screen appears, as shown below.

| SET WATCHDOG TIMER - CARDNUMBER N | | | | |
|---|---|---|---|---|
| | | Cir # | Leg # | Point # |
| | This step: | 00 | 17 | 001 |
| [A] | Next step if ok: | 00 | NN | NNN |
| [B] | Next step if bad: | 00 | NN | NNN |
| [C] | Seconds (0-120): | N | | |
| | Enter [C]hange, [D]elete or press [Enter] | | | |

All necessary changes or deletions on the above monitor screen may be inserted and ENTERED.

The Memory Refresh Control driver (FIG. 12O) is used to prevent a board or card with dynamic RAM from memory deterioration.

To create a new memory refresh control driver, access the driver data file (FIG. 12G), select "8", then press ENTER. The following monitor screen will appear:

| MEMORY REFRESH CONTROL |
|---|
| [0] Return to driver menu |
| [1] Create new driver |
| [2] Change existing driver |
| Selection: N |

To create a memory refresh control driver, insert a 1 in the space provided and press ENTER. The next monitor screen will appear as follows:

| MEMORY REFRESH CONTROL NEW DRIVER | | | |
|---|---|---|---|
| Card number: N | Cir # | Leg # | Point # |
| This step: | 00 | 19 | NNN |
| Next step: | NN | NN | NNN |
| Set memory refresh control (1=ON/0=OFF) . . .: N | | | |

Memory refresh control has only two possible modes: ON or OFF.

Once memory refresh is turned on it stays on until the Data Capture Device 5 is powered down.

The system software controls how often memory is refreshed, which is every two milliseconds, for the addresses necessary to maintain memory.

Enter the data on the above monitor screen pressing ENTER, after each prompt is filled.

To make a change return to the memory refresh control driver screen, select a 2, then press ENTER. The following monitor screen will appear:

| MEMORY REFRESH CONTROL - CARDNUMBER N | | | | |
|---|---|---|---|---|
| | | Cir # | Leg # | Point # |
| | This step: | 00 | 19 | 001 |
| [A] | Next step: | NN | NN | NNN |
| [B] | Refresh request: | N | | |
| | Enter [C]hange, [D]elete or press [Enter] | | | |

TO MAKE CHANGES:
(1) Insert a "C" next to the flashing prompt and press ENTER.
 (A) Enter the line character (A or B) next to the prompt, "Enter line to change or press [Enter]". If "A" was selected the circuit, leg, and point prompts will appear one after the other as the new data is entered. Press ENTER after each insertion, then once again to write the file. If "B" was selected the prompt "Change refresh status to (1=ON/0=OFF):", will appear. Answer either 1 or 0, to change the status, then press ENTER.

TO DELETE:
(1) Insert a "D" next to the flashing prompt and press ENTER.
 (A) The prompt "Delete this step" will appear. Select either a "Y" or an "N", for yes or no to delete this driver step.

When all the data is correct press ENTER to write this file.

The "Wait for Interrupt" driver (FIG. 12P) is used as a method of communication between the PC 1 and the Unit Under Test (UUT) 6. Using the interrupt driver the UUT can signal the PC that the UUT needs attention. The interrupt facility was included in the Fault Locating System to handle the interrupts generated by the UUT.

To create a "Wait for Interrupt" driver, access the driver data file (FIG. 12G), select 9, then press ENTER. The following monitor screen will appear:

| WAIT FOR UUT INTERRUPT |
| --- |
| [0] Return to driver menu |
| [1] Create new driver |
| [2] Change existing driver |
| Selection: N |

Insert a 1 on the above monitor screen to create a new "Wait for Interrupt" driver, then press ENTER. The next monitor screen will appear as follows:

| WAIT FOR UUT INTERRUPT NEW DRIVER | | | | | | |
| --- | --- | --- | --- | --- | --- | --- |
| Card number: N | Cir # | | Leg # | | Point # | |
| This step: | 00 | | 20 | | 001 | |
| Next step: | NN | | NN | | NNN | |
| INTERRUPTS: | NMI | 2 | 3 | 4 | 5 | 6 | 7 |
| 1=ON/0=OFF | N | N | N | N | N | N | N |

(1) The interrupt list can be found in the technical manual for the PC.
(2) The data the writer inserts under the "next step" heading, refers to the step the writer wishes to go to, in order to handle the interrupt generated by the UUT.
(3) The interrupts (NMI through 7), can only be ON or OFF.
(4) If the interrupt is placed on more than one of the eight data bytes, the system will read only the first of the ON instructions. It will ignore the other seven. The writer will usually branch into this driver from the diagnostic step that caused the UUT to generate the interrupt.

To make a change to the "Wait for Interrupt" driver return to the Create/change monitor screen, select a 2, then press ENTER. The following screen will appear:

| WAIT FOR INTERRUPT - CARDNUMBER N | | | | | | | |
| --- | --- | --- | --- | --- | --- | --- | --- |
| | | Cir # | | Leg # | | Point # | |
| [A] | This step: | 00 | | 20 | | 001 | |
| | Next step: | NN | | NN | | NNN | |
| [B] | INTERRUPTS: | NMI | 2 | 3 | 4 | 5 | 6 | 7 |
| | 1=ON/0=OFF: | N | N | N | N | N | N | N |
| Enter [C]hange, [D]elete or press [Enter] | | | | | | | |

TO MAKE CHANGES:
(1) Insert a "C" next to the flashing prompt and press ENTER.
 (A) The prompt "Enter line to change or press [Enter]" will appear. Select either line A or line B, to make the necessary changes to the data. Selecting line A, will bring up the circuit, leg and point prompts. Insert the step changes, pressing ENTER after each change to write the file. Selecting line B, will allow a change in the ON/OFF status of any one of the bytes (NMR-7). The cursor will be positioned below line [B]. Pressing ENTER, moves the cursor to the next position to make the change. Press ENTER after making the change, and until the file is written.

TO DELETE:
(1) Insert a "D" next to the prompt and press ENTER.
 (A) The prompt "Delete this step (Y/N)?" will appear. Insert either a Y or an N, then press ENTER.

The Subroutine driver is a control program that calls a series of drivers to create a loop, enabling the writer to make that series into a routine and returns to the designated return step. To access the subroutine driver function enter the driver data file (FIG. 12G), select 10, then press ENTER. The following monitor screen will appear (FIG. 12Q):

| SUBROUTINE CONTROL |
| --- |
| [0] Return to driver menu |
| [1] Create new driver |
| [2] Change existing driver |
| Selection: N |

To create a new subroutine driver insert a 1 in the space provided, then press ENTER. The following monitor screen will appear:

| SUBROUTINE CONTROL NEW DRIVER | | | |
| --- | --- | --- | --- |
| | | P/N: N | |
| Card number: N | Cir # | Leg # | Point # |
| This step: | 00 | 40 | 001 |
| Return step: | NN | NN | NNN |
| Subroutine steps: | 00 | NN | NNN |
| | 00 | NN | NNN |
| | 00 | NN | NNN |
| | 00 | NN | NNN |

(1) The circuit number will always be "00" for "this step".
(2) The leg number for creating a subroutine driver is 40.

(3) Point numbers are assigned by the system.
(4) The return step is where the writer wants to go after the subroutine has been run.
(5) The legs on the subroutine steps can only be numbers 10-27, and 40.
(6) The writer can have as many as 126 subroutine steps. There can be sets of subroutines, as many times as needed, up to 126.
(7) The monitor screen will hold up to 19 subroutine steps, then advances to the next screen.
(8) If while running the subroutine, the system encounters a "next if bad" step, and the step is bad, the subroutine will cease, and the system will go to the "next if bad" point.

To change the subroutine driver return to the subroutine control menu, select a 2 then press ENTER. The following monitor screen will appear:

| SUBROUTINE CONTROL CHANGE DRIVER |
| --- |
| Card number: N　　　　P/N: N |
| N SUBROUTINE DRIVERS ON FILE |
| ENTER NUMBER OF DRIVER YOU |
| WISH TO CHANGE: N |

Select the driver to be changed, insert it in the space provided, the press ENTER. The following monitor screen will appear:

| SUBROUTINE CONTROL - CARDNUMBER | | | | |
| --- | --- | --- | --- | --- |
| | | Cir # | Leg # | Point # |
| [A] | This step: | 00 | 40 | 001 |
| | Return step: | NN | NN | NNN |
| [001] | Subroutine steps: | 00 | NN | NNN |
| [002] | | 00 | NN | NNN |
| [003] | | 00 | NN | NNN |
| [004] | | 00 | NN | NNN |
| [005] | | 00 | NN | NNN |
| [006] | | 00 | NN | NNN |
| [007] | | 00 | NN | NNN |
| [008] | | 00 | NN | NNN |
| [009] | | 00 | NN | NNN |
| [010] | | 00 | NN | NNN |
| [011] | | 00 | NN | NNN |
| [012] | | 00 | NN | NNN |
| [013] | | 00 | NN | NNN |
| [014] | | 00 | NN | NNN |
| [015] | | 00 | NN | NNN |
| [016] | | 00 | NN | NNN |
| [017] | | 00 | NN | NNN |
| [018] | | 00 | NN | NNN |
| [019] | | 00 | NN | NNN |
| Type [A]dd, [C]hange, [D]elete or press [Enter] | | | | |

When the first screen is full it automatically advances to the next page, up to 126 steps. A writer can have a group of steps, repeated several times in this subroutine file to thoroughly check a circuit.

TO MAKE ADDITIONS:
(1) Insert an "A" next to the prompt at the bottom of the screen.
  (A) The prompt "Add step #" will appear with the next available step position next to it, followed by the leg and point prompts. Insert the data, pressing ENTER after each step is inserted.

TO MAKE CHANGES:
(1) Insert a "C" next to the prompt at the bottom of the screen.
  (A) The prompt "Enter row to change:" will appear. If row [A] is selected, the screen will read "Return step-Cir:" asking for the circuit number. Enter the circuit number. after pressing ENTER, the Leg number prompt will appear, followed by the Point number prompt. Insert this data, pressing ENTER after each entry. Pressing ENTER again will write the file. If any of the 126 subroutine steps are selected to change, only the Leg and point number prompts will appear. The circuit numbers on the subroutine steps cannot be changed.

TO DELETE STEPS:
(1) Insert a "D" next to the prompt at the bottom of the screen.
  (A) The prompt "Enter step to delete or [All]:" will appear. Select the step desired to be deleted or type in "ALL" to make the deletion. The screen will then ask "Delete this step (Y/N)?". Insert either a Y or an N and press ENTER.

The Write/read LAD Port driver (FIG. 12S) is a unique driver that allows the author to write to and read from the Data Capture Device port. It is unique in the sense that this driver is used in writing diagnostics for a limited number of Units Under Test.

NOTE: If the board or card for which diagnostics are being written calls for the LAB port driver function, the system is unable to generate an error message if an invalid step is entered, when using this driver. To escape from this condition, a "reset" must be performed.

To write to the LAB port, access the driver data file (FIG. 12G), select 12, then press ENTER. The following monitor screen will appear (FIG. 12S):

| CREATE/CHANGE DRIVER DATA FILE |
| --- |
| [0] Return to driver menu |
| [1] Read from LAB port |
| [2] Write to LAB port |
| 　　　Selection: N |

To begin writing to the LAB port, insert a 2 in the space provided and press ENTER. The following monitor screen will appear:

| WRITE TO LAB PORT |
| --- |
| [0] Return to LAB driver menu |
| [1] Create new driver |
| [2] Change existing driver |
| 　　　Selection: N |

Insert a 1 in the space provided, then press ENTER. The following monitor screen will appear:

| WRITE TO LAB PORT NEW DRIVER | | | | |
| --- | --- | --- | --- | --- |
| Card number: | | Cir # | Leg # | Point # |
| This step: | | 00 | 22 | 001 |
| Next step if ok: | | NN | NN | NNN |
| Next step if bad: | | NN | NN | NNN |
| Port address (hex): | NN | | | |
| Hex data: | NN | | | |

(1) The preceeding screen will appear in three sections. As data is entered in each flashing space press ENTER, to advance to the next prompt.
(2) THIS STEP, refers to the current step in the diagnostic writing sequence. The leg for a write to LAB port driver will always be 22. The point number will begin with 1 and can go as high as 999.

(3) Where the diagnostic sequence is lead under the NEXT IF OK and NEXT IF BAD steps, is entirely up to the writer.
(4) The port address parameters are 0000-FFFF, but the address inserted here depends on the board or card for which diagnostics are being written.
(5) The hex data parameters are 00-FF.

When all pertinent data has been logged press ENTER, to write the driver file.

To change any of the write to LAB port driver data return to the write to LAB port menu, insert a 2 in the space provided, then press ENTER. The following monitor screen will appear:

| WRITE TO LAB PORT CARDNUMBER - N | | | |
|---|---|---|---|
| | Cir # | Leg # | Point # |
| This step: | 00 | 22 | 001 |
| [A] Next step if ok: | NN | NN | NNN |
| [B] Next step if bad: | NN | NN | NNN |
| [C] Port address: | NNNN | | |
| [D] Data byte: | NN | | |
| Type [C]hange, [D]elete or press [Enter] | | | |

To make changes, type in a "C" and press ENTER. The screen will appear with the prompt "Enter line to change:". Selecting an A or a B and pressing ENTER, will call out the Circuit, Leg and Point prompts. Make any necessary changes pressing ENTER after each change to write the file. Selecting a C and pressing ENTER will call out the "Change port address to:" prompt. Make any needed changes, then press ENTER to log the changes. Selecting a D and pressing ENTER, will call out the "Change hex data to:" prompt. Make any needed changes and press ENTER, to write the file.

To delect, insert a "D" and press ENTER. The screen will appear with the prompt "Enter line to delete or [A]11:". Select the appropriate line to delete and press ENTER to delete that step.

To read from a LAB port driver return to the create/change driver data file menu, insert a 1 in the space provided, then press ENTER. The following monitor screen will appear:

| READ FROM LAB PORT |
|---|
| [0] Return to lab driver menu |
| [1] Create new driver |
| [2] Change existing driver |
| Selection: N |

Insert a 1 in the space provided, then press ENTER. The following monitor screen will appear:

| READ FROM LAB PORT NEW DRIVER | | | | |
|---|---|---|---|---|
| Card number: | N | Cir # | Leg # | Point # |
| This step: | | 00 | 21 | 001 |
| Next step if ok: | | NN | NN | NNN |
| Next step if bad: | | NN | NN | NNN |
| Port address (hex): | NN | | | |
| Hex data: | NN | | | |

Assign circuit, leg and point numbers to the above variables, depending on which direction the diagnostic steps are to proceed. When all the appropriate data has been inserted press ENTER to write this read from LAB port driver.

To change an existing read from LAB port driver, access the Create/change read from LAB port driver menu, insert a 2, then press ENTER. The following monitor screen will appear:

| READ FROM LAB PORT - CARDNUMBER N | | | |
|---|---|---|---|
| | Cir # | Leg # | Point # |
| This step: | 00 | 21 | 001 |
| [A] Next if ok: | NN | NN | NNN |
| [B] Next if bad: | NN | NN | NNN |
| [C] Port address: | NN | | |
| [D] Data byte: | NN | | |
| Type [C]hange, [D]elete or press [Enter] | | | |

Make any changes or deletions to the read driver in the same manner described for the write driver, earlier in this section and press ENTER, twice, to return to the driver data file menu.

Depending on the board or card for which diagnostics are being written, the branch on I/O read routine may be needed. The branch on I/O read routine is a forty branch diagnostic function that works much the same as the read UUT I/O driver with the addition of the forty possible steps that enable the writer to branch to forty different points under this single driver.

To access the branch on I/O read driver screen (FIG. 12T) select a "13" on the driver data file menu (FIG. 12G), then press ENTER. The following monitor screen will appear:

| BRANCH ON I/O READ |
|---|
| [0] Return to driver menu |
| [1] Create new driver |
| [2] Change existing driver |
| Selection: N |

To create a new branch on I/O read driver insert a "1" in the space provided, then press ENTER. The following monitor screen will appear:

| BRANCH ON I/O READ NEW DRIVER | | | | | | | |
|---|---|---|---|---|---|---|---|
| Card number: | N | Cir # | | Leg # | | Point # | |
| This step: | | 00 | | 26 | | 001 | |
| Next if bad status: | | NN | | NN | | NNN | |
| Initial status data (hex): | N | Secondary status data(hex): N | | | | | |
| Maximum status count: | N | | | | | | |
| I/O address (hex): NN | | Read status addr. (hex): NN | | | | | |
| Interrupts (1=ON/0=OFF): | NMI | 2 | 3 | 4 | 5 | 6 | 7 |
| PRE I/O: | N | N | N | N | N | N | N |
| POST I/O: | N | N | N | N | N | N | N |
| Branch data mask (hex): | NN | | | | | | |

(1) The above screen is divided into 5 sections. As data is inserted press ENTER, to advance to the next flashing prompt.
(2) The circuit is 00 for drivers.
(3) The leg number for this driver is 26.
(4) The point number is sequentially assigned by the system.
(5) Under "next if bad" status, assign this as with any other driver. Items 6, 7 and 8 are used if the device responds with status when a command is given.

(6) Initial status data is the beginning status of an I/O device response. Initial status is read only if a status address is inserted to be read, under "Read status address". A particular byte to be read from a given starting point of the address may be selected.
(7) Secondary status data refers to the ending status response. This is the same as saying "where to go if bad".
(8) Maximum status count is the instruction telling the system how many times to read the status.
(9) Fill in the appropriate I/O read status addresses.

---
BRANCH ON I/O READ
CHANGE DRIVER
---
Card number: N
N BRANCH ON I/O READ DRIVERS ON FILE
ENTER NUMBER OF DRIVER YOU WISH TO
CHANGE: N
---

Select the number of the driver to be changed, insert that number in the space provided, then press ENTER. The following monitor screen will appear:

---
BRANCH ON I/O READ - CARDNUMBER N
---

|  | Cir # | Leg # | Point # |  |  |  |  |
|---|---|---|---|---|---|---|---|
| This step: | 00 | 26 | 001 |  |  |  |  |
| [A] Next if bad status: | NN | NN | NNN |  |  |  |  |
| [B] Initial status data: N |  |  | Secondary status data: N |  |  |  |  |
| [C] Max status count: N |  |  |  |  |  |  |  |
| [D] I/O address: N |  |  | Read status addr: NN |  |  |  |  |
| INTERRUPTS (1=ON/0=OFF): |  | NMI 2 | 3 | 4 | 5 | 6 | 7 |
| [E] PRE I/O |  | N   N | N | N | N | N | N |
| [F] POST I/O |  | N   N | N | N | N | N | N |
| [G] Branch data mask: NN |  |  |  |  |  |  |  |

Enter [C]hange, [D]elete or press [Enter]

(10) With the interrupt prompts, the system can be instructed to only read the pertinent interrupts and ignore the interrupts that vary on a given operation.
(11) Branch data mask, refers to the byte of data desired to be masked within the branch.

The final monitor screen in the driver creation process appears as follows:

TO MAKE CHANGES:
(1) Insert a "C" next to the flashing prompt, then press ENTER.
 (A) Select a line to change (A through G) and press ENTER. The monitor screen will respond to the selection by bringing up the prompt heading of the line requested. If changes are needed on lines B and/or D, the second part of those lines will

| CARD NUMBER: N | | | | | STEP: 00 26 NNN | |
|---|---|---|---|---|---|---|
|  | Val | Cir | Leg | Pnt |  | Val Cir Leg Pnt |
| [1] ON: | NN | NN | NN | NNN | [21] ON: |  |
| [2] ON: |  |  |  |  | [22] ON: |  |
| [3] ON: |  |  |  |  | [23] ON: |  |
| [4] ON: |  |  |  |  | [24] ON: |  |
| [5] ON: |  |  |  |  | [25] ON: |  |
| [6] ON: |  |  |  |  | [26] ON: |  |
| [7] ON: |  |  |  |  | [27] ON: |  |
| [8] ON: |  |  |  |  | [28] ON: |  |
| [9] ON: |  |  |  |  | [29] ON: |  |
| [10] ON: |  |  |  |  | [30] ON: |  |
| [11] ON: |  |  |  |  | [31] ON: |  |
| [12] ON: |  |  |  |  | [32] ON: |  |
| [13] ON: |  |  |  |  | [33] ON: |  |
| [14] ON: |  |  |  |  | [34] ON: |  |
| [15] ON: |  |  |  |  | [35] ON: |  |
| [16] ON: |  |  |  |  | [36] ON: |  |
| [17] ON: |  |  |  |  | [37] ON: |  |
| [18] ON: |  |  |  |  | [38] ON: |  |
| [19] ON: |  |  |  |  | [39] ON: |  |
| [20] ON: |  |  |  |  | [40] If not: |  |

(1) Select the steps to proceed to on the above screen. If all forty are not needed, insert the steps to be used, then under step forty, insert the next logical step if one of the "ON" statements is not active.
(2) The Val column is the hex value of the byte to be compared to the data read.

When the branch steps have been entered press ENTER, to write the driver.

To change any branch on I/O read driver return to the branch on I/O read menu, insert a 2 in the space provided, then press ENTER. If only one driver exists, the data screen for that driver will appear. If there is more than one driver written the following monitor screen will appear:

appear after inserting the changed data and having pressed ENTER. On lines E and F the system will prompt one interrupt at a time. Press ENTER to move to the next interrupt until reaching 7. Pressing ENTER once more will complete that line of data.

TO DELETE:
(1) Insert a "D" next to the flashing prompt, then press ENTER.
 (A) The screen will appear with the additional prompt "Delete this step (Y/N)?:". Select either a Y or an N, then press ENTER.

The branch on RAM read driver is a 40 way branch based on a single port address that needs to be read.

This driver works much the same as the branch on I/O read driver, except that here a RAM port address will be read.

To create branch on RAM read driver (FIG. 12U), access the driver data file menu (FIG. 12G), insert a "14" in the space provided, then press ENTER. The following monitor screen will appear:

| BRANCH ON RAM READ |
|---|
| [0] Return to driver menu |
| [1] Create new driver |
| [2] Change existing driver |
| Selection: N |

To create a new branch on RAM read driver, insert a "1" in the space provided, then press ENTER. The following monitor screen will appear:

| BRANCH ON RAM READ NEW DRIVER | | | | |
|---|---|---|---|---|
| Card Number: | N | Cir # | Leg # | Point # |
| This step: | | 00 | 27 | NNN |
| RAM address (hex): | NN | | | |
| Branch data mask (hex): | NN | | | |

(1) The circuit is 00 for all drivers, assigned by the system.
(2) The leg number for this driver is 27, assigned by the system.
(3) The point number is sequentially assigned by the system.
(4) The RAM address is the address being read from.
(5) The branch data mask is the byte of data desired to mask within the branch.

Insert the appropriate data, pressing ENTER, after each value has been inserted, to write the file. The following monitor screen will appear:

When the branch steps have been entered press ENTER, to write the driver.

To change the branch on RAM read driver, return to the create/change branch on RAM read driver menu, insert a "2", then press ENTER. If there is more than one driver written, the following monitor screen will appear:

| BRANCH ON RAM READ CHANGE DRIVER |
|---|
| Card number: N |
| N BRANCH ON I/O READ DRIVERS ON FILE |
| ENTER NUMBER OF DRIVER YOU WISH TO CHANGE: N |

Enter the number of the driver to be changed and press ENTER. The following monitor screen will appear:

| BRANCH ON RAM READ - CARDNUMBER N | | | |
|---|---|---|---|
| | Cir # | Leg # | Point # |
| This step: | 00 | 27 | NNN |
| [A] RAM address (hex): | NN | | |
| [B] Branch data mask: | NN | | |
| Enter [C]hange, [D]elete or press [Enter] | | | |

(1) Select a "C", then press ENTER to make a change.
   (A) The prompt "Enter line to change" will appear. Select the line desired to change data on, insert that alpha character in the space provided, then press ENTER.
(2) Select a "D", then press ENTER, to reach the delete screen.
   (A) The prompt "Delete this step (Y/N)?" will appear. Insert a Y or an N, for yes or no, then press ENTER to return to the change branch on RAM read menu.

| CARD NUMBER: N | | | | | STEP: 00 27 NNN | |
|---|---|---|---|---|---|---|
| | Val | Cir | Leg | Pnt | | Val Cir Leg Pnt |
| [1] ON: | NN | NN | NN | NNN | [21] ON: | |
| [2] ON: | | | | | [22] ON: | |
| [3] ON: | | | | | [23] ON: | |
| [4] ON: | | | | | [24] ON: | |
| [5] ON: | | | | | [25] ON: | |
| [6] ON: | | | | | [26] ON: | |
| [7] ON: | | | | | [27] ON: | |
| [8] ON: | | | | | [28] ON: | |
| [9] ON: | | | | | [29] ON: | |
| [10] ON: | | | | | [30] ON: | |
| [11] ON: | | | | | [31] ON: | |
| [12] ON: | | | | | [32] ON: | |
| [13] ON: | | | | | [33] ON: | |
| [14] ON: | | | | | [34] ON: | |
| [15] ON: | | | | | [35] ON: | |
| [16] ON: | | | | | [36] ON: | |
| [17] ON: | | | | | [37] ON: | |
| [18] ON: | | | | | [38] ON: | |
| [19] ON: | | | | | [39] ON: | |
| [20] ON: | | | | | [40] If not: | |

(1) Select the steps desired to proceed to on the above screen. If all forty are not needed, just insert the steps to be used then under step forty, insert the next logical step if one of the "ON" statements is not active.
(2) The "Val" column is the hex value of the byte to be compared to the data read.

| ISG DIAGNOSTICS AUTHORING FACILITY Current card - N  P/N - N |
|---|
| [0] End session |
| [1] Create IC and connector list |
| [2] Add/change diagnostic steps |
| [3] Review diagnostic steps |
| [4] Change IC or connector list |

| ISG DIAGNOSTICS AUTHORING FACILITY |
| --- |
| Current card - N P/N - N |
| [5] Create/change a driver |
| [6] Run diagnostics |
| ********************************* |
| [7] Create/change start point |
| ********************************* |
| [8] Create/change instruction step |
| [9] Create/change branching instruction |
| [10] Change current card |
| Selection: 7 |

The "create/change start point" routine (FIG. 12V) is a routine that tells the system where the diagnostic steps should begin.

There are two reasons for having or changing a start point:

(1) To begin the diagnostics at a logical point.
(2) To save time while writing the diagnostics. If while writing the diagnostics for a particular board or card, instead of going through an entire sequence of steps to verify a waveform, etc., a particular point may be specified as the beginning. It is not necessary to run through some steps over and over again if it is already known where they will lead.

To create/change a start point, access the main menu (FIG. 12A), select a "7", then press ENTER. The following monitor screen will appear (FIG. 12V):

| CREATE/CHANGE DIAGNOSTIC ENTRY POINT |  |  |  |
| --- | --- | --- | --- |
| Card # NNNN |  |  |  |
|  | Circuit # | Leg # | Point # |
| Current entry point: | NN | NN | NNN |
| New entry point | NN | NN | NNN |

(1) The card number was assigned when the IC and connector lists were created.
(2) The circuit, leg and point numbers listed first, represent where the starting point is at the moment.
(3) The new entry point line is the change the writer wishes to make in the start point.

Insert the changes to be made, pressing ENTER after each new circuit, leg and point number is entered. Pressing ENTER once more will write the file.

| ISG DIAGNOSTICS AUTHORING FACILITY |
| --- |
| Current card - N P/N - N |
| [0] End session |
| [1] Create IC and connector list |
| [2] Add/change diagnostic steps |
| [3] Review diagnostic steps |
| [4] Change IC or connector list |
| [5] Create/change a driver |
| [6] Run diagnostics |
| [7] Create/change start point |
| [8] Create/change instruction step |
| [9] Create/change branching instruction |
| [10] Change current card |
| Selection: 10 |

Current card refers to the assigned number of the Unit Under Test 6.

There are six card numbers in the present example.

| CARD NUMBER | DESCRIPTION |
| --- | --- |
| 1 | color graphics card |
| 2 | monochrome parallel PTR |
| 3 | 64-256KB memory expansion |
| 5 | 16-64KB system board for PC |
| 6 | 64-256KB system board for PC |
| 7 | 64-256KB system board for XT |

The system will recognize only established card numbers.

To change the current card number, access the main menu, select "10", then press ENTER. The following monitor screen will appear:

| CHANGE CURRENT CARD NUMBER |
| --- |
| Current card number is N Part number N |
| Change to (card # or part #): N |

(1) Notice that the system allows a change to either the card number or the part number, using the same prompt. When the IC and connector list were created, the part number for the card was created. This prompt allows a selection of either the card number or the part number, and if either one matches what has already been established, the accompanying diagnostics can be accessed.
(2) If an incorrect number is inserted using this screen, the message INVALID will appear. This message will keep returning, until a correct number is selected.

| ISG DIAGNOSTICS AUTHORING FACILITY |
| --- |
| Current card - N P/N - N |
| [0] End session |
| [1] Create IC and connector list |
| [2] Add/change diagnostic steps |
| [3] Review diagnostic steps |
| [4] Change IC or connector list |
| [5] Create/change a driver |
| [6] Run diagnostics |
| [7] Create/change start point |
| [8] Create/change instruction step |
| [9] Create/change branching instruction |
| [10] Change current card |
| Selection: 2 |

Just as drivers are used to exercise circuits on the boards and cards to be tested, diagnostic steps are used to locate failures in those circuits.

The diagnostic steps are the heart of the authoring process. It is through the diagnostic steps that the writer can check a particular circuit on the unit to be tested, through waveform, bus and count captures.

To access the add/change diagnostic steps routine, enter the main menu (FIG. 12A), insert a "2" in the space provided, then press ENTER. The following monitor screen will appear (see FIG. 12C):

| ADD/CHANGE DIAGNOSTIC STEP |
| --- |
| [0] Return to main menu |
| [1] Add new diagnostic step |
| [2] Change a diagnostic step |
| Selection: N |

To add a diagnostic step, insert a "1" in the space provided, then press ENTER. The following monitor screen will appear:

| CARD # N - DIAGNOSTIC STEP | | |
| --- | --- | --- |
| [1] CIRCUIT NAME | | |
| | | CIR # LEG POINT |
| [2] THIS STEP | (1-99).(1-99).(1-999): | |
| [3] NEXT IF OK | (0-99).(1-99).(1-999): | |
| [4] NEXT IF BAD | (0-99).(1-99).(1-999): | |
| | | DATA SYNC1 SYNC2 |
| [5] CONNECTOR | (1-9): | |
| [6] DIGITAL PROBE | (1=ON,0=OFF): | |
| [7] ANALOG PROBE | (1=ON,0=OFF): | |
| [8] DATA | (1=ON,0=OFF): | |
| [9] DIRECTION | (1=POS,0=NEG): | |
| [10] I/C NUMBER | (1-ZZZZZ): | |
| [11] PIN NUMBER | (1-#PINS): | |
| [12] PROBE KEY REQUIRED | (Y/N): | |
| [13] TIME/DIV: | | <U>,<M>S,<S> |
| [14] SYNC2 DELAY | (1-32767): | |
| [15] COUNT | (Y/N): | |
| [16] STIMULUS | (WR,RR,WI,RI,DM): | Addr: Data: |
| [17] BUS CAPTURE | (BIT/PIN): | |
| DEFAULT = | | |

The "CIRCUIT NAME" is assigned by the diagnostic writer. To keep with a logical method, it is best to name the circuit pertinent to the circuit being tested. There can be up to twelve alpha-numeric characters or symbols.

"THIS STEP" refers to the step being entered in the diagnostic process.

"In the "NEXT IF" steps, instruct the system where to advance to, "if good" or "if bad".

When entering data in the next seven steps, it should be remembered that SYNC2 is a delay that must occur after SYNC1, before starting the capture.

"CONNECTOR" refers to the four ribbon cable connectors that connect from the multiplex card to the IC's on the unit to be tested. The writer selects the location of these cables, on the IC's, depending on the circuit being tested. (1-9 is the parameter, to allow for expansion at a later date.)

The "DIGITAL PROBE" is the grey probe assembly with a test key (button) on the side of the probe. ON means the probe is being used. OFF means it is unused for this circuit.

The "ANALOG PROBE" is a red and black test wire assembly with a coaxial cable on one end. As with the digital probe, it is either being used, or is not. Entries for analog probe can only go under the DATA column.

"DATA" means that the operator syncs on the data pulse, rather than another sync pulse. Values can only be placed under the SYNC1 and SYNC2 columns, when referring to data. Entering a one here means that the SYNC1 or SYNC2 source will be the data pulse.

"DIRECTION" determines where the sync starts the capture; the negative or positive edge of the sync pulse. Direction can only be entered under the SYNC1 or SYNC2 columns.

"IC NUMBER" refers to where to connect the test cables covered in step one.

"PIN NUMBER" refers to the pin that is generating the signal.

"PROBE KEY REQUIRED: 'yes'" means the momentary switch on the digital probe is used to initiate the capture, but it does not have to be used.

"TIME/DIV" is the same as osciliscope calibration. The parameters are:

<U>S=microseconds [0.05, 0.1, 0.2, 0.5, 1.0, 2.0, 5.0]

<M>S=milliseconds [0.05, 0.1, 0.2, 0.5, 1.0, 2.0, 5.0]

<S>=seconds [0.1, 0.2, 0.5]

"SYNC2 DELAY" is the same as saying SYNC1+a delay. The parameters (1-32767), are in microseconds for internal data delay. For external delay, it is the number of external pulses.

"COUNT" refers to the counting of pulses. SYNC1 starts the count, a second SYNC1 stops the count.

"STIMULUS" is a command condition that allows the operator to perform a stimulus prior to capturing. The parameters are:
WR=WRITE TO TAM
RR=READ FROM RAM
WI=WRITE TO I/O
RI=READ FROM I/O
DM=WRITE DMA PATTERN "BUS CAPTURE" will be "yes" or "no". The bit and pin numbers refer to the IC pin numbers and are used only if the operator is running a bus capture. Up to eight line conditions can be captured at the same time. If NO is entered under bus capture the system will default to a waveform or count capture.

When all data has been inserted press ENTER to capture the waveform.

NOTE: When the first waveform or bus is being captured, after a power on reset, the system will generate the message INITIALIZING before displaying the waveform or bus capture.

The monitor screen shown in FIG. 14A will appear:
(1) THIS STEP refers to the step the operator is entering.
(2) The NEXT IF steps show where diagnostics will advance to after comparing the waveform, during the running of diagnostics.
(3) The next line on the previous screen is an INSTRUCTION STEP. What is shown here, is an example of what might appear. This instruction step depends on what was entered when the diagnostic step was written, but there will not always be a step here.
(4) After pressing ENTER, the waveform will appear with the "WAVEFORM OK" prompt. As diagnostics are written, the system will be dealing with a "KNOWN GOOD" card or board. If the data entered when this diagnostic step was written was correct, the waveform will be correct also.

Another type of waveform it will be necessary to capture is the ANALOG waveform.

To capture the analog waveform, access the write diagnostic step screen, to enter the appropriate data. When capturing an analog waveform, line number [8] DATA, cannot have a SYNC SOURCE value under the data heading. You must have a SYNC SOURCE other than DATA.

Insert the correct information on that monitor screen, then press ENTER, to capture the analog waveform.

The monitor screen shown in FIG. 14B will appear.

If the voltage is greater than plus or minus five volts, the system will automatically adjust to a plus/minus fifteen volt scale.

Compare this waveform with that expected to have been received, then answer the prompt at the bottom of the screen, by pressing a "Y" or an "N", the pressing ENTER to continue.

With the digital and analog waveform captures, the operator was looking at the timing of a specific voltage change. With the BUS CAPTURE one can compare data, addresses, or multiple conditions on eight different pins at one time, and view them as a group.

To run a bus capture routine, access the write diagnostic steps monitor screen. Line [17] BUS CAPTURE will prompt Y/N. To add a bus capture step, select a Y, then press ENTER.

Now insert the pin number of the first bit desired to be captured, then press ENTER. The monitor screen will then appear with bit 0 and the pin indicated. Continue entering pin numbers (0-7), until all data desired to be captured has been entered. Press ENTER again to write this step. The following monitor screen will appear:

(1) "THIS STEP" refers to the step being entered.
(2) "NEXT IF OK" is where to advance to if the data compares.
(3) "NEXT IF CAP" allows for eight possible branch on bit combinations.

| EXAMPLE: | | | | | | | | | |
|---|---|---|---|---|---|---|---|---|---|
| TYPICAL BIT: | 7 | 6 | 5 | 4 | 3 | 2 | 1 | 0 | |
| KNOWN CORRECT COMBINATION: | 1 | 0 | 1 | 0 | 1 | 0 | 1 | 0 | (AA) |
| POSSIBLE BRANCHES: | 1 | 0 | 1 | 0 | 1 | 0 | 1 | 1 | (AB) |
| | 1 | 0 | 1 | 0 | 1 | 0 | 0 | 0 | (A8) |
| | 1 | 0 | 1 | 0 | 1 | 1 | 1 | 0 | (AE) |
| | 1 | 0 | 1 | 0 | 0 | 0 | 1 | 0 | (A2) |
| | 1 | 0 | 1 | 1 | 1 | 0 | 1 | 0 | (BA) |
| | 1 | 0 | 0 | 0 | 1 | 0 | 1 | 0 | (8A) |
| | 1 | 1 | 1 | 0 | 1 | 0 | 1 | 0 | (EA) |
| | 0 | 0 | 1 | 0 | 1 | 0 | 1 | 0 | (2A) |

The above example shows eight possible combinations of bit data. In filling out the bus capture step, if the data matched, the system would branch to the NEXT IF OK step. Each of the NEXT IF CAP (capture) steps will have a "go to" point assigned to it also. If one of these character combinations match, the system will branch to the accompanying step.

If the data being captured is bit significant, then this multi-way branch can eliminate up to eight inidividual tests, on eight individual circuits.

(4) If none of the above combinations match the system will branch to whatever the NEXT IF NOT (bad) step instructs.

NOTE: If 0-2-0 was entered as a "go to" step under NEXT IF OK, the system will call out an IC number error. If 0-2-0 was entered under NEXT IF NOT, the system will end the session.

Press ENTER to continue.

The next frame shows the bus capture comparison screen, along with any pertinent instruction steps.

| THIS STEP: | N.N.N |
|---|---|
| NEXT IF OK: | N.N.N |
| NEXT IF BAD: | N.N.N |
| PLACE DATA PROBE ON IC# NN | PIN: NN |
| PRESS ENTER KEY WHEN READY | |
| EXPECTED BUS CAPTURE | |
| BIT    7   6   5   4   3   2   1   0 | |
| 0   1   0   0   1   0   0   0 | |
| IS BUS CAPTURE OK ? (Y/N) | |

Compare the above data with what was expected to be

| CARD # N - BUS CAPTURE STEP | | | | |
|---|---|---|---|---|
| | | CIR | LEG | POINT |
| THIS STEP | (1-99).(1-99).(1-999).: | NN | NN | NNN |
| NEXT IF OK | (0-99).(1-99).(1-999).: | NN | NN | NNN |
| [1] NEXT IF CAP=( ) | | | | |
| [2] NEXT IF CAP=( ) | | | | |
| [3] NEXT IF CAP=( ) | | | | |
| [4] NEXT IF CAP=( ) | | | | |
| [5] NEXT IF CAP=( ) | | | | |
| [6] NEXT IF CAP=( ) | | | | |
| [7] NEXT IF CAP=( ) | | | | |
| [8] NEXT IF CAP=( ) | | | | |
| NEXT IF NOT | (0-99).(1-99).(1-999).: | 0 | 2 | 0 |
| Enter [D]elete, [C]apture, line# to change or press [Enter] | | | | |

In the bus capture function the PC1 issues a stimulus command one time to the Data Capture Device 5, then it issues eight separate stimulus and read comments, to get the eight bits of data.

received, then answer (Y) yes, or (N) no, then press ENTER when ready.

To make any changes to the diagnostic steps, access the add/change diagnostic steps menu screen, select a 2, then press ENTER. The following monitor screen will appear:

| CHANGE DIAGNOSTIC STEP | | | |
|---|---|---|---|
| Card # | Circuit # | Leg # | Point # |
| N | N | N | N |

(1) The CARD NUMBER was assigned when the IC and connector list was created.
(2) CIRCUIT, LEG and POINT numbers are entered for the step wished to be changed.

Press ENTER, after each entry has been made, then once again, to advance to the next monitor screen. The following monitor screen will appear:

| CARD # N - DIAGNOSTIC STEP | | |
|---|---|---|
| [1] CIRCUIT NAME: | | |
| | | CIR # LEG POINT |
| [2] THIS STEP | (1-99).(1-99).(1-999).: | |
| [3] NEXT IF OK | (0-99).(1-99).(1-999).: | |
| [4] NEXT IF BAD | (0-99).(1-99).(1-999).: | |
| | | DATA SYNC1 SYNC2 |
| [5] CONNECTOR | (1-9): | |
| [6] DIGITAL PROBE | (1=ON,0=OFF): | |
| [7] ANALOG PROBE | (1=ON,0=OFF): | |
| [8] DATA | (1=ON,0=OFF): | |
| [9] DIRECTION | (1=POS,0=NEG): | |
| [10] I/C NUMBER | (1-ZZZZZ): | |
| [11] PIN NUMBER | (1-#PINS): | |
| [12] PROBE KEY REQUIRES | (Y/N): | |
| [13] TIME/DIV: | | $<U>S,<M>S,<S>$ |
| [14] SYNC2 DELAY | (1-32767): | |
| [15] COUNT | (Y/N): | |
| [16] STIMULUS | (WR,RR,WI,RI,DM): | Addr: Data: |
| [17] BUS CAPTURE | (BIT/PIN): | |
| Enter [D]elete, [C]apture, line # to change or press [Enter] | | |

The data entered will appear on the above screen. If any changes are necessary, insert the line number to make the changes to, then press ENTER again. Make the needed change(s) and press ENTER to write the change in the system.

"C" allows the re-capture a previously captured waveform, but or count without changing any parameters on this screen. If no "C" is entered and no changes are made on this screen, ENTER will bypass this step.

| ISG DIAGNOSTICS AUTHORING FACILITY |
|---|
| Current card - N P/N - N |
| [0] End session |
| [1] Create IC and connector list |
| [2] Add/change diagnostic steps |
| [3] Review diagnostic steps |
| [4] Change IC or connector list |
| [5] Create/change a driver |
| [6] Run diagnostics |
| [7] Create/change start point |
| [8] Create/change instruction step |
| [9] Create/change branching instruction |
| [10] Change current card |
| Selection: 6 |

Run diagnostics is the procedure used to check the steps which were entered in the system.

To run diagnostics, access the main menu screen (FIG. 12A), select a "6", then press ENTER. The following monitor screen will appear (FIG. 12V):

| RUN DIAGNOSTIC PROGRAM |
|---|
| Card #: N |
| Enter [R] to return to main menu |
| Enter a number between 0 and 3 to set retry function |
| [F1]=RESTART AT    [F10]GO BACK TO PREVIOUS |
| ENTRY STEP    INSTRUCTION STEP |

(1) The RETRY function, referred to above, is used to run the waveform capture routine, as many as three times. The reason for this is that a waveform may not always match what is expected the first time it is run.
(2) The [F1] RESTART function instructs the system to return to the beginning entry step of the run diagnostics procedure.
(3) The [F10] GO BACK TO function instructs the system to go back to the previous instruction step.

When ready to run diagnostics, press ENTER. The following monitor screen will appear:

| RUN DIAGNOSTIC PROGRAM |
|---|
| Card #: N |
| INITIALIZING ... |

The term INITIALIZING refers to the beginning of the run diagnostics procedure. This term will only appear if the system has been powered off, then on again (POR).

After initialization has taken place, the term DELAY=, will appear. The delay value refers to the taps on the delay line that synchronize the Testing Device with the Unit Under Test 6. The delay value should be either "2", "3", "4" or "5". If the value is higher, it is an indiciation that there is a potential problem with the Testing device 5.

The monitor screens that will appear during the diagnostic run will vary, depending on what test is being run. For example, when the system is instructed to capture a bus or waveform, the monitor screen will appear with the EXPECTED and ACTUAL captures, on the bottom of the monitor screen. The diagnostic run will not continue until ENTER has been pressed, answering the prompt below the captures.

If the diagnostic test completes without a failure, the screen will appear with the message, DIAGNOSTICS COMPLETED.

| ISG DIAGNOSTICS AUTHORING FACILITY |
|---|
| Current card - N    P/N - N |
| [0] End session |
| [1] Create IC and connector list |
| [2] Add/change diagnostic steps |
| [3] Review diagnostic steps |
| [4] Change IC or connector list |
| [5] Create/change a driver |
| [6] Run diagnostics |
| [7] Create/change start point |
| [8] Create/change instruction step |
| [9] Create/change branching instruction |
| [10] Change current card |
| Selection: 8 |

The operator of the Testing device 5 will need to have prompts stating where to attach cables, probes, connectors, etc. The diagnostic writer will need to tell the system when to have these prompts appear on the monitor screen. These prompts are referred to as INSTRUCTION STEPS.

Instruction steps can appear at any time, depending on the board or card for which diagnostics are being written.

Certain instruction step prompts are standardized, while others are up to the discretion of the writer.

To create an instruction step(s), access the main menu (FIG. 12A), insert an 8 in the space provided, then press ENTER. The following monitor screen will appear (FIG. 12X):

| INSTRUCTION STEP |
|---|
| [0] Return to main menu |
| [1] Create new instruction step |
| [2] Change existing instruction step |
| Selection: N |

To create a new instruction step, insert a 1 in the space provided, then press ENTER. The following monitor screen will appear:

| NEW INSTRUCTION STEP | | | |
|---|---|---|---|
| Card number: N | Cir # | Leg # | Point # |
| This step: N | 00 | 01 | 001 |
| Next step: N | NN | NN | NNN |

UNDER FIRST STEP:
(1) The Cir and Leg #'s are assigned by the system.
(2) The Point # is assigned by the system and increments up one digit for every instruction step written.

UNDER NEXT STEP:
(1) The Cir, Leg and Point #'s are assigned by the writer, depending on the direction to be chosen in the trouble-shooting routine.

In the above step it was decided when and where the first instruction step is to appear and where the system should advance to on the next step.

When ready to write this step into the system press ENTER. The following monitor screen will appear:

| INSTRUCTION |
|---|
| [1] CONNECT SYNC (#) PROBE TO IC # (###), PIN # (##) |
| [2] PLUG CABLE # (#) INTO CONNECTOR # (#) |
| [3] ATTACH CABLE # (#) TO IC # (###) |
| [4] OTHER |
| [5] NONE |
| Selection: N |

(1) The above selections (1, 2, and 3) should be self-explanatory. When filling in variables (#), pressing ENTER will advance the prompt to the next variable to be entered.

(2) Selection 4 refers to the optional instruction step to be used to write instruction test.

(3) Selection 5 will write the file and return to the instruction step menu, without entering any instruction text.

After writing the instruction step, press ENTER to write this portion of the instruction step file. The following monitor screen will appear:

| CONTINUATION MESSAGE |
|---|
| [1] PRESS [ENTER] WHEN READY |
| [2] PRESS PROBE KEY WHEN READY |
| [3] OTHER |
| [4] NONE |

(1) The above screen is a continuation of the screen shown on the preceeding page. After instructing an operator to attach a cable, etc., to a particular point or IC, the continuation message will appear at the bottom of the instruction message screen.

(2) Continuation message selection "3 OTHER" is another optional message that depends on the particular diagnostic step being written.

After inserting the instruction and continuation messages, press ENTER to write the instruction step. The message INSTRUCTION STEP COMPLETED will appear at the bottom of the monitor screen, then will advance to the instruction step menu.

If "4" is selected on the instruction screen, or "3" on the continuation screen, the following monitor screen will appear:

| INSTRUCTION |
|---|
| [1] ............................................. |
| [2] ............................................. |
| [3] ............................................. |
| [4] ............................................. |
| [5] ............................................. |
| [6] ............................................. |
| Selection: 4 |

(1) The above monitor screen shows the selection (4) inserted on the instruction message screen. ("Other(3)", on the continuation message screen only gives one line for text entering).

(2) This screen allows one to enter up to six lines of information, under one instruction. All lines typed in will be listed as one instruction. The numbers [1-6], refer only to the amount of available lines.

Type in the instruction message then press ENTER to write the file and return to the instruction step menu screen.

To change an instruction step, access the instruction step menu, select a "2", then press ENTER. The following monitor screen will appear:

---
CHANGE INSTRUCTION STEP
---
Card number: N
N INSTRUCTION STEPS ON FILE
ENTER NUMBER OF STEP YOU WISH TO CHANGE: N
---

The above screen shows the number of instruction steps already written.

Insert the number of the step to change, then press ENTER. The following monitor screen will appear:

---
INSTRUCTION STEP - CARDNUMBER N

|  | Cir # | Leg # | Point # |
|---|---|---|---|
| This step: | 00 | 01 | NNN |
| [A] Next step: | NN | NN | NNN |
| [B] NO INSTRUCTION MESSAGE | | | |
| [C] NO CONTINUATION MESSAGE | | | |

Enter [D]elete, line to change or press [Enter]:
---

(1) Change the "NEXT STEP" instruction to whatever direction is needed.

(2) To change an instruction message, select [B] to advance to the instruction message menu screen.

(3) To change a continuation message, select [C] to advance to the continuation message menu screen.

When the changes have been made press ENTER, to write the file and return to the create/change menu.

The branching instruction is a diagnostic step that allows the writing of multi-way branches, depending on a particular circuit. Instructions can also be repeated to save time and to act as a delay, if necessary.

To create a new branching instruction, access the main menu (FIG. 12A) shown below, insert a "9" in the space provided, then press ENTER.

---
ISG DIAGNOSTIC AUTHORING FACILITY
Current card - N    P/N - N
---
[0] End session
[1] Create IC and connector list
[2] Add/change diagnostic steps
[3] Review diagnostic steps
[4] Change IC or connector list
[5] Create/change a driver
[6] Run diagnostics
[7] Create/change start point
[8] Create/change instruction step
[9] Create/change branching instruction
[10] Change current card
    Selection: 9
---

The following monitor screen will appear (FIG. 12Y):

---
CREATE/CHANGE BRANCHING INSTRUCTION
---
[0] Return to main menu
[1] Create new branching instruction
[2] Change existing branching instruction
    Selection: N
---

To create a new branching instruction insert a "1" in the space provided, then press ENTER. The following monitor screen will appear:

---
NEW BRANCHING INSTRUCTION

| Card number: N | Cir # | Leg # | Point # |
|---|---|---|---|
| This step: | 00 | 50 | NNN |
| Branching step: | NN | NN | NNN |
| Next step if count = NN | NN | NN | NNN |
| Next step if count = NN | NN | NN | NNN |
| Next step if count = | | | |
| Next step if count = | | | |
| Next step if count = | | | |
| Next step if count = | | | |
| Next step if count = | | | |
| Next step if count = | | | |
| Next step if count = | | | |
| Next step if count = | | | |
| Next step if not: | NN | NN | NNN |
---

(1) "THIS STEP" refers to the previous step before entering the branching instruction step.

(2) The CIRCUIT and LEG numbers will always be 00 and 50, respectively, for branching instructions.

(3) The POINT numbers are sequentially assigned by the system.

(4) The author can specify up to ten branch-to steps to call next, depending on how many times the "branching step" has run.

(5) If the BRANCHING STEP has not run the number of times specified in any of the ten choices, then the NEXT STEP IF NOT step is called out. The counter for the branching instruction driver is located in the system software. Count numbers can have values up to 999.

(6) When all necessary data has been inserted press ENTER to receive the message, BRANCHING STEP WRITTEN. The system will then return to the create/change menu.

To change an existing branching instruction, access the create/change branching instruction menu, select a 2, then press ENTER. The following screen will appear:

---
CHANGE BRANCHING INSTRUCTION
---
Card number: N
N BRANCHING INSTRUCTIONS IN FILE
ENTER NUMBER OF STEP YOU WISH TO CHANGE: N
---

Insert the number of the step to be changed, then press ENTER to make the changes. The following monitor screen will appear:

---
BRANCHING INSTRUCTION - CARDNUMBER N

|  | Cir # | Leg # | Point # |
|---|---|---|---|
| This step: | 00 | 50 | NNN |
| [A] Branching step: | NN | NN | NNN |
| [B] Next step if count = : N | NN | NN | NNN |
| [B] Next step if not: | NN | NN | NNN |

Type [A]dd, [C]hange, [D]elete or press [Enter]
---

(1) To make changes to the above data select a "C", then press ENTER.

(2) The screen will appear with the message ENTER ROW TO CHANGE. Select the line entry to be changed, insert the associated alpha character, then press ENTER.

(3) Insert the data to be changed, pressing ENTER, after each entry.

When all correct data has been inserted press ENTER, to write the file and return to the create/change menu screen.

With the review diagnostics function the diagnostic writer can view the written steps on the screen, print out a summary or detailed list, or print out a circuit failure report.

| ISG DIAGNOSTICS AUTHORING FACILITY |
|---|
| Current card - N    P/N - N |
| [0] End session |
| [1] Create IC and connector list |
| [2] Add/change diagnostic steps |
| [3] Review diagnostic steps |
| [4] Change IC or connector list |
| [5] Create/change a driver |
| [6] Run diagnostics |
| [7] Create/change start point |
| [8] Create/change instruction step |
| [9] Create/change branching instruction |
| [10] Change current card |
| Selection: 3 |

To access the review diagnostics function, insert a "3" in the space provided on the above monitor screen, then press ENTER. The following monitor screen will appear (FIG. 12D):

| REVIEW DIAGNOSTICS |
|---|
| [0] Return to main menu |
| [1] Video summary |
| [2] Printed summary |
| [3] Printed detail |
| [4] Failure report |
| Selection: N |
| Card number: NN |

To view a VIDEO SUMMARY, insert a "1" in the space provided, then press ENTER.

The prompt CARD NUMBER will appear. Insert the number of the card or board for which diagnostics are being written, then press ENTER. Below is an example of a typical video summary screen.

(2) Each monitor screen will hold up to 17 lines of data. To advance to the next monitor screen press ENTER, after viewing the data on the first screen.

(3) The above steps are listed in the order entered into the system.

(4) When the end of the steps list is reached, the message, END OF LIST . . . PRESS ANY KEY TO CONTINUE, will appear. Answer this prompt to return to the review diagnostics menu. The following monitor screen will appear:

| REVIEW DIAGNOSTICS |
|---|
| [0] Return to main menu |
| [1] Video summary |
| [2] Printed summary |
| [3] Printed detail |
| [4] Failure report |
| Selection: N |

Selection 2 refers to the PRINTED SUMMARY of the data viewed when a 1 was selected from the above menu. To print out this summary, insert a 2 in the space provided, the press ENTER.

While the summary is printing, the message OUTPUT TO PRINTER, will appear on the screen and remain there until the complete summary has been printed. The only way to exit this mode is to perform a RE-IPL (Initial Program Load) of the PC1. The following monitor screen will appear:

| REVIEW DIAGNOSTICS |
|---|
| [0] Return to main menu |
| [1] Video summary |
| [2] Printed summary |
| [3] Printed detail |
| [4] Failure report |
| Selection: N |

The summary printed only listed the steps, one by one. The PRINTED DETAIL list will print out every step, along with every parameter entered. If is a com-

| REVIEW DIAGNOSTICS | | | | | | | | | |
|---|---|---|---|---|---|---|---|---|---|
| Card #0010 MEMORY EXPANSION OPTION EC Level 55555 First step: 0019001 | | | | | | | | | |
|  | This circuit | | | Next if ok | | | Next if bad | | |
| Name | Cir # | Leg # | Pnt # | Cir # | Leg # | Pnt # | Cir # | Leg # | Pnt # |
| I/C LIST | 51 | ICS | | | | | | | |
| INSTRUCTION | 0 | 1 | 1 | 0 | 0 | 0 | 0 | 0 | 0 |
| INSTRUCTION | 0 | 1 | 2 | 0 | 3 | 3 | 0 | 0 | 0 |
| INSTRUCTION | 0 | 1 | 3 | 0 | 1 | 1 | 0 | 0 | 0 |
| INSTRUCTION | 0 | 1 | 4 | 50 | 2 | 2 | 0 | 0 | 0 |
| WRITE UUT RAM | 0 | 10 | 1 | 0 | 0 | 0 | 0 | 0 | 0 |
| WRITE UUT RAM | 0 | 10 | 2 | 0 | 0 | 0 | 0 | 0 | 0 |
| WRITE UUT RAM | 0 | 10 | 2 | 0 | 0 | 0 | 0 | 0 | 0 |
| READ UUT RAM | 0 | 11 | 1 | 0 | 0 | 0 | 0 | 0 | 0 |
| WRITE DMA RAM | 0 | 16 | 1 | 0 | 0 | 0 | 0 | 0 | 0 |
| UUT MEM REFRESH | 0 | 19 | 1 | 51 | 1 | 1 | 0 | 0 | 0 |
| SET DELAY | 0 | 25 | 1 | 50 | 1 | 1 | 0 | 0 | 0 |
|  | 11 | 11 | 1 | 0 | 0 | 0 | 0 | 0 | 0 |
|  | 14 | 1 | 14 | 0 | 0 | 0 | 0 | 0 | 0 |
| MEM EXPAND | 50 | 1 | 1 | 50 | 1 | 2 | 0 | 2 | 0 |
| WRITE 2 | 50 | 1 | 2 | 50 | 1 | 3 | 0 | 2 | 0 |
| WRITE 3 | 50 | 1 | 3 | 50 | 1 | 4 | 0 | 2 | 0 |
| Press any key to continue | | | | | | | | | |

(1) On the top line the FIRST STEP data, the first step is Cir—00, Leg—19, Point—001. This is the step entered as the start point.

plete listing of all data entered, either under a single circuit, a circuit and leg, or all steps.

To run a printed detail insert a "3" in the space provided, then press ENTER. The following monitor screen will appear:

| PRINT DETAIL |
| --- |
| [0] Return to review menu |
| [1] Print all steps |
| [2] Print a single circuit |
| [3] Print a single circuit/leg |
| Selection: N |
| Circuit: NN Leg: NN |

(1) The above monitor screen shows three different modes of print detail.
(2) PRINT ALL STEPS will print all diagnostic steps written in detail. This monitor screen will appear just as it does when diagnostic step was written for every individual circuit.
(3) PRINT A SINGLE CIRCUIT appears in the same format as if printing all steps, but only prints a particular circuit. (The leg prompt would not appear.)

| EXAMPLE: | Cir # | Leg # | Point # |
| --- | --- | --- | --- |
|  | 00 | 19 | 001 |
|  | 00 | 19 | 002 |
|  | 00 | 19 | 003 |
|  | 00 | 19 | 004 |
|  | 00 | 17 | 010 |

If the above points were part of the diagnostic steps and circuit 00 was selected to be printed, circuit 01 would not print, even with the same leg number as circuit 00. All circuits beginning with 00 would print, no matter what leg or point accompanied them.
(4) PRINT A SINGLE CIRCUIT/LEG would instruct the system to print whatever circuit AND leg it was instructed to print. (Both the circuit and leg prompts would have appeared.)

| EXAMPLE: | Cir # | Leg # | Point # |
| --- | --- | --- | --- |
|  | 00 | 17 | 001 |
|  | 00 | 17 | 002 |
|  | 00 | 17 | 003 |
|  | 00 | 16 | 004 |

In the above example, if circuit 00, leg 17 was selected to be printed, only the first two lines shown would print. In the last two lines, either the circuit OR the leg differed from what was selected. Both values selected must be correct or those lines will not print out.

While the system is printing, the message OUTPUT TO PRINTER will appear on the screen and remain until all requested data has been printed.

When all requested data has been printed press ENTER, twice, to return to the review diagnostic menu. The following monitor screen will appear:

| REVIEW DIAGNOSTICS |
| --- |
| [0] Return to main menu |
| [1] Video summary |

| REVIEW DIAGNOSTICS -continued |
| --- |
| [2] Printed summary |
| [3] Printed detail |
| [4] Failure report |
| Selection: N |
| Card number: NN |

The FAILURE REPORT is a list of all failures in any circuit when in the run diagnostics function.

To print the failure report insert a "4" in the space provided, then press ENTER.

When the CARD NUMBER prompt appears, insert the card number in the space provided, then press ENTER.

When ENTER is pressed after inserting the card number, the failure report will immediately begin printing out, if the printer is turned on. The print out should appear as follows:

| FAILURE REPORT - CARD NUMBER: NNNN - DATE | | | | | | | | |
| --- | --- | --- | --- | --- | --- | --- | --- | --- |
| IC # | FAILURES | PERCENT | IC # | FAILURES | PERCENT | IC # | FAILURES | PERCENT |
| 12 | 2 | 11.1 | 50 | 10 | 55.6 | 47 | 5 | 27.8 |
| 48 | 1 | 5.6 | | | | | | |
| TOTAL FAILURES = 18 | | | | | | | | |

The above monitor screen is just an example screen to use as a reference. The failure print out could have more or less data printed.

The date in the upper right hand corner of the above monitor screen refers to the date the failure report is run.

Once the failure report begins to print, this mode cannot be exited until the entire report has been printed, unless a RE-IPL of the PC is performed.

When the report finishes printing out, press ENTER three times to return to the main menu.

| ISG DIAGNOSTIC AUTHORING FACILITY |
| --- |
| Current card - N    P/N - N |
| [0] End session |
| [1] Create IC and connector list |
| [2] Add/change diagnostic steps |
| [3] Review diagnostic steps |
| [4] Change IC or connector list |
| [5] Create/change a driver |
| [6] Run diagnostics |
| [7] Create/change start point |
| [8] Create/change instruction step |
| [9] Create/change branching instruction |
| [10] Change current card |
| Selection: 0 |

To end a session, insert a "0" in the space provided, then press ENTER.

The monitor screen will appear with the message SESSION ENDED, then advance to the PC1 DOS (C>) screen.

Any time ENTER is pressed while in this menu screen, without any selection being entered, the session will end and return to DOS.

DIAGNOSTIC OPERATING SYSTEM (DIOS)

Figure 13A:
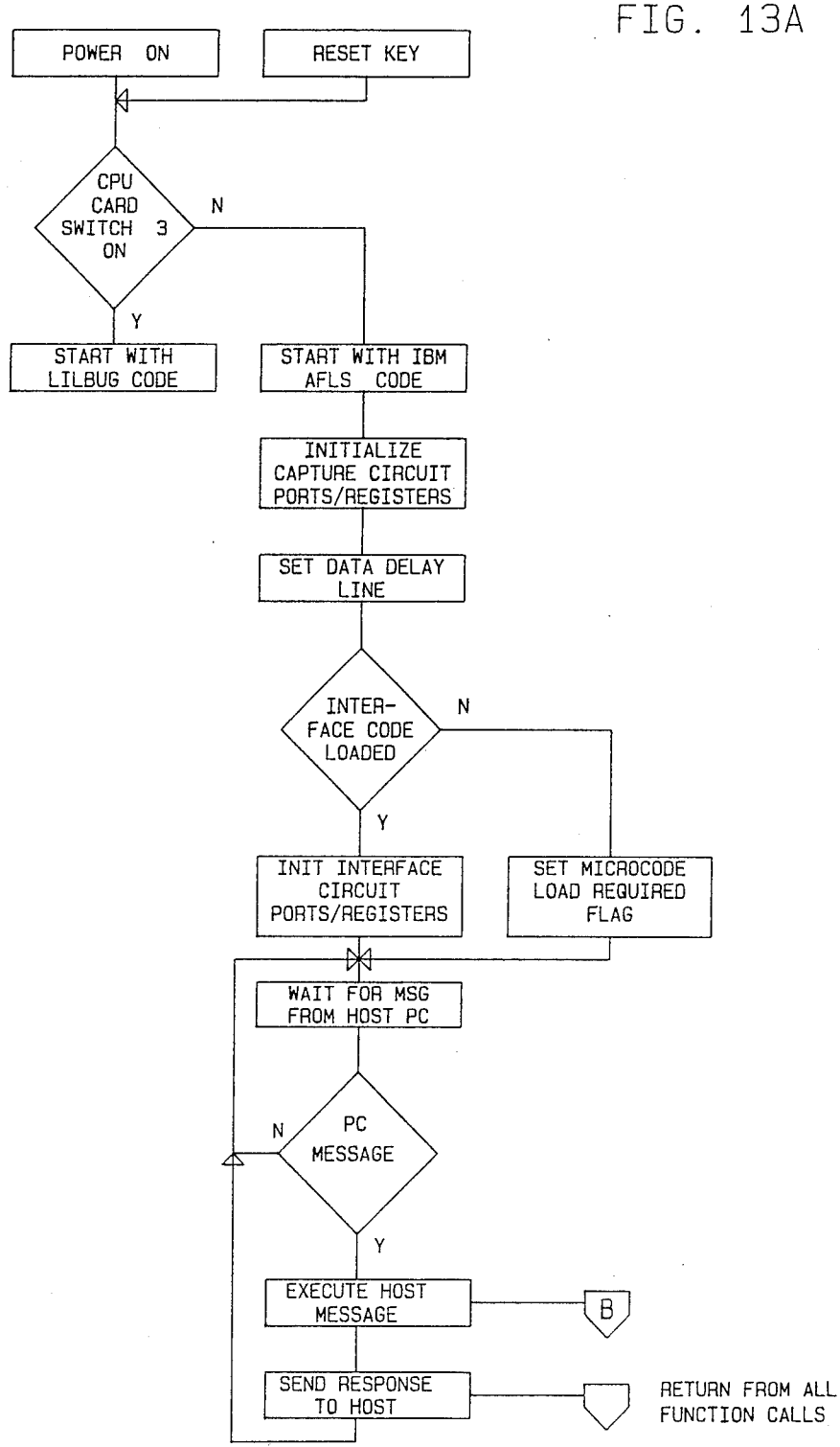
FIGS. 13A-VV are flow charts illustrating the operation of the Automatic Fault Locator System of the present invention.
Figure 13B:
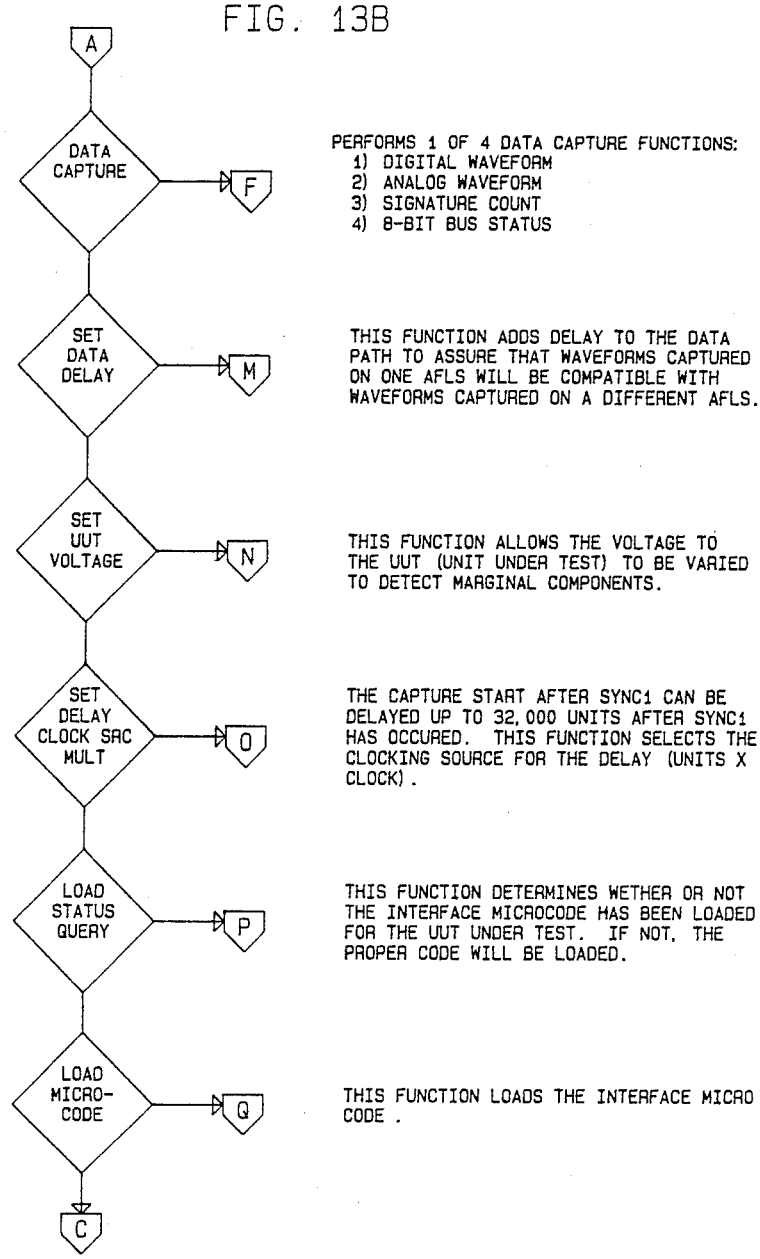
Figure 13C:
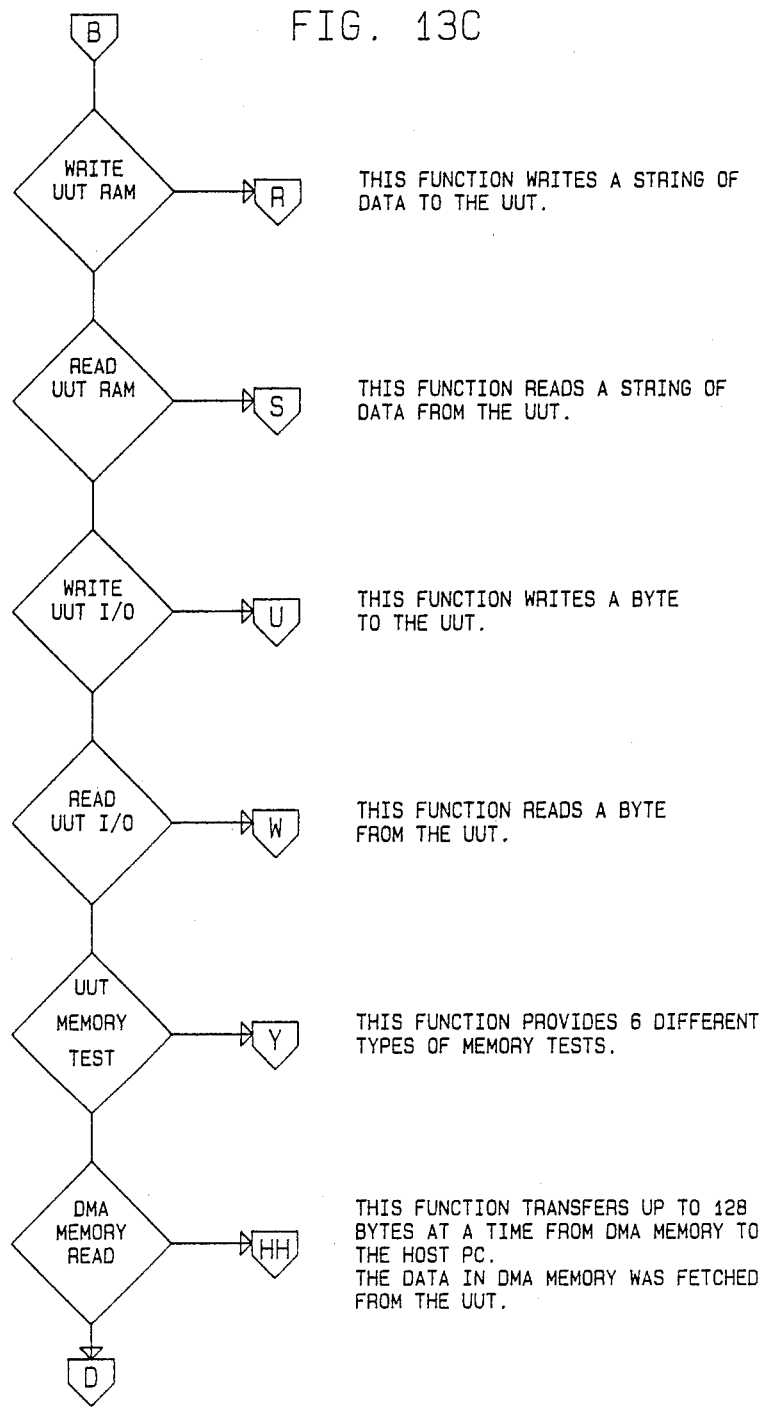
Figure 13D:
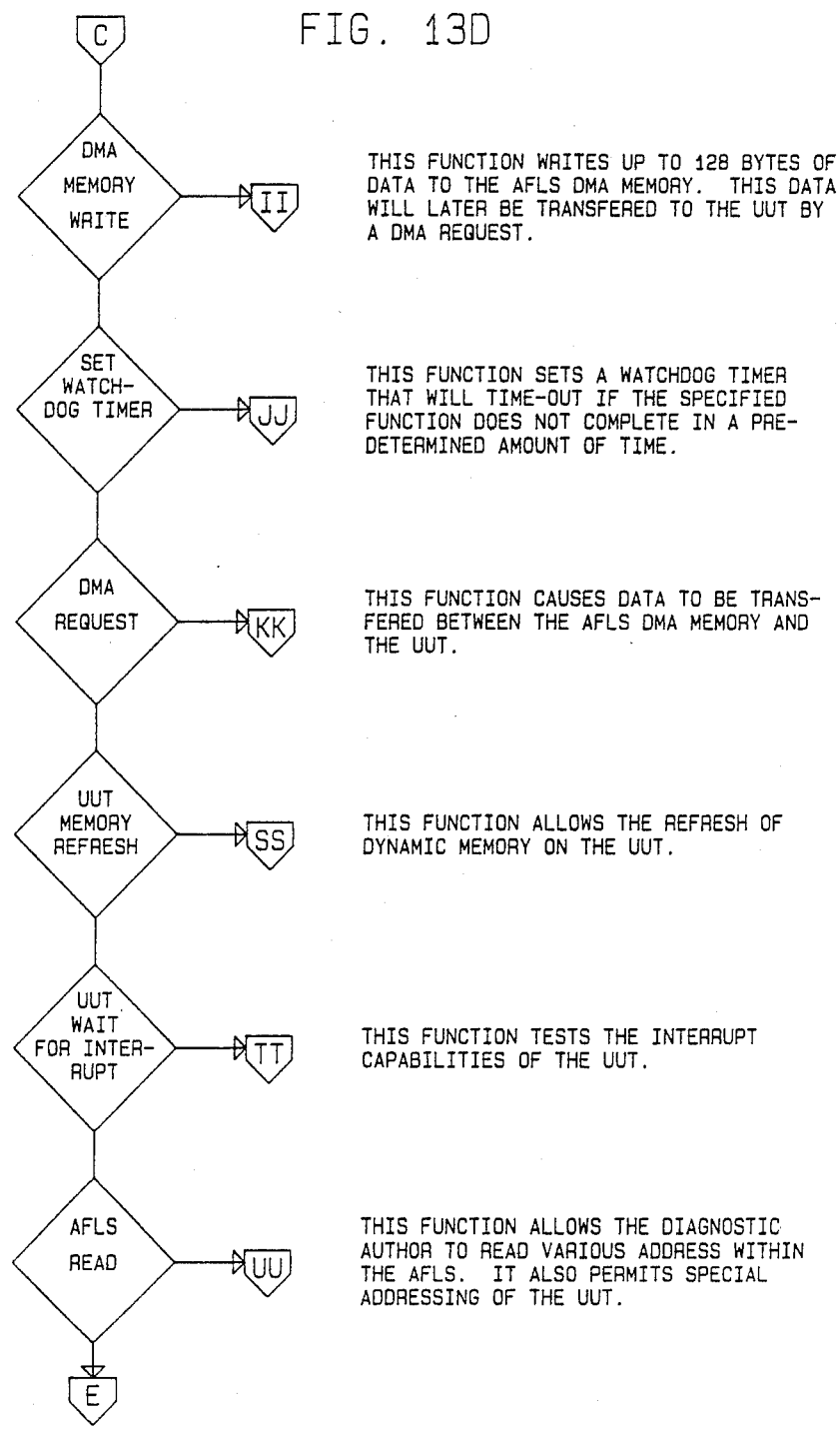
Figure 13E:
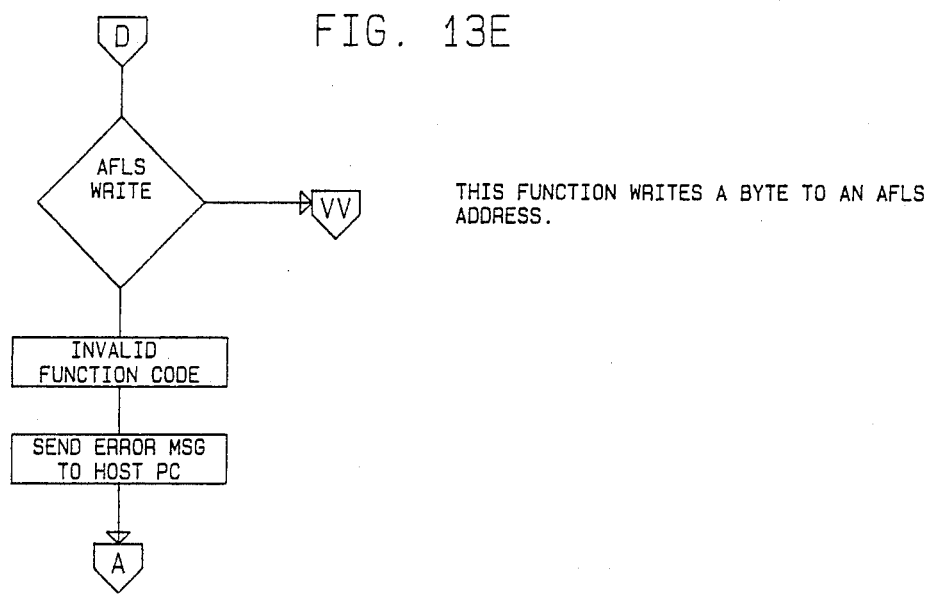
Figure 13F:
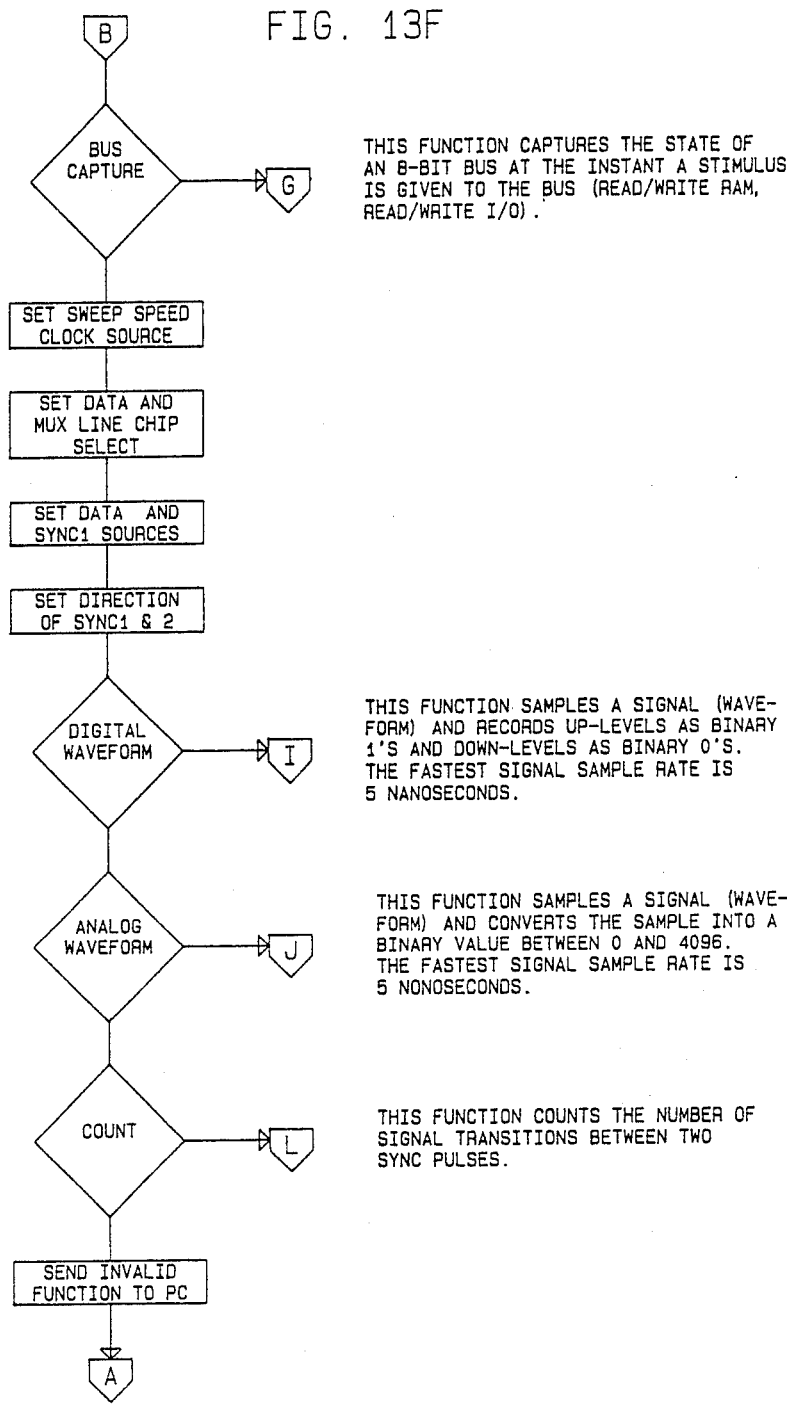
Figure 13G:
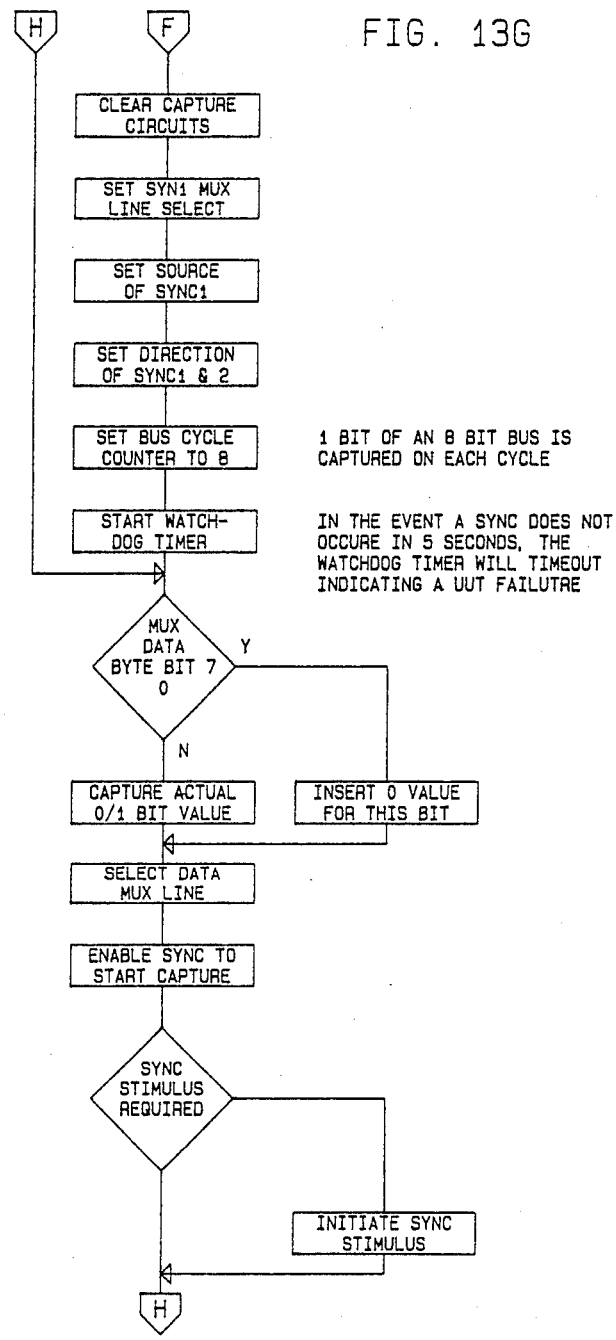
Figure 13H:
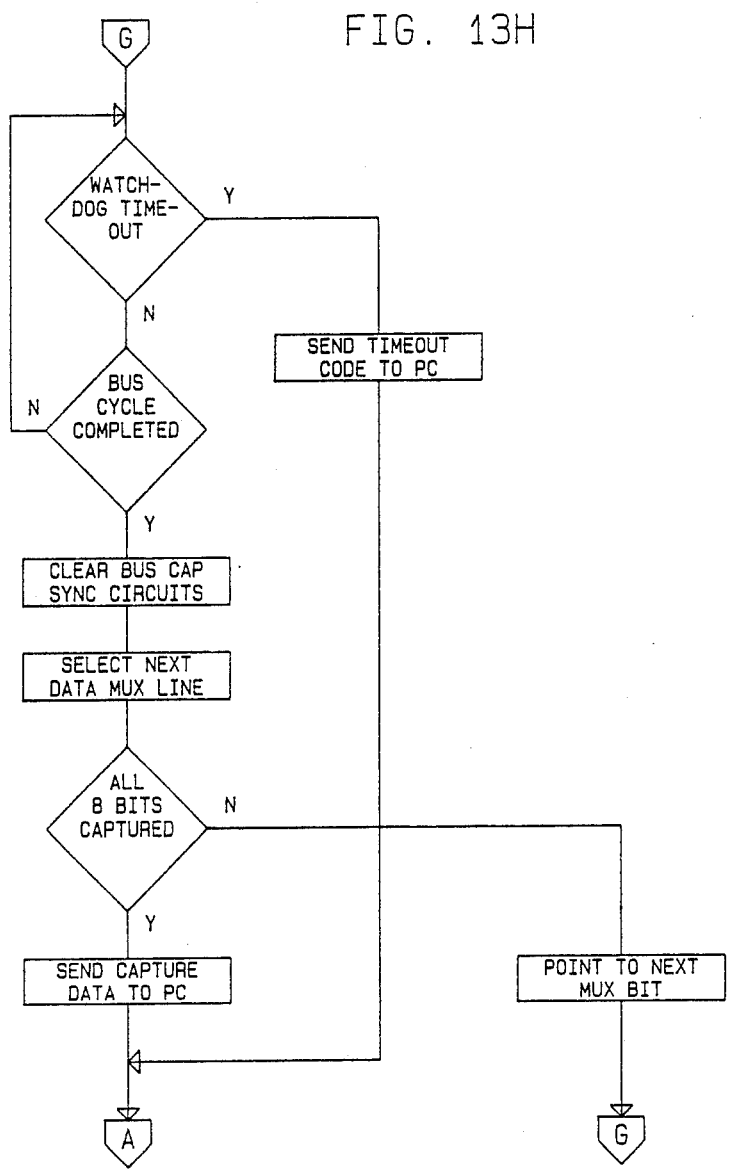
Figure 13I:
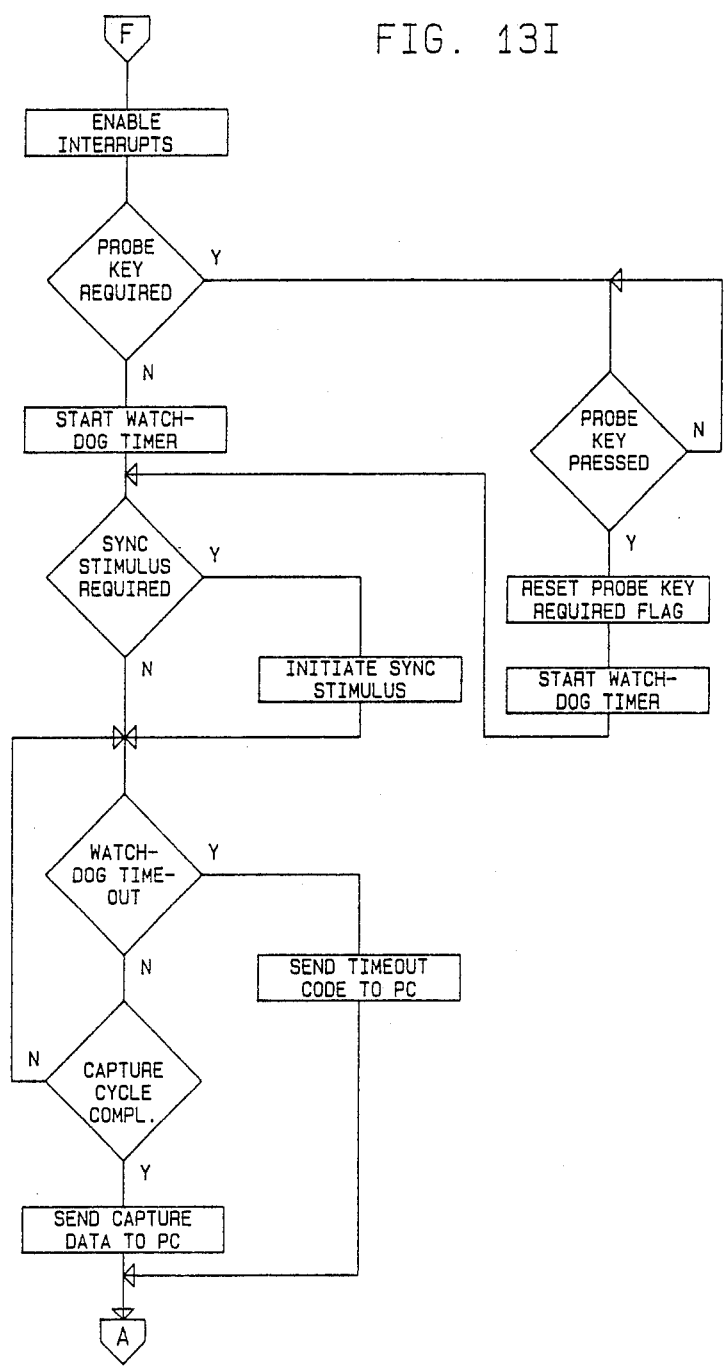
Figure 13J:
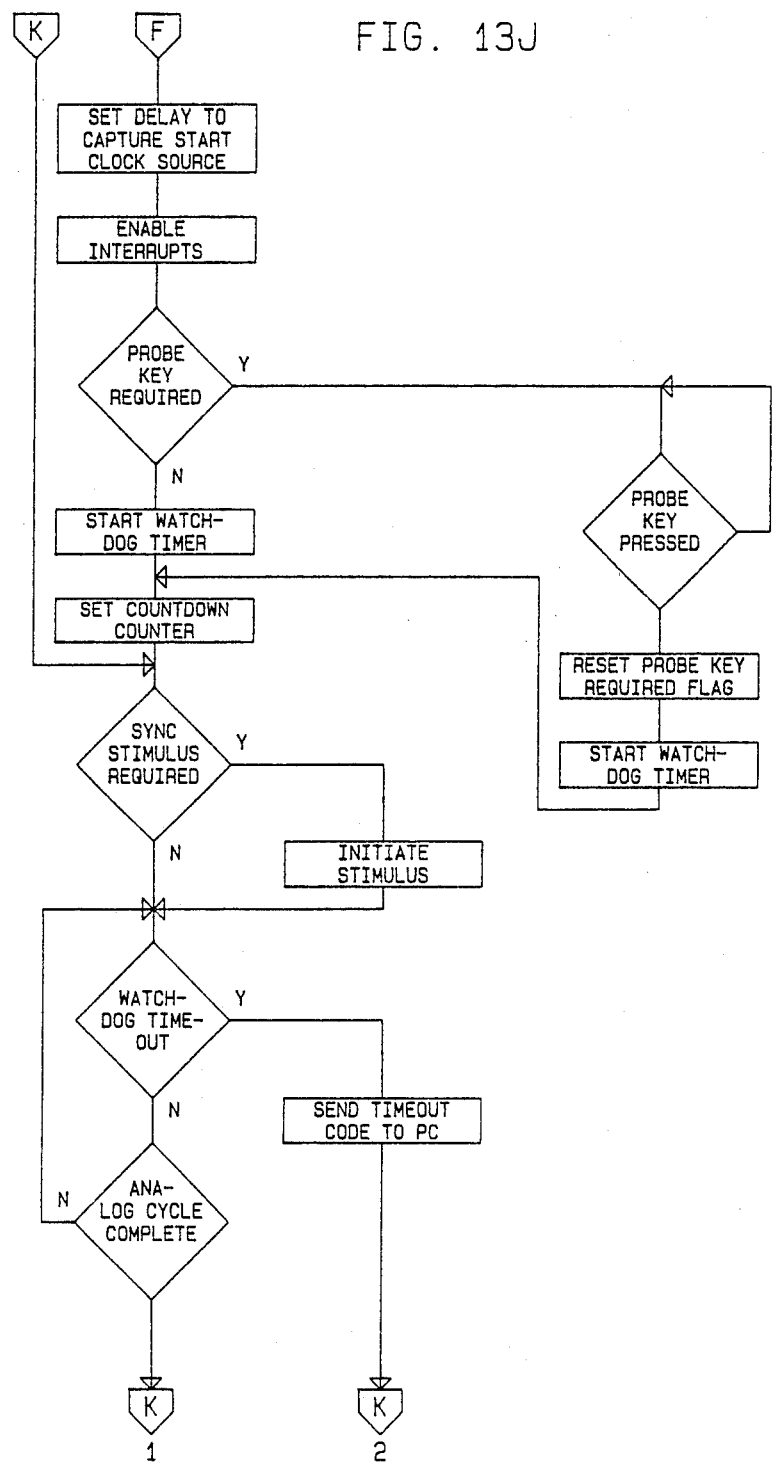
Figure 13K:
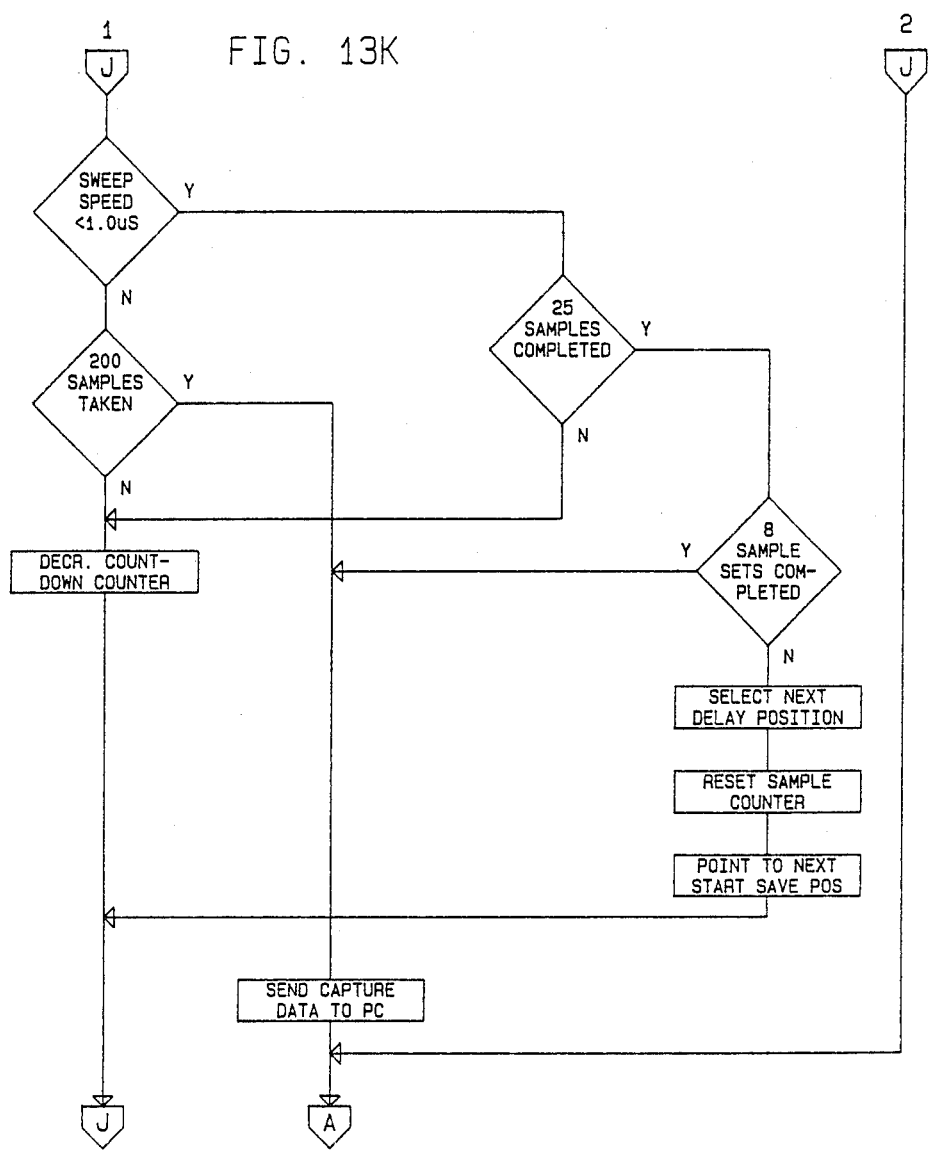
Figure 13L:
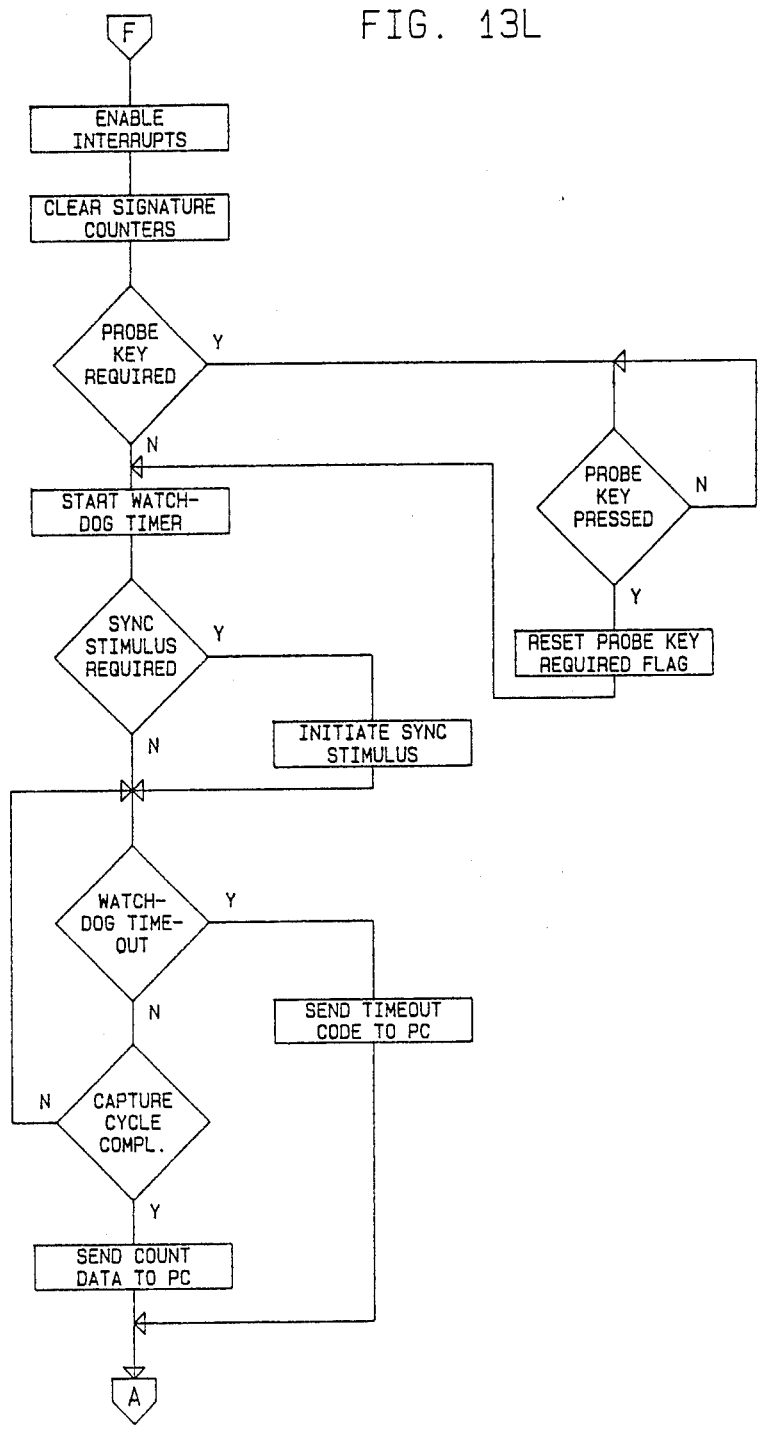
Figure 13M:
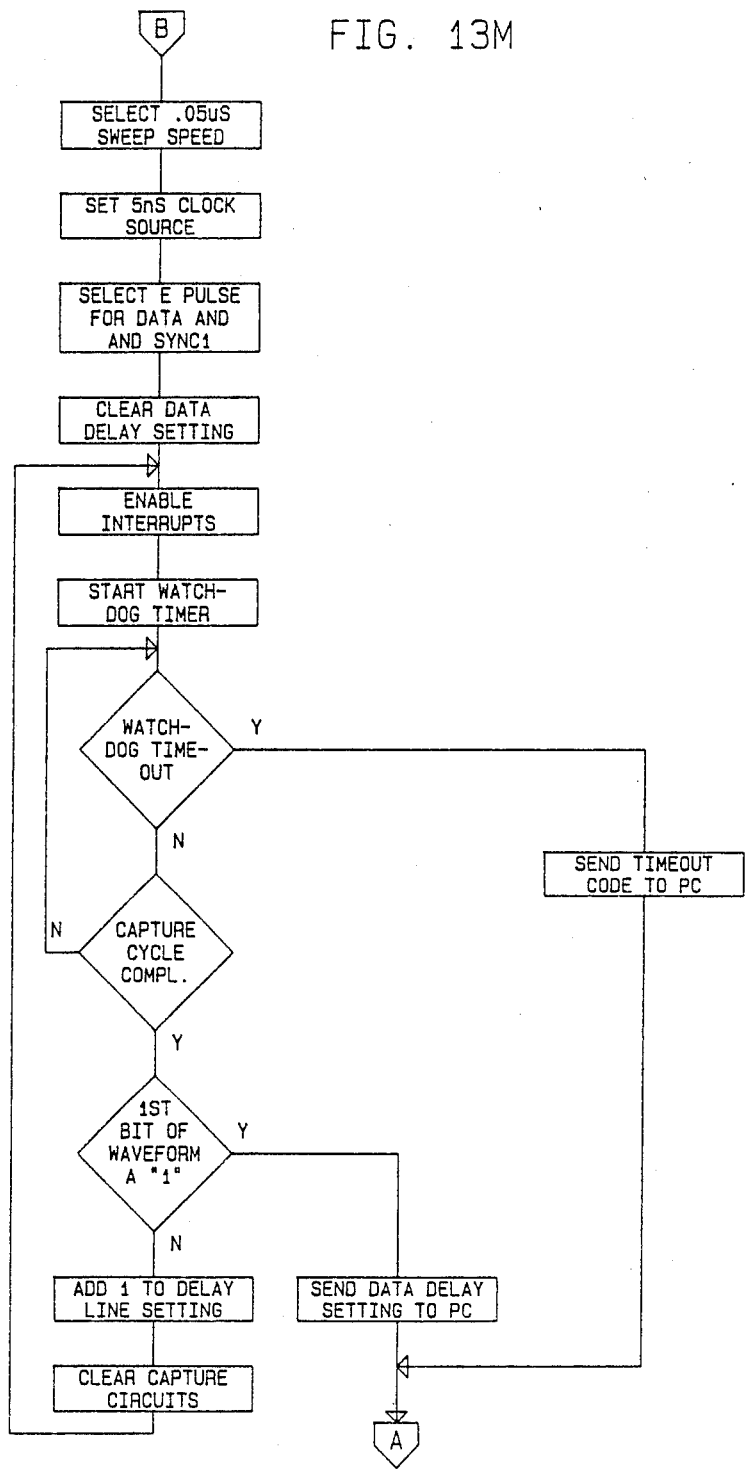
Figure 13N:
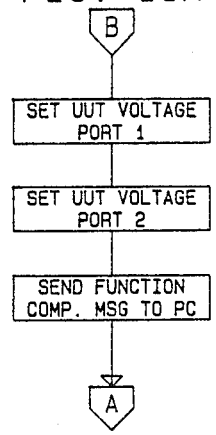
Figure 13O:
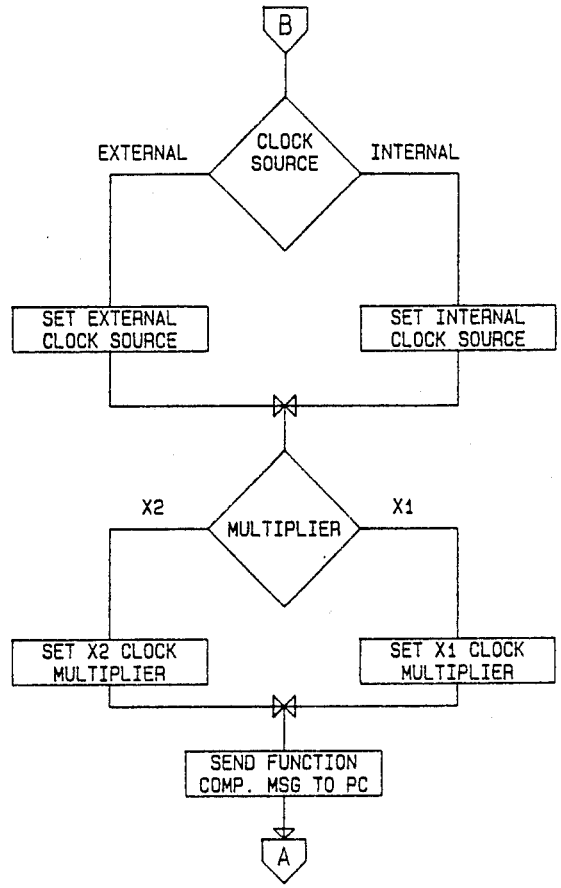
Figure 13P:
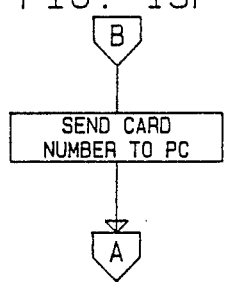
Figure 13Q:
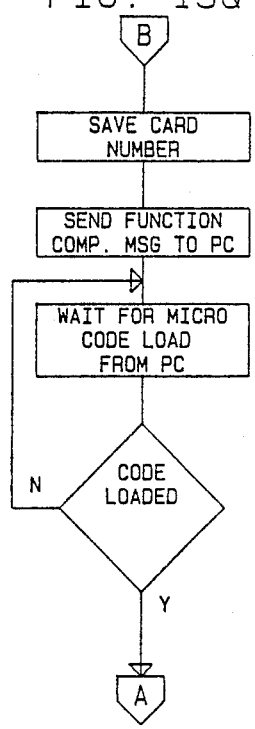
Figure 13R:
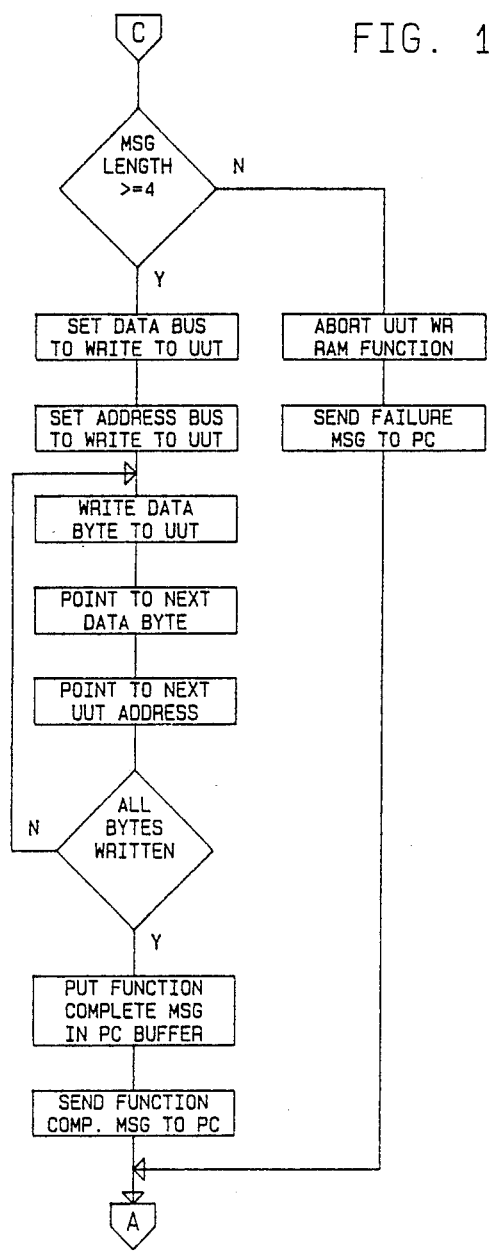
Figure 13S:
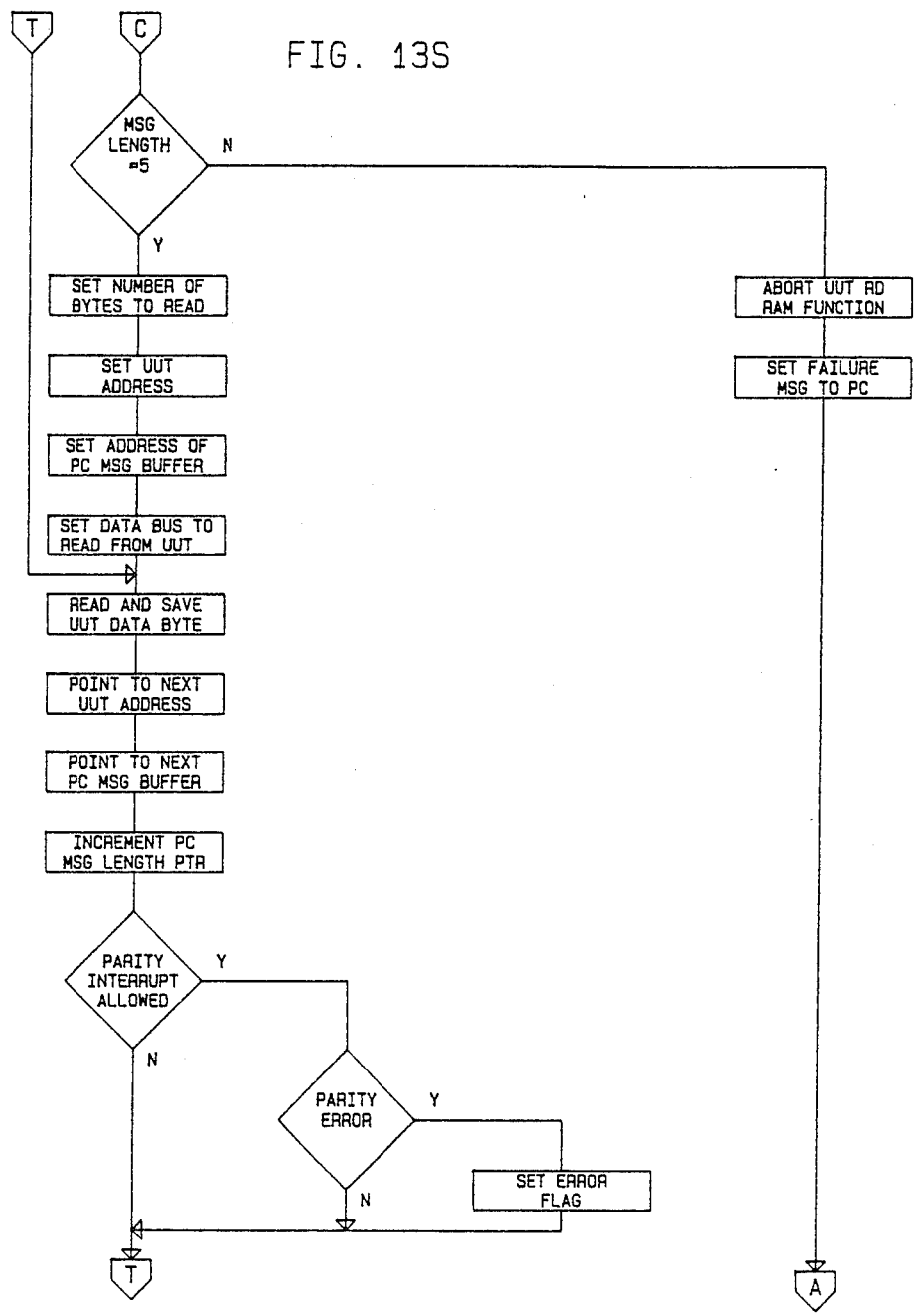
Figure 13T:
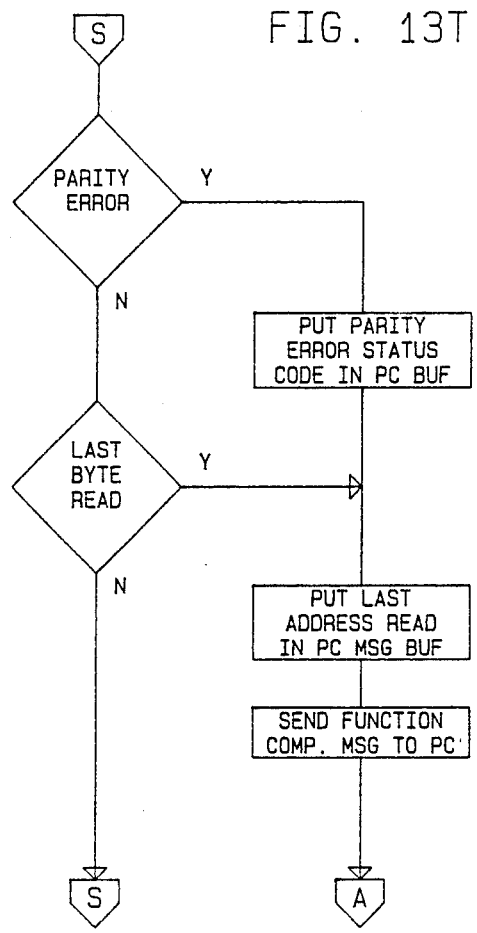
Figure 13U:
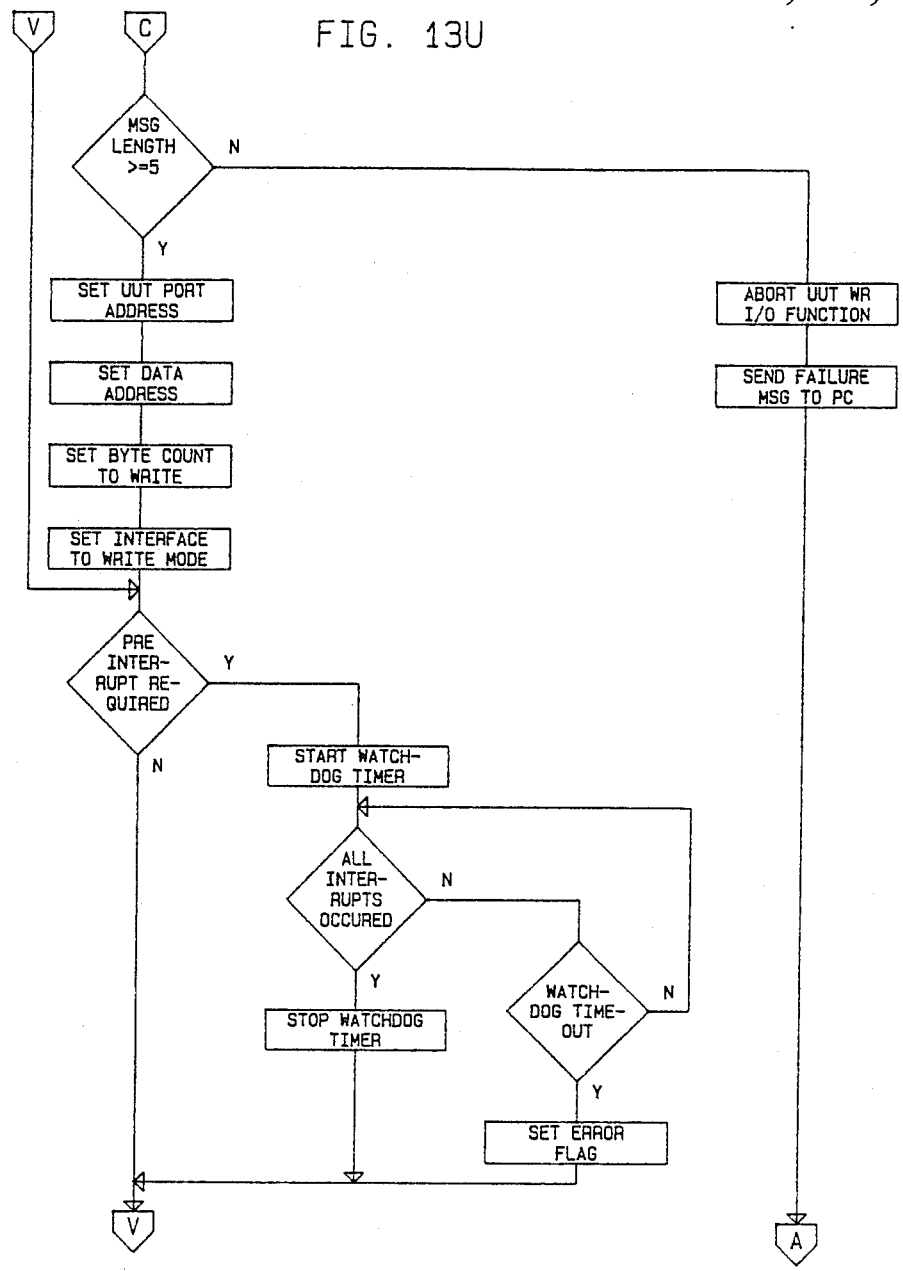
Figure 13V:
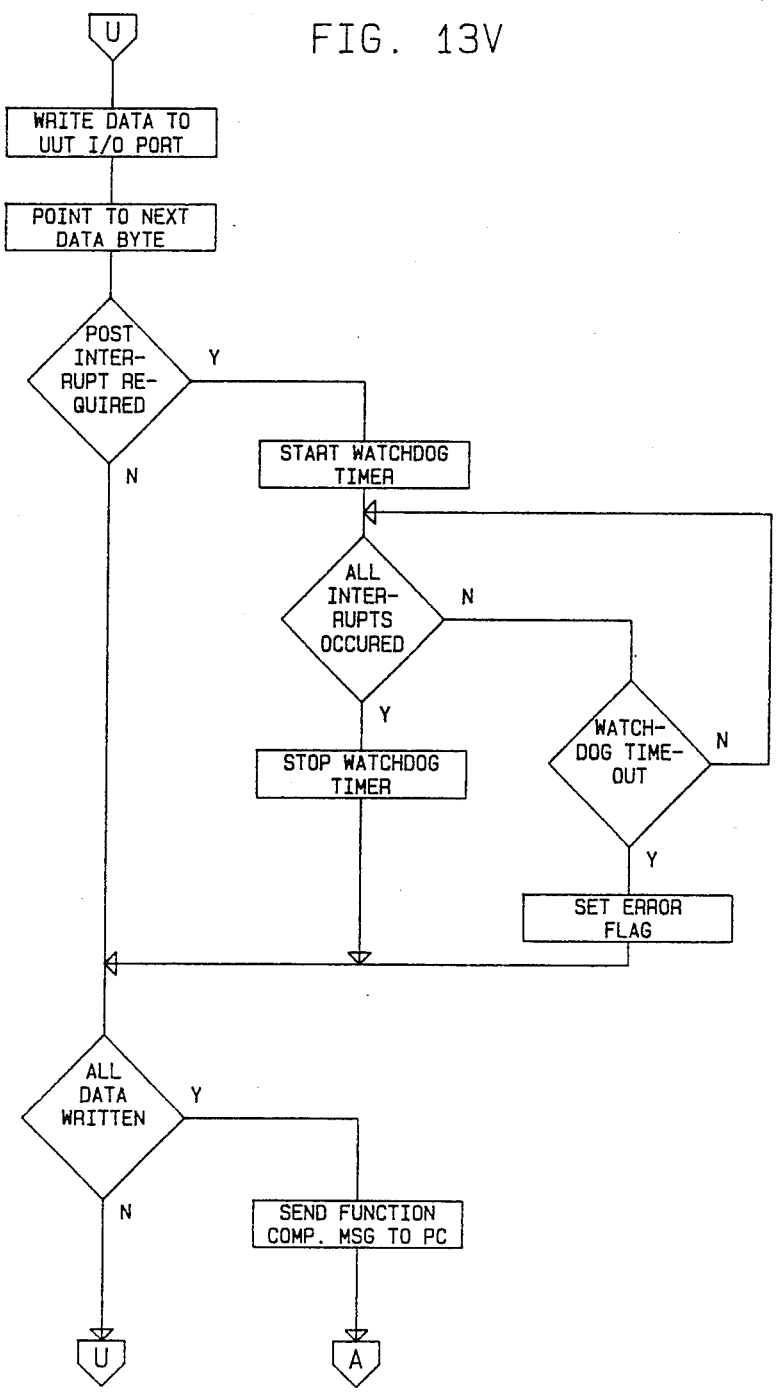
Figure 13W:
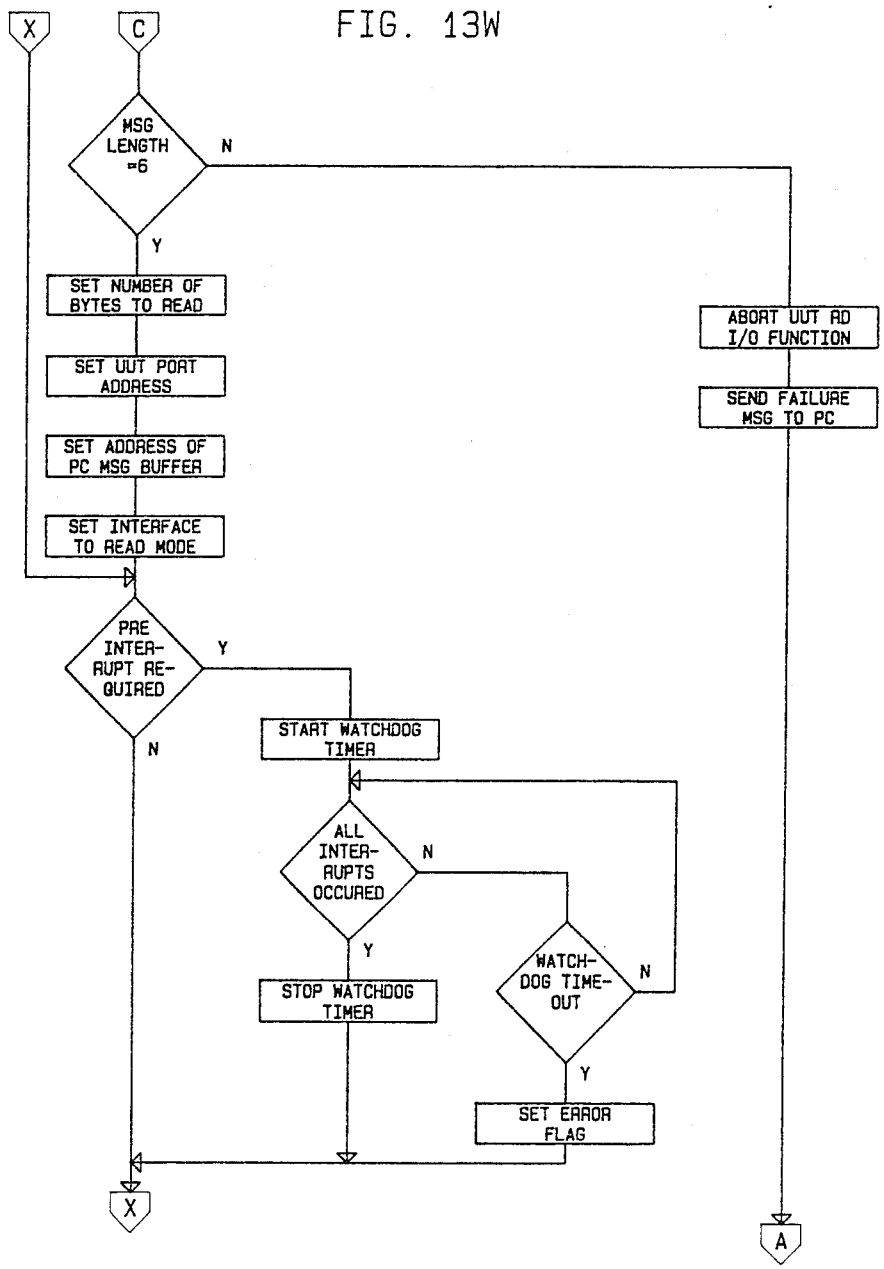
Figure 13X:
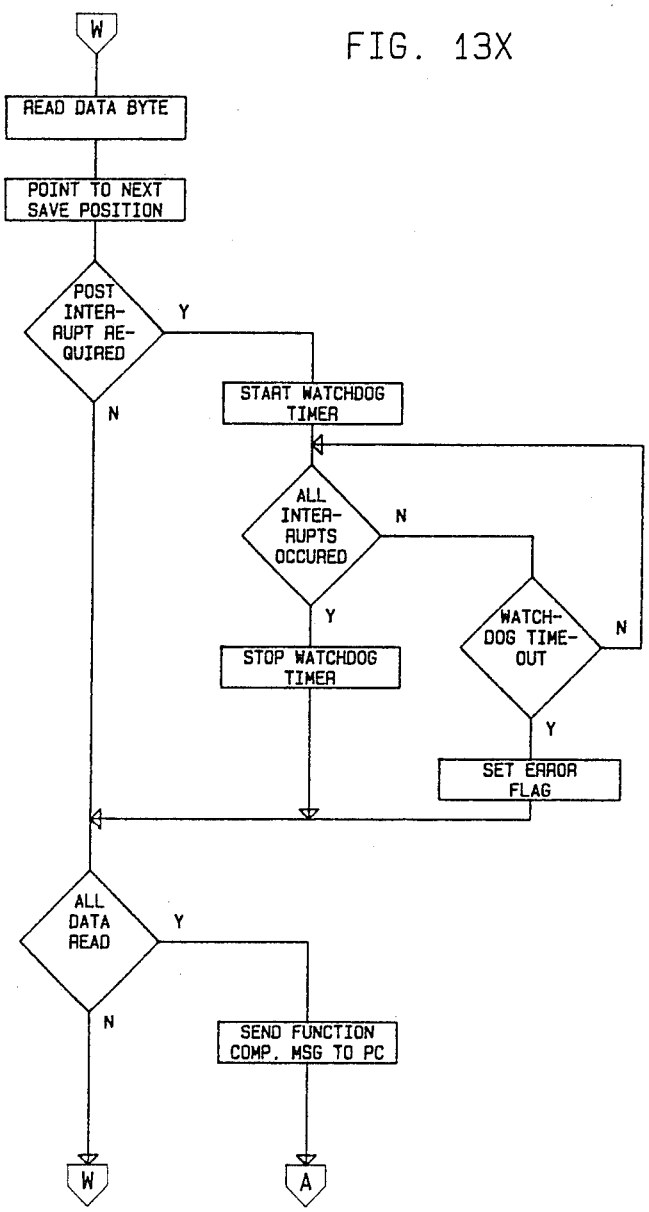
Figure 13Y:
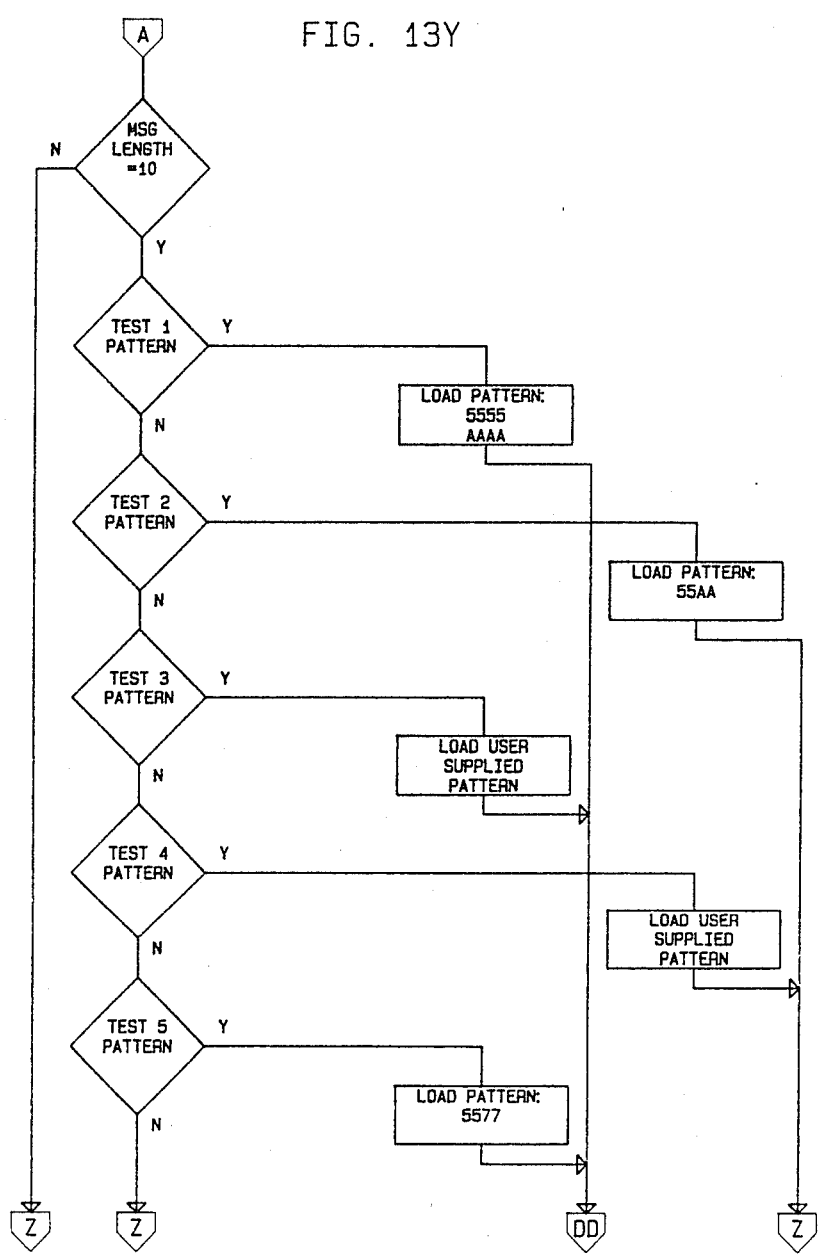
Figure 13Z:
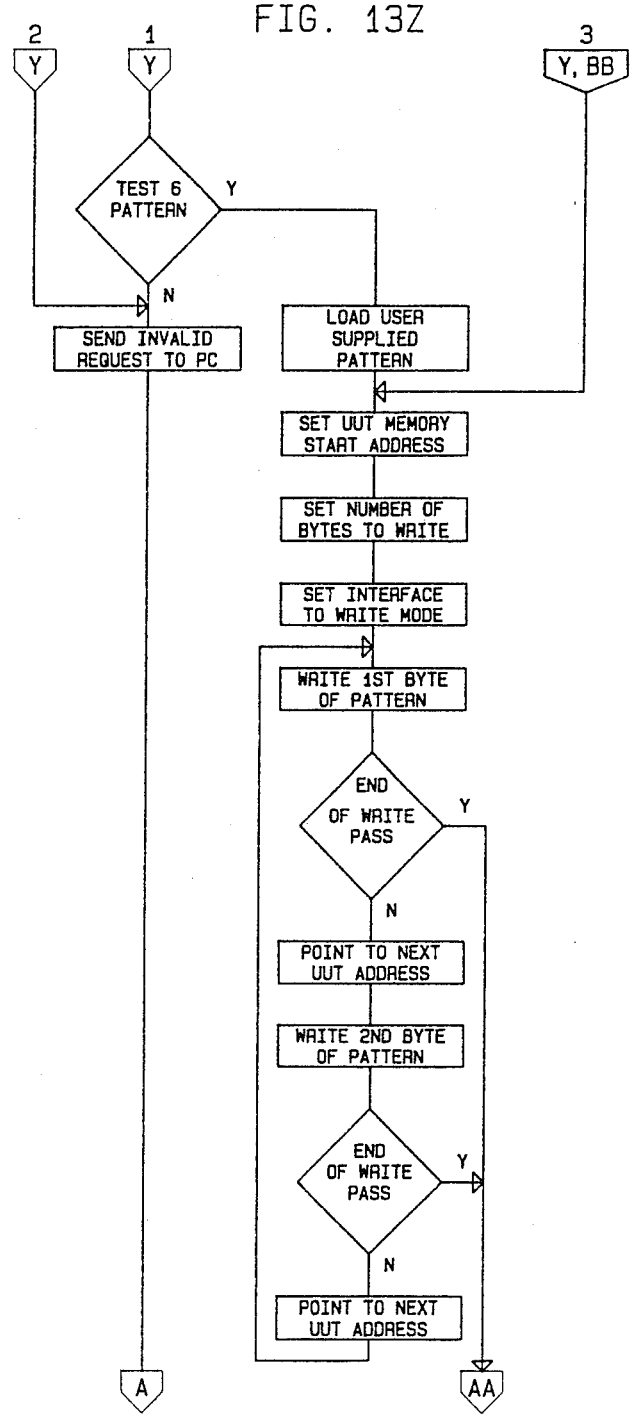
Figure 13A:
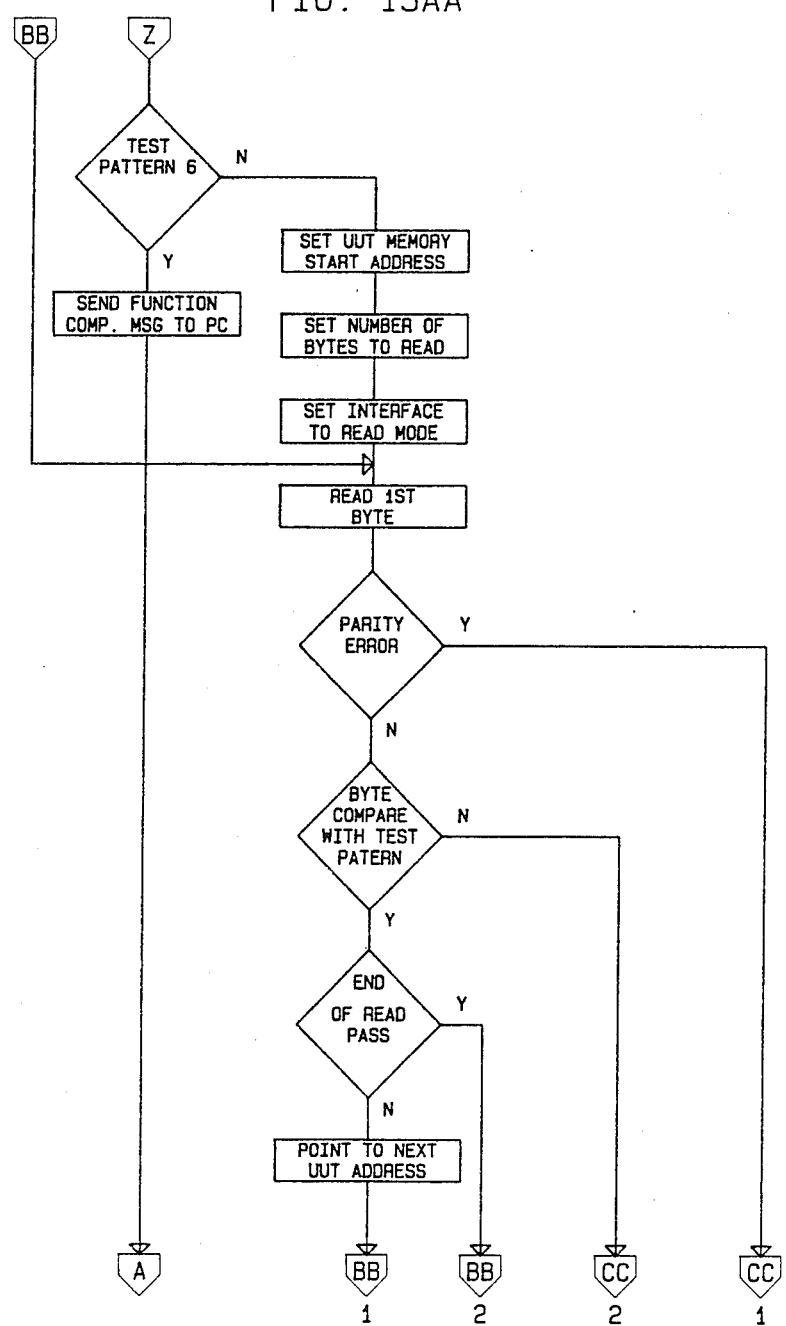
Figure 13B:
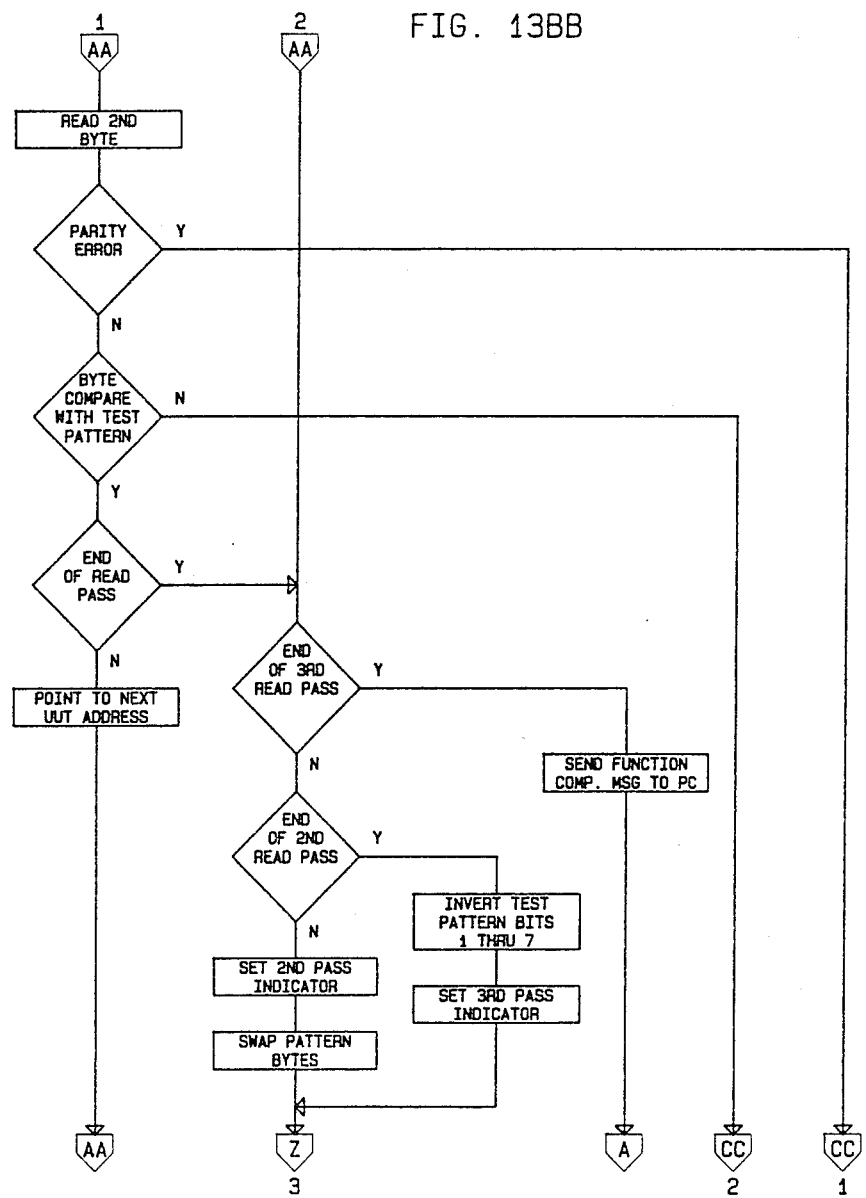
Figure 13C:
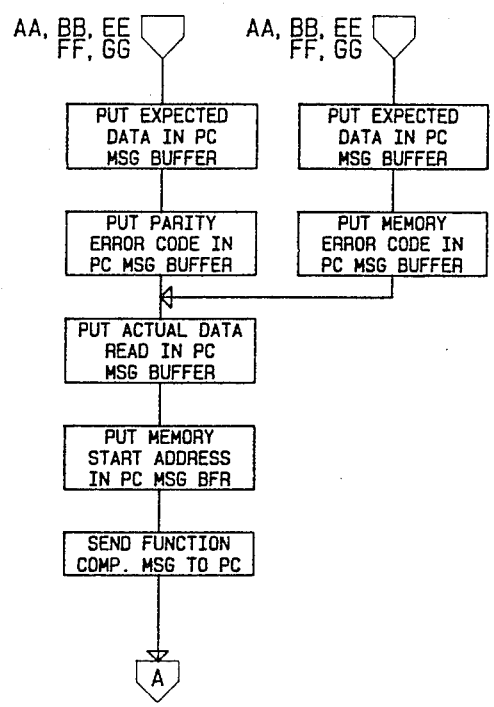
Figure 13D:
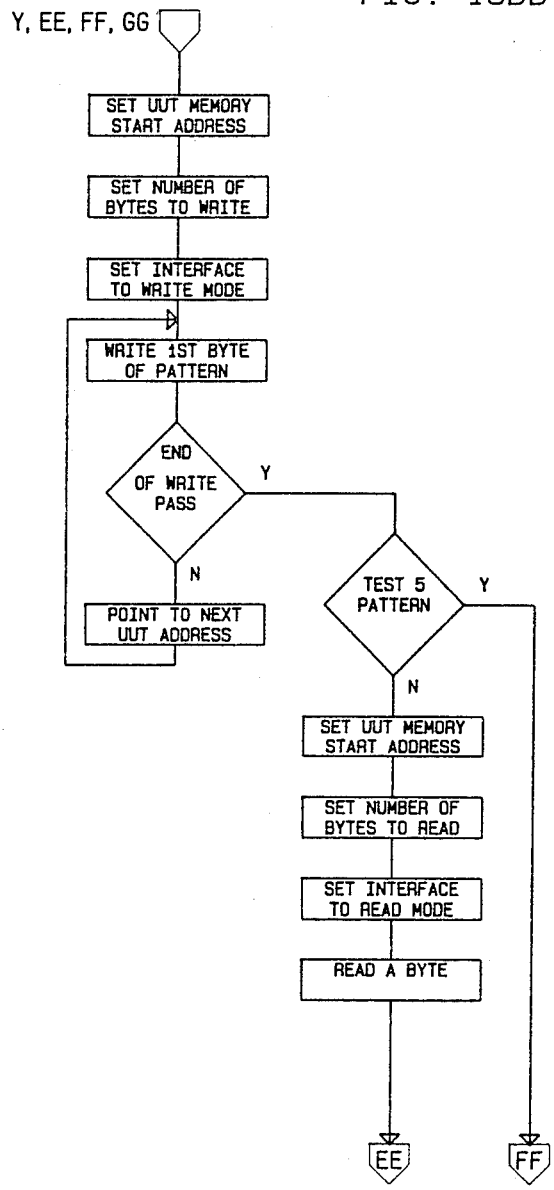
Figure 13E:
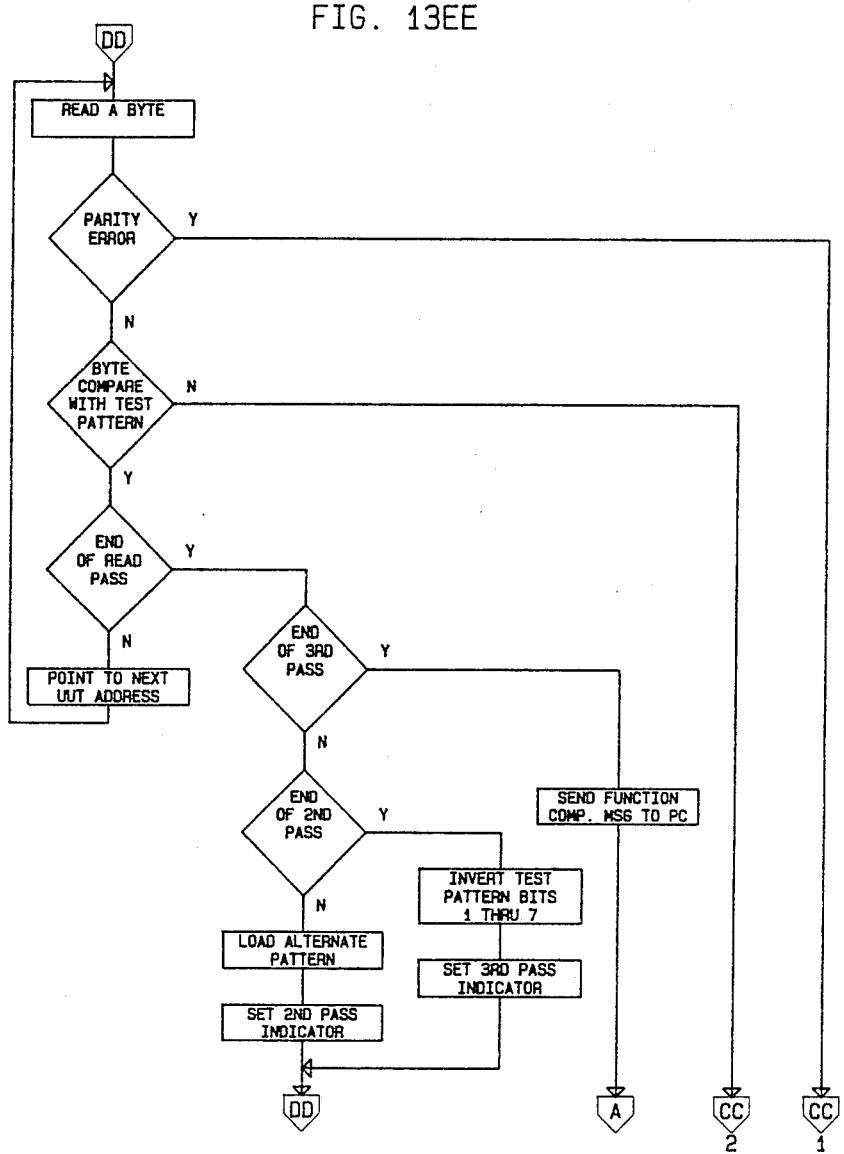
Figure 13F:
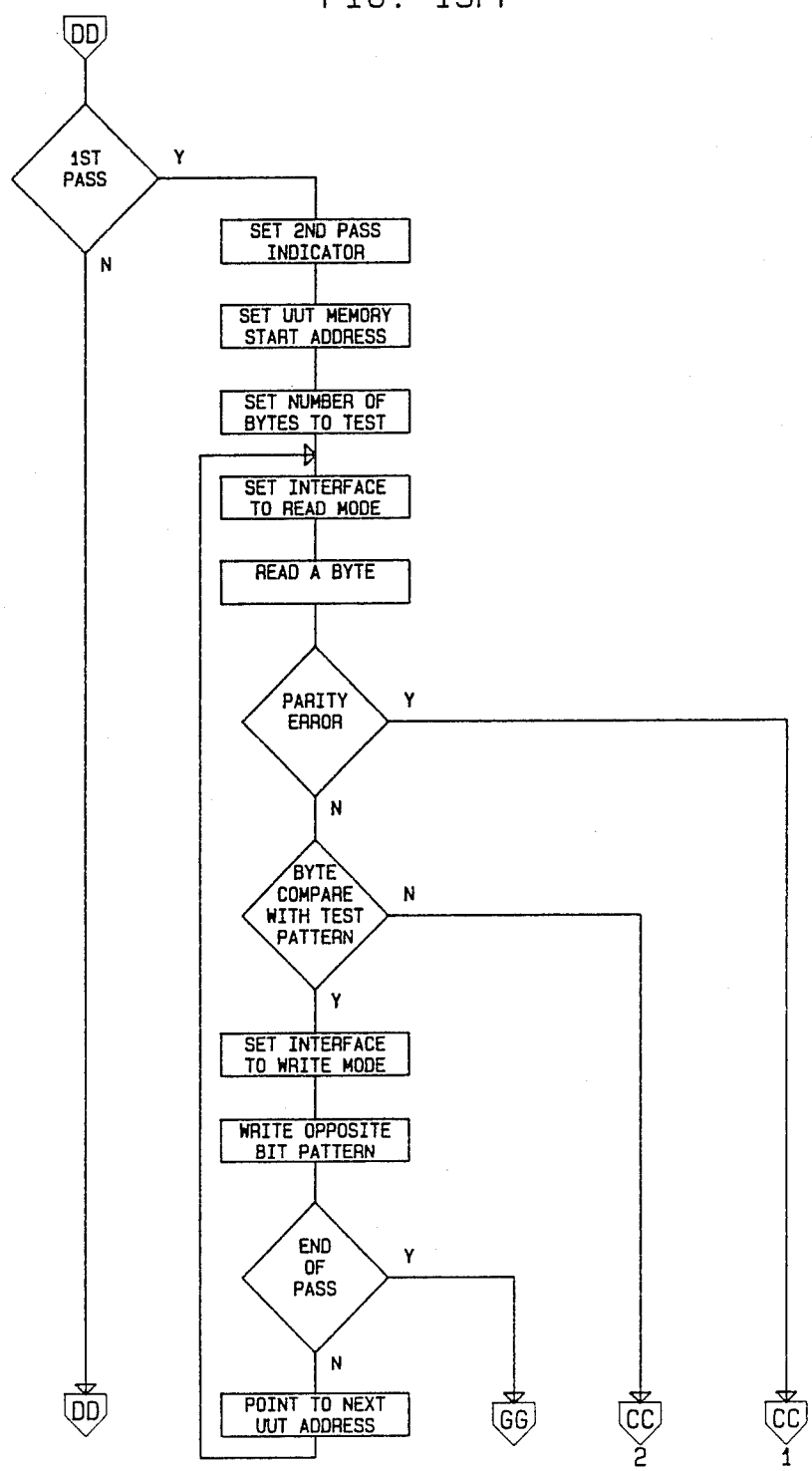
Figure 13G:
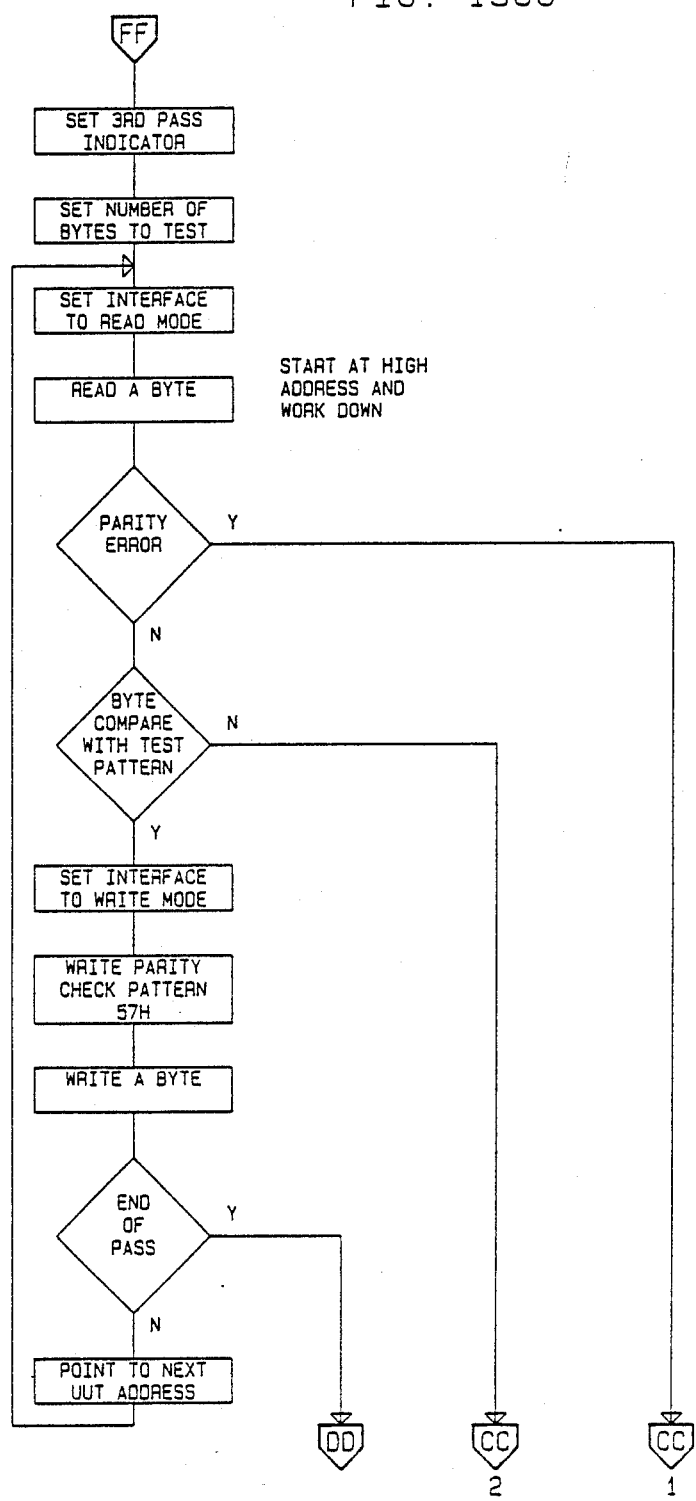
Figure 13H:
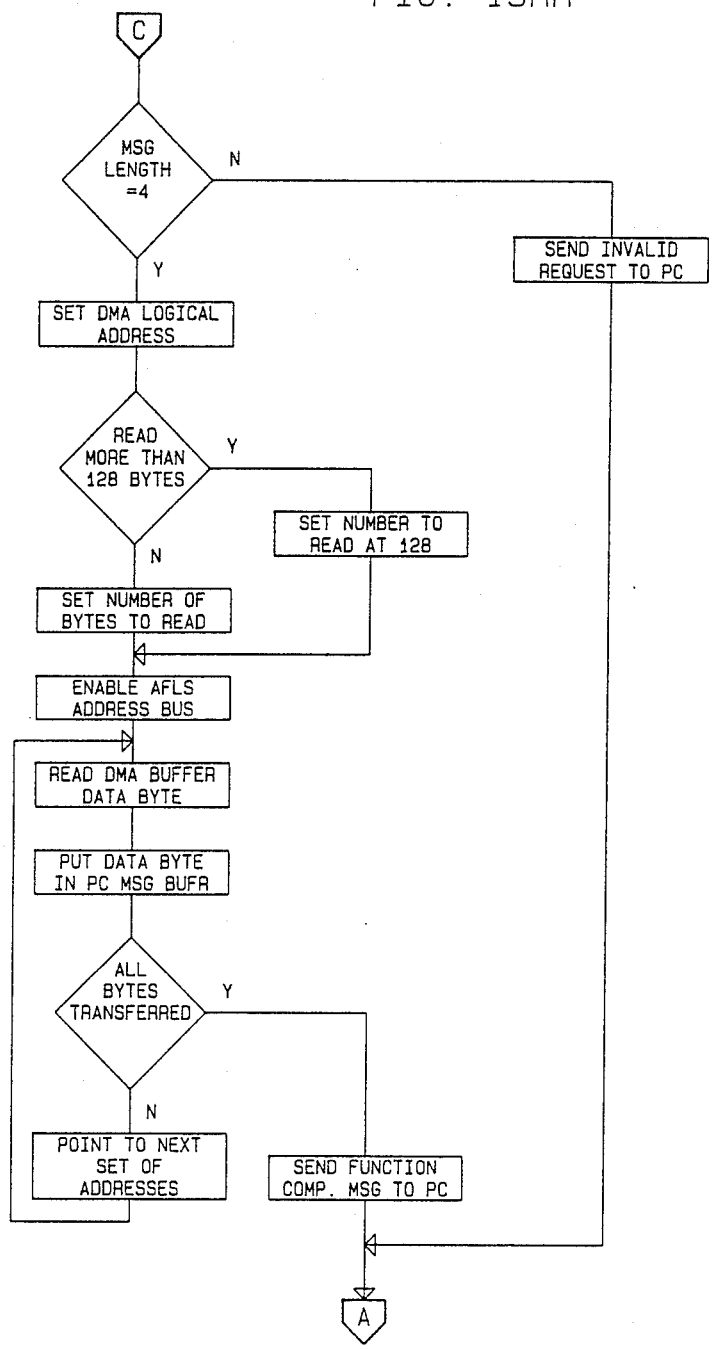
Figure 13I:
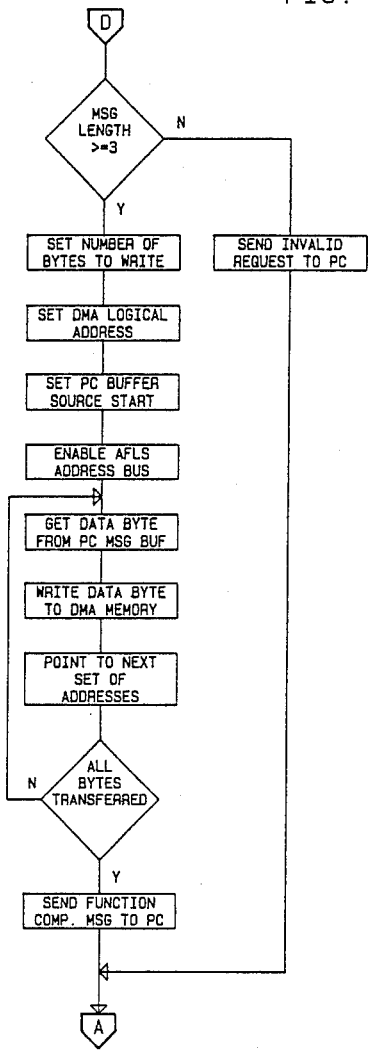
Figure 13J:
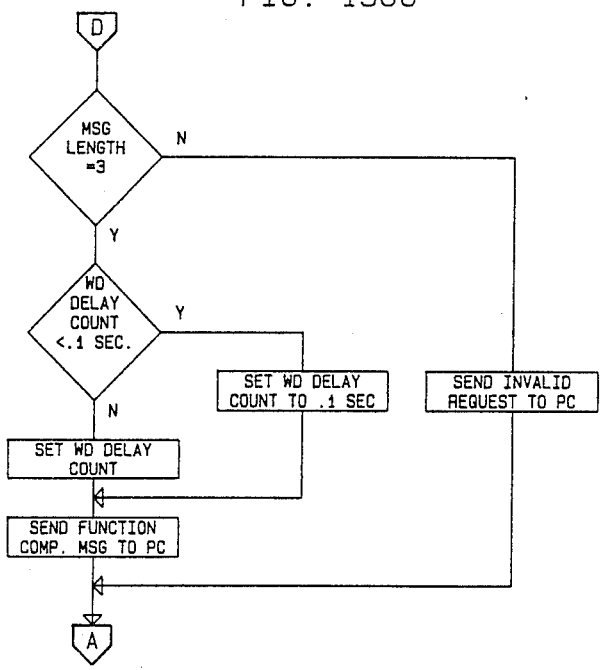
Figure 13K:
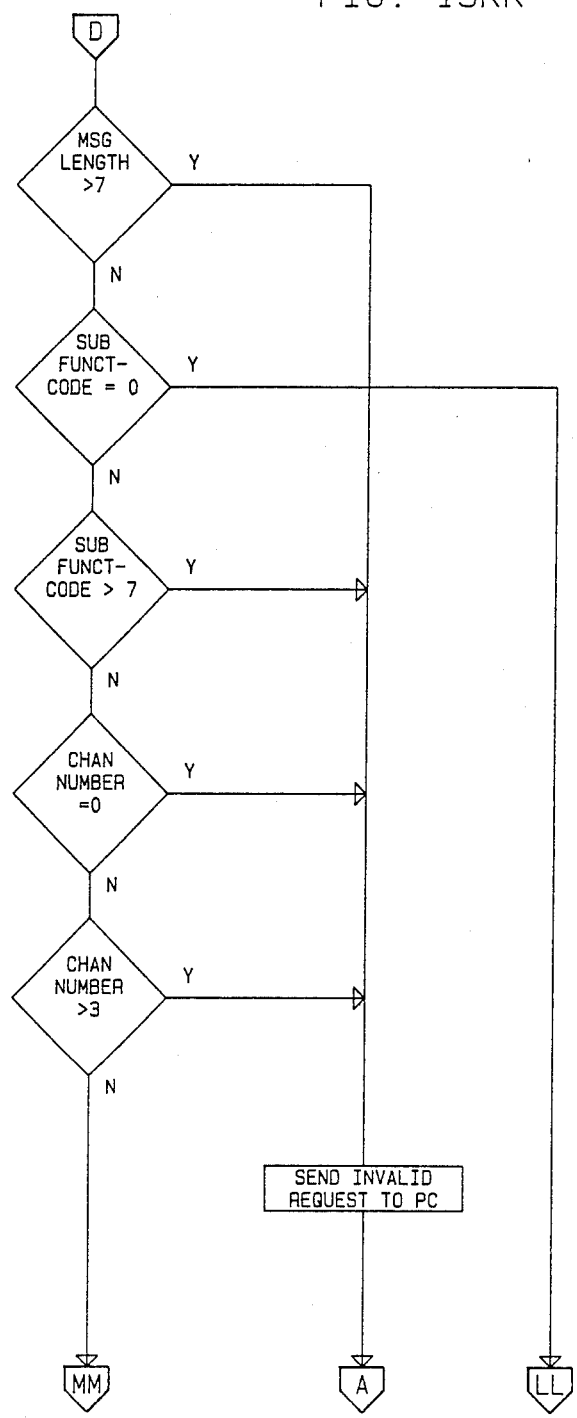
Figure 13L:
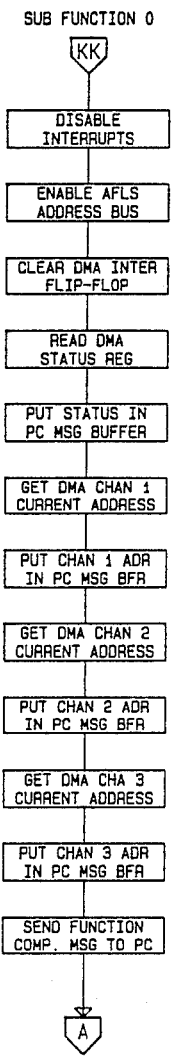
Figure 13M:
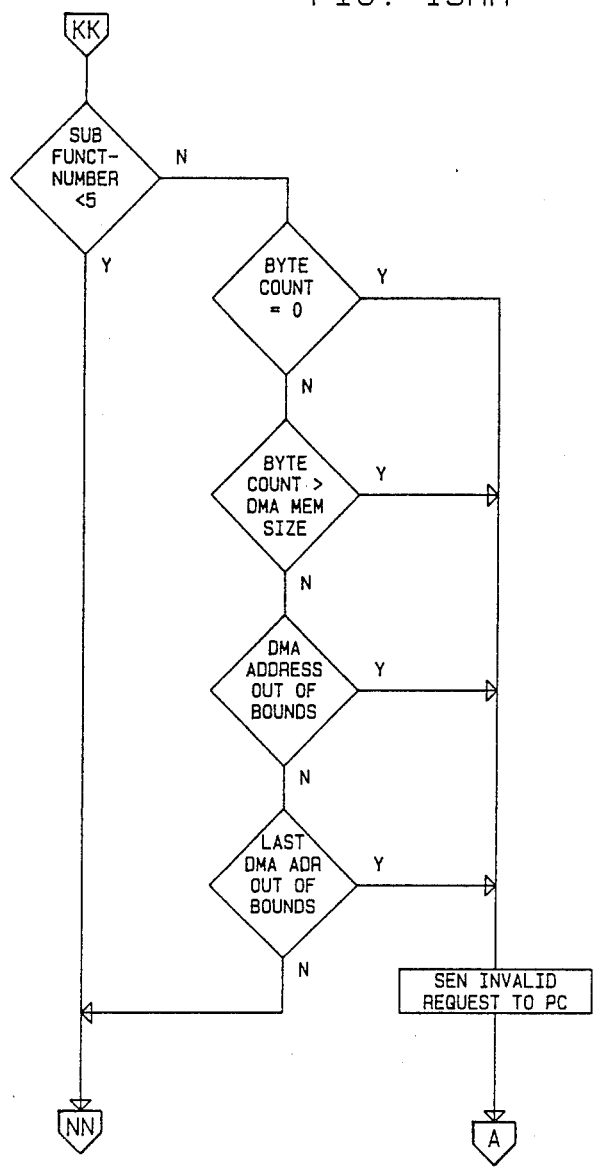
Figure 13N:
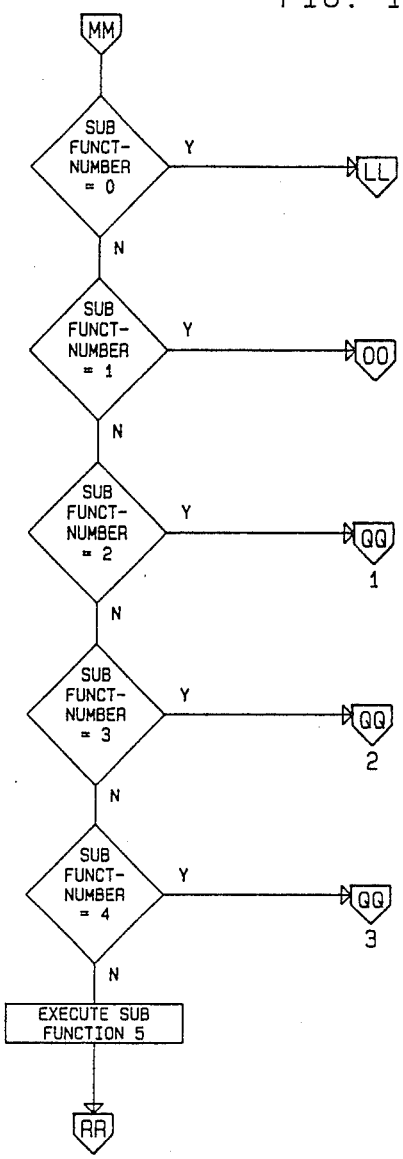
Figure 13P:
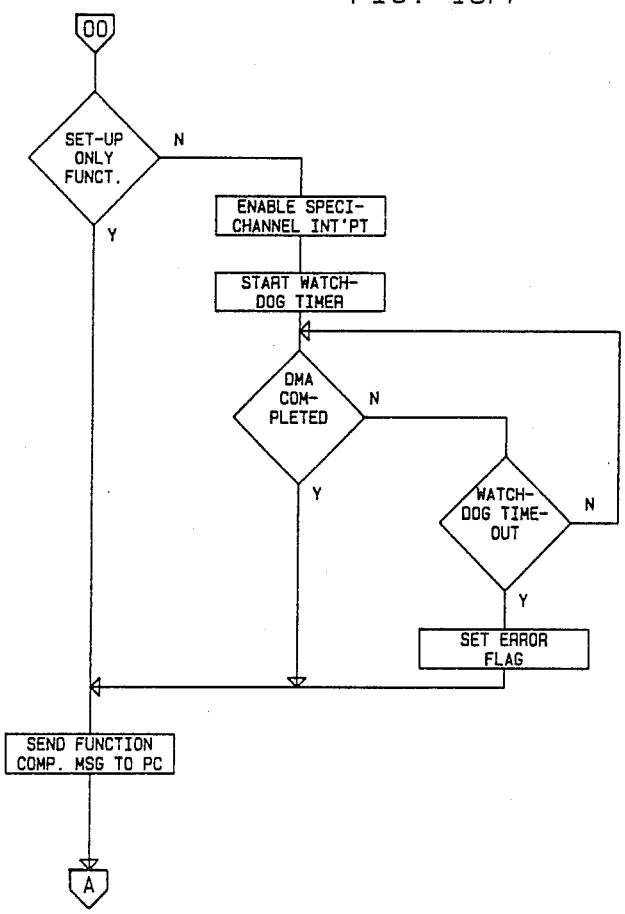
Figure 13S:
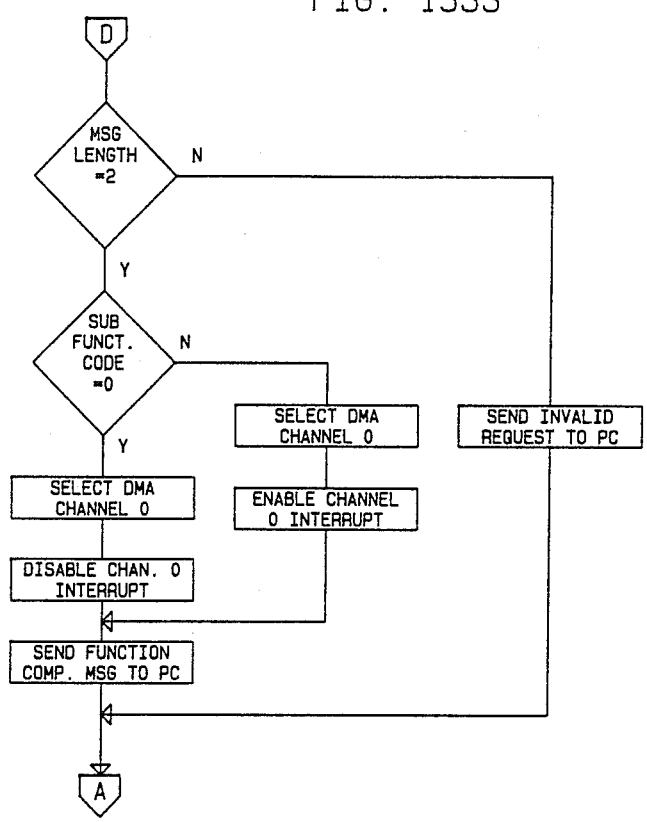
Figure 13T:
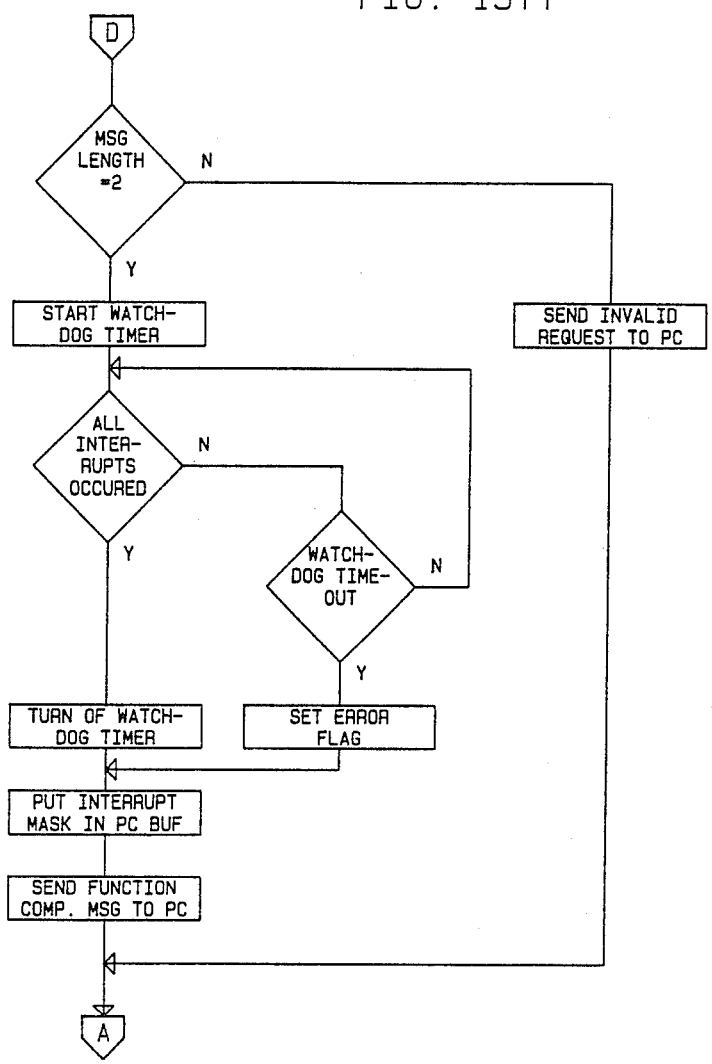
Figure 13U:
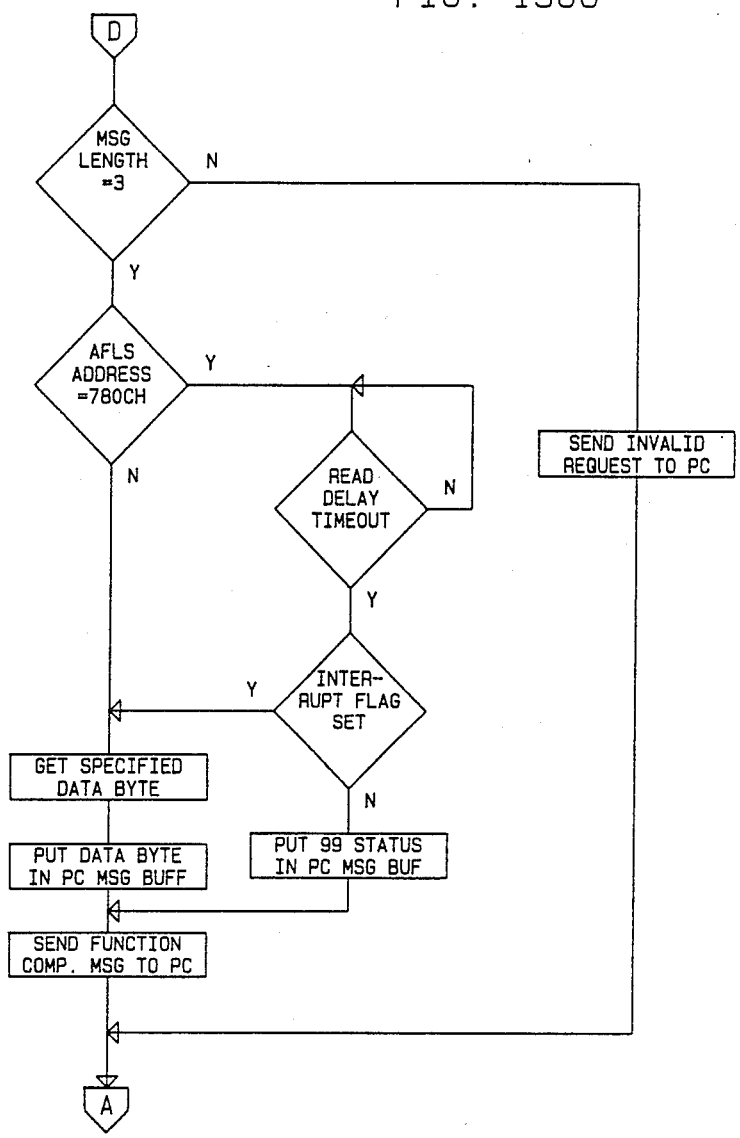
Figure 13V:
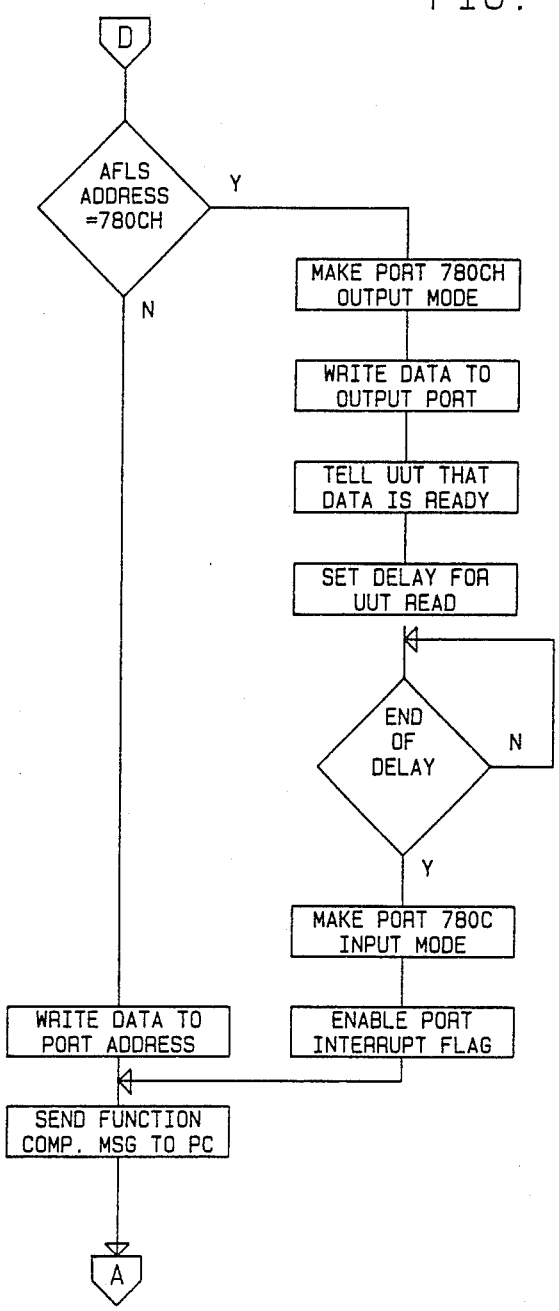

The Diagnostic Operating System (DIOS) is shown in detail in FIGS. 13A–13VV. The Diagnostic Operating System resides in EPROM on the LAB 5. Its purpose is to receive messages from the host system, interpret the message, cause the requested action to take place and, when requested send the results of that action back to the host system. The Diagnostic Operating System was designed to be as transparent as possible so that it would be user product independent.

Because of the totally isolated interface, DIOS can address 1MB of memory and I/O.

The various functions contained in DIOS include:
a. LOGIC ANALYZER WAVEFORM CAPTURE (includes BUS CAPTURE and COUNT)
b. WRITE TO UUT RAM
c. READ FROM UUT RAM
d. WRITE TO UUT I/O
e. READ FROM UUT I/O
f. TEST UUT RAM
g. SET DATA RELAY
h. SET VARIABLE POWER SUPPLY VOLTAGE
i. SET DELAY CLOCK SOURCE/MULTIPLIER
j. RESET LAB Responses are sent back to the host system for LOGIC ANALYZER CAPTURE, READ FROM UUT RAM, READ FROM UUT I/O, TEST UUT RAM AND SET DATA DELAY.

The specific functions and logic flow of the operating system running the fault locating program are set forth in FIGS. 13A-13VV which are self-explanatory and illustrated in detail for direct reference in connection with the foregoing description of the authoring process.

With the present invention it can be seen that through the use of carefully designed menus and sequential decision logic functions, programs are created to allow non-specialist personnel to trouble-shoot highly complicated electronic devices in a minimal amount of time. Although the present disclosure illustrates a preferred exemplary embodiment of the diagnostic authoring and operating system, it is understood that the invention may be implemented in various other forms and in different applications and will provide an improved and more efficient fault detecting resource in many environments.

The flow charts presented herein are written in a general high-level pseudocode which can be readily translated into any high level language. The actual language and programs required to implement the functions described herein depend on the particular system in which the present invention is implemented. The specific programs for the implemented systems are considered to be within the ability of the programmer having ordinary skill in the art after having reviewed the present specification, and the present disclosure is made in order to enable implementation of the present invention in the myriad of languages and systems presently available for various applications. Although the present invention has been described in the context of a preferred embodiment, it will be readily apparent to those skilled in the programming art that modifications and variations can be made therein without departing from the scope of the present invention as defined in the following claims.

The embodiments of the present invention in which an exclusive property or privilege is claimed are defined as follows:

1. In a fault locating system for locating faults in components and connections within an electronic device being tested, and including display means and input means for receiving diagnostic test procedure input, the method comprising:

displaying a plurality of test design input screens on the display means, said input screens being arranged to solicit author input in a sequential interactive manner to correspond to a series of testing steps to be accomplished, and to also solicit associated reference data values for selected electrical contact points within the electronic device, said reference data values being indicative of a condition of the electronic device from a designated starting point to each contact point; and saving the author input solicited by the design input screens and received from the input means for subsequent recall to display the designed test process to an operator as a series of interactive step-by-step test procedure output screens, each of said test procedure output screens being arranged to solicit actual test data from a test probe arranged to be placed at various points in the electronic device being tested as directed by the test procedure output screens, and comparing said actual test data with the reference data values to provide an indicium representative of the result of such comparison.

2. The invention as set forth in claim 1 and including the step of displaying a test design input screen arranged to solicit author input designating a card number associated with an electronic component card within the electronic device.

3. The invention as set forth in claim 2 and including the step of displaying a test design screen arranged to solicit author input designating a part number associated with an electronic component on the electronic component card.

4. The invention as set forth in claim 3 and including the step of displaying a test design screen arranged to solicit author input designating an integrated circuit number associated with an integrated circuit on the electronic component card.

5. The invention as set forth in claim 4 and including the step of displaying a test design screen arranged to solicit author input designating connection pin numbers associated with the component and integrated circuits on the electronic component card.

6. The invention as set forth in claim 5 and including the step of displaying a test design screen arranged to solicit author input designating connector configurations of the electronic component card.

7. The invention as set forth in claim 6 and including the step of displaying a test design screen arranged to solicit author input designating changes to be made to the card, port and integrated circuit and component pin numbers.

8. The invention as set forth in claim 7 and including the step of displaying a test design screen arranged to solicit author input designating changes to be made to the connector configurations.

9. The invention as set forth in claim 7 and including the step of displaying a test design screen arranged to solicit author input designating electrical driver conditions to be opened to the electronic device being tested in order to acquire the actual test data for comparison with the reference data.

10. The invention as set forth in claim 1 and including the step of displaying a test design screen arranged to solicit author input designating the number corresponding to the electronic component card which will be next tested by the operator.

11. The invention as set forth in claim 1 and including the step of displaying a test design screen arranged to solicit author input designating the sequence of presentation of the test procedure output screens.

12. The invention as set forth in claim 1 and including the step of displaying a test design screen arranged to solicit author input designating messages to appear on the test procedure output screens related to electrical connections and test probe placements to be made by the operator in acquiring the actual test data for comparison with the reference data values.

13. The invention as set forth in claim 12 and including the step of displaying a test design screen arranged to solicit author input designating one or more of said messages from a listing of common messages on a memo.

14. The invention as set forth in claim 12 and including the step of displaying a test design screen arranged to solicit author input designating one or more of said messages as keyed in by the author.

15. The invention as set forth in claim 12 and including the step of displaying a test design screen arranged to solicit author input designating changes to be made to previously programmed messages.

16. The invention as set forth in claim 1 and further comprising the step of selectively displaying a video summary of the testing steps and reference data values with the corresponding electrical contact points of the authored diagnostic test procedure.

17. The invention as set forth in claim 16 and further including the step of selectively printing the video summary.

18. The invention as set forth in claim 1 and further including the step of selectively printing a failur report for a selected card which lists the faults located for said card during the testing procedure.

19. The invention as set forth in claim 9 and including the step of displaying a test design screen arranged to solicit author input designating data to be processed between the testing device and the memory of the device being tested.

20. The invention as set forth in claim 9 and including the step of displaying a test design screen arranged to solicit author input designating data to be processed to the Input-Output connection to the device being tested.

21. The invention as set forth in claim 9 and including the step of displaying a test design screen arranged to solicit author input designating data to be processed to a register within the device being tested.

22. The invention as set forth in claim 9 and including the step of displaying a test design screen arranged to solicit author input designating a maximum amount of time to be allowed for the completion of a particular step in the testing process.

23. The invention as set forth in claim 9 and including the step of displaying a test design screen arranged to solicit author input designating the next step of the testing process to be accomplished in the event that an interrupt condition is generated by the device being tested.

24. The invention as set forth in claim 9 and including the step of displaying a test design screen arranged to solicit author input designating a series of driver conditions in a loop configuration to enable the creation of a subroutine function.

25. The invention as set forth in claim 1 and including the step of displaying a test design screen arranged to solicit author input designating a selectable starting point from which the testing procedure is initiated.

* * * * *